(12) United States Patent
Yano et al.

(10) Patent No.: US 8,642,402 B2
(45) Date of Patent: Feb. 4, 2014

(54) THIN FILM TRANSISTOR MANUFACTURING METHOD, THIN FILM TRANSISTOR, THIN FILM TRANSISTOR SUBSTRATE AND IMAGE DISPLAY APPARATUS, IMAGE DISPLAY APPARATUS AND SEMICONDUCTOR DEVICE

(75) Inventors: Koki Yano, Chiba (JP); Kazuyoshi Inoue, Chiba (JP); Futoshi Utsuno, Chiba (JP); Masashi Kasami, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 761 days.

(21) Appl. No.: 12/526,304

(22) PCT Filed: Feb. 6, 2008

(86) PCT No.: PCT/JP2008/051905
§ 371 (c)(1),
(2), (4) Date: Nov. 4, 2010

(87) PCT Pub. No.: WO2008/096768
PCT Pub. Date: Aug. 14, 2008

(65) Prior Publication Data
US 2011/0050733 A1   Mar. 3, 2011

(30) Foreign Application Priority Data

Feb. 9, 2007 (JP) .................. 2007-030591
Feb. 13, 2007 (JP) .................. 2007-032546
Feb. 19, 2007 (JP) .................. 2007-038392

(51) Int. Cl.
| H01L 21/335 | (2006.01) |
| H01L 21/8232 | (2006.01) |
| H01L 29/04 | (2006.01) |
| H01L 29/10 | (2006.01) |
| H01L 31/036 | (2006.01) |
| H01L 31/00 | (2006.01) |
| H01L 29/76 | (2006.01) |
| H01L 31/112 | (2006.01) |

(52) U.S. Cl.
USPC .............. 438/142; 438/486; 257/51; 257/59; 257/66

(58) Field of Classification Search
USPC ........ 438/142, 166, 482, 486; 257/51, 59, 66, 257/67
See application file for complete search history.

(56) References Cited

U.S. PATENT DOCUMENTS 6,563,174 B2    5/2003   Kawasaki et al.
6,669,830 B1 *  12/2003  Inoue et al. .............. 204/298.13
(Continued)

FOREIGN PATENT DOCUMENTS

JP    3-64450 A    3/1991
JP    7-235219 A   9/1995
(Continued)

OTHER PUBLICATIONS

International Search Report of PCT/JP2008/051905 (Apr. 17, 2008).
(Continued)

Primary Examiner — Charles Garber
Assistant Examiner — Calvin Choi
(74) Attorney, Agent, or Firm — Millen, White, Zelano & Branigan, P.C.

(57) ABSTRACT

To provide a method for producing a thin film transistor improved in stability, uniformity, reproducibility, heat resistance, durability or the like, a thin film transistor, a thin film transistor substrate, an image display apparatus, an image display apparatus and a semiconductor device.
In the semiconductor device, a crystalline oxide is used as an N-type transistor and the electron carrier concentration of the crystalline oxide is less than $2\times10^{17}/cm^3$. Furthermore, the crystalline oxide is a polycrystalline oxide containing In and one or more positive divalent elements selected from Zn, Mg, Cu, Ni, Co and Ca, and the atomic ratio In [In] and the positive divalent element [X][X]/([X]+[In]) is 0.0001 to 0.13.

32 Claims, 25 Drawing Sheets

(56) References Cited

U.S. PATENT DOCUMENTS

| | | | |
|---|---|---|---|
| 2003/0047785 A1 | 3/2003 | Kawasaki et al. | |
| 2003/0218221 A1 | 11/2003 | Wager, III et al. | |
| 2005/0130454 A1* | 6/2005 | Murthy et al. | 438/933 |
| 2005/0173734 A1* | 8/2005 | Yoshioka et al. | 257/202 |
| 2006/0113536 A1 | 6/2006 | Kumomi et al. | |
| 2006/0113565 A1 | 6/2006 | Abe et al. | |

FOREIGN PATENT DOCUMENTS

| | | |
|---|---|---|
| JP | 2002 038262 | 2/2002 |
| JP | 2002-38626 A | 2/2002 |
| JP | 2003-86808 A | 3/2003 |
| JP | 2004-273614 A | 9/2004 |
| JP | 2006-502597 A | 1/2006 |
| JP | 2006-165528 A | 6/2006 |
| JP | 2006-165532 A | 6/2006 |

OTHER PUBLICATIONS

International Preliminary Report on Patentability of PCT/JP2008/051905 (Aug. 11, 2009).

Patent Abstract of Japanese Publication No. 2002-038262. Publication Date: Feb. 6, 2002. Application No. 2000-222484. Filing Date: Jul. 24, 2000. Applicant: Toshiba Corp.

Japanese Office Action in Application No. JP-2008-557130 relating to JP-A2002-038262 (D1). Received on Mar. 12, 2013. In the Japanese Language.

English Translation of part of the Japanese Office Action in Application No. JP 2008-557130 relating to JP-A2002-038262 (D1). Received on Mar. 12, 2013. (1 page).

* cited by examiner

FIG.3
(a)
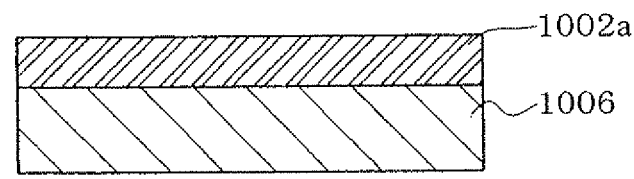
(b)
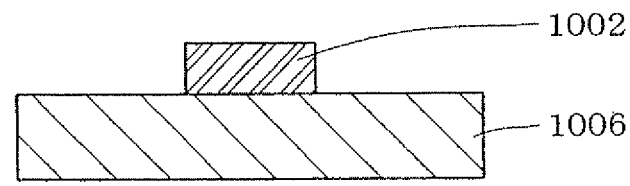
(c)
FIG.4
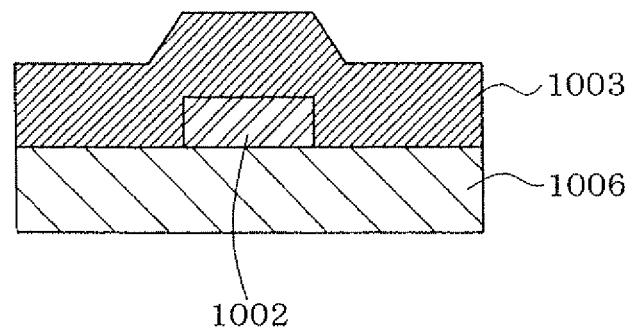

FIG.5
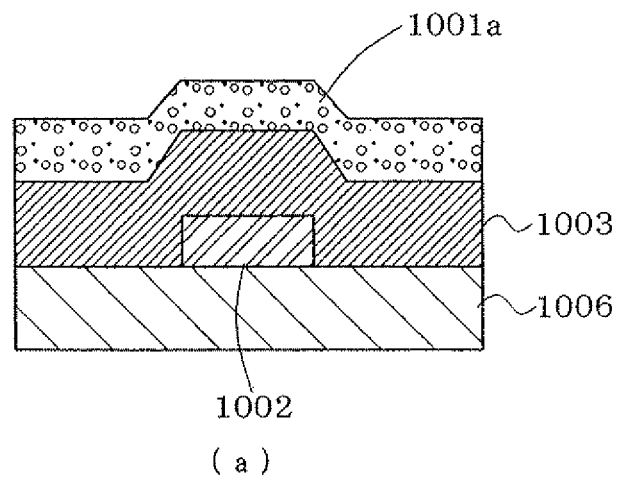
(a)
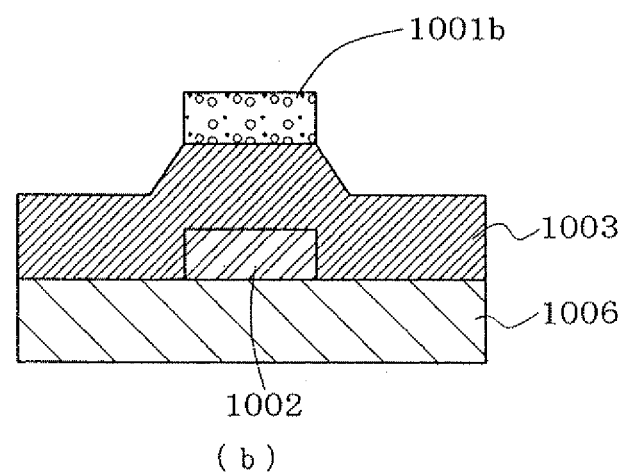
(b)
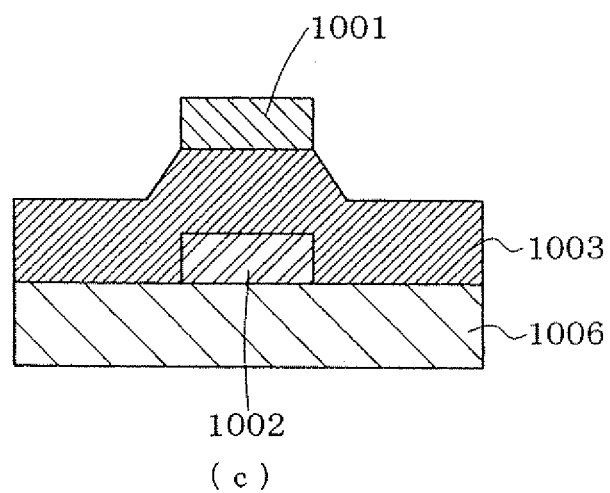
(c)

FIG. 6
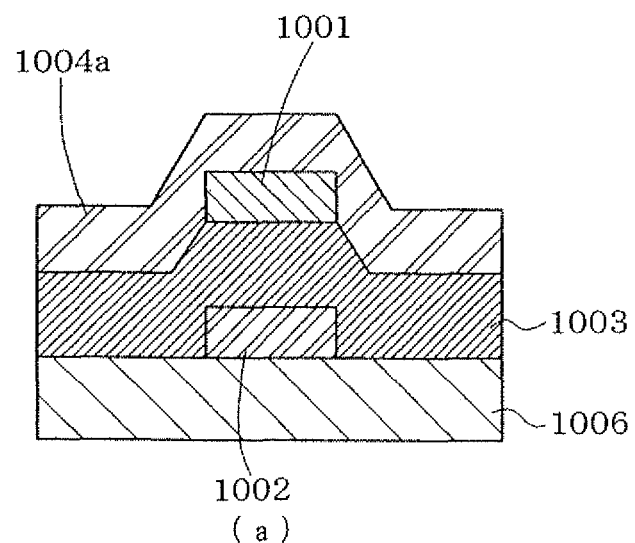
(a)
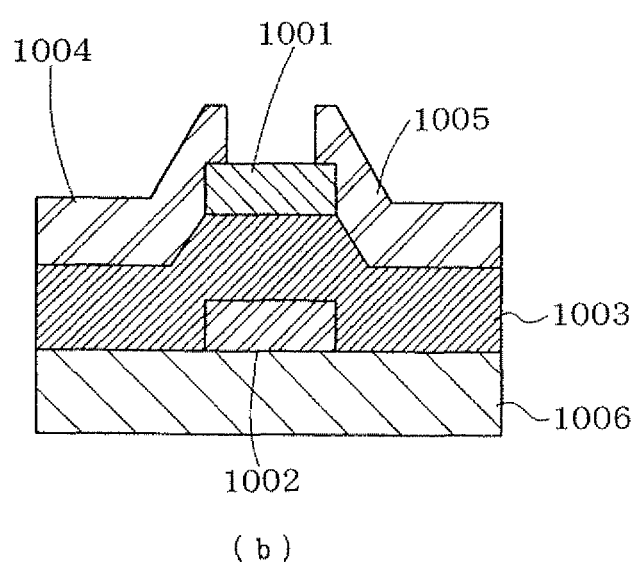
(b)

FIG.12
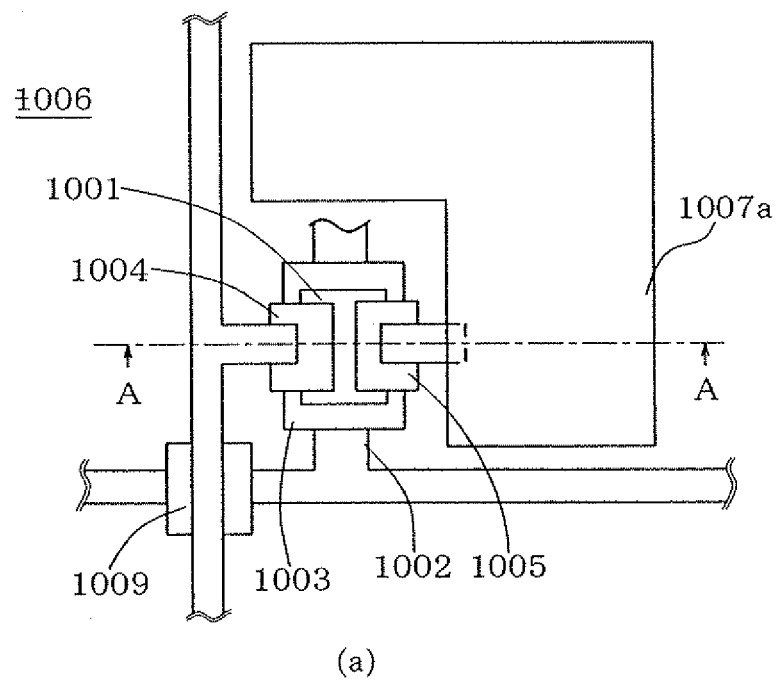
(a)
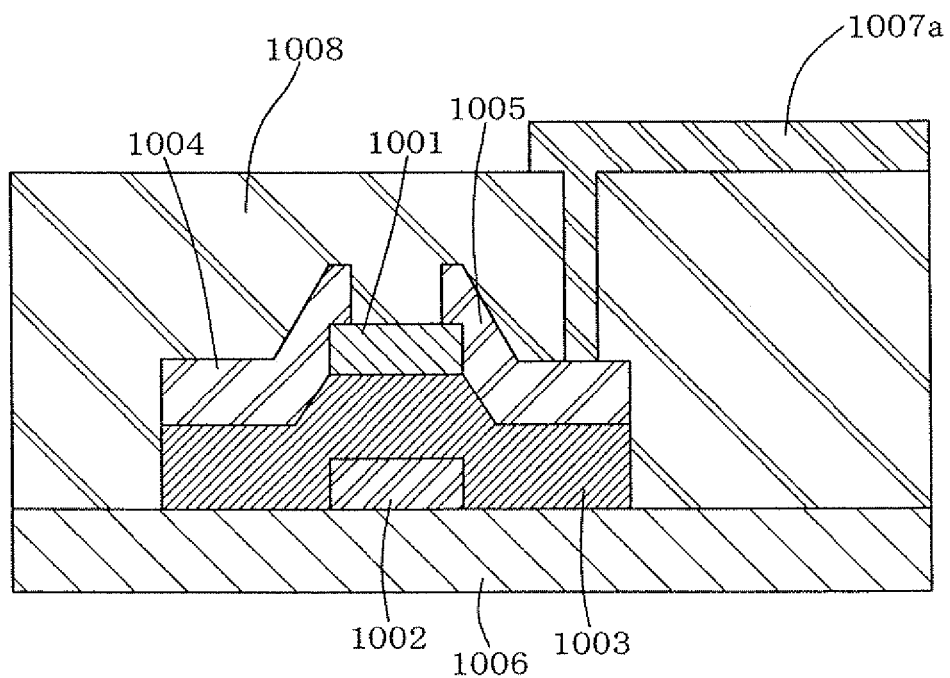
(b)

FIG. 19

| | | Example | | | | | | | | | | | | | Comparative Example | | | | | | | |
|---|---|---|---|---|---|---|---|---|---|---|---|---|---|---|---|---|---|---|---|---|---|---|
| | | 4 | 5 | 6 | 7 | 8 | 9 | 10 | 11 | 12 | 13 | 14 | 3 | 4 | 5 | 6 | 7 | 8 |
| Film-forming method | | DC magnetron sputtering | DC magnetron sputtering | RF magnetron sputtering | DC magnetron sputtering | DC magnetron sputtering | RF magnetron sputtering | RF magnetron sputtering | RF magnetron sputtering | RF magnetron sputtering | RF magnetron sputtering | RF magnetron sputtering | DC magnetron sputtering | DC magnetron sputtering | DC magnetron sputtering | DC magnetron sputtering | RF magnetron sputtering | RF magnetron sputtering |
| Film-forming conditions | Substrate temperature [°C] | 25 | 25 | 25 | 25 | 25 | 25 | 25 | 25 | 25 | 25 | 25 | 25 | 25 | 25 | 25 | 25 | 25 |
| | Ultimate pressure [×10⁻⁴Pa] | 10 | 10 | 10 | 10 | 10 | 10 | 10 | 10 | 10 | 10 | 10 | 10 | 10 | 10 | 10 | 10 | 10 |
| | Atmospheric gas | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:92% H₂:8% | Ar:96% O₂:4% | Ar:95% O₂:5% |
| | Total pressure [Pa] | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| | Partial oxygen pressure [×10⁻³Pa] | 0 | 0 | 0 | 0 | 0 | 0 | 0 | 0 | 0 | 0 | 0 | 0 | 0 | 0 | 0 | 16 | 20 |
| Film composition | In/(In+X) | 0.95 | 0.95 | 0.95 | 0.97 | 0.93 | 0.98 | 0.99 | 0.98 | 0.98 | 0.98 | 0.98 | 1.00 | 0.00 | 0.95 | 0.95 | 0.55 | 0.55 |
| | X/(In+X) | 0.05 | 0.05 | 0.05 | 0.03 | 0.07 | 0.02 | 0.01 | 0.02 | 0.02 | 0.02 | 0.02 | 0.00 | 1.00 | 0.05 | 0.05 | 0.45 | 0.45 |
| | X | Zn | Zn | Zn | Zn | Zn | Mg | Cu | Cu | Ni | Co | Zn | Zn | Zn | Zn | Zn | Zn | Zn |
| Atomic ratio | Ga/(In+Zn+Ga) | | | | | | | | | | | | | | | | 0.35 | 0.35 |
| Oxidization treatment | | 300°C 1 hour | 250°C 1 hour | 230°C 1 hour | 300°C 1 hour | 300°C 1 hour | 280°C 2 hour | 280°C 2 hour | 280°C 2 hour | 280°C 2 hour | 280°C 2 hour | 280°C 2 hour | Heat treatment in atmosphere 300°C 1 hour | 300°C 1 hour | None | None | None | None |
| Properties of semi-conductor thin film | Crystallinity (X-ray diffraction) | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Amorphous | Amorphous | Amorphous | Amorphous |
| | Hall measure-ment Carrier concentration [cm⁻³] | 6×10¹⁴ | 8×10¹⁴ | 4×10¹⁵ | 6×10¹⁴ | 1.1×10¹⁴ | 5×10¹⁶ | 2×10¹⁶ | 2×10¹⁴ | 1×10¹⁶ | 2×10¹⁶ | 6×10¹⁶ | 1×10¹³ | 6×10¹⁷ | 3×10²⁰ | 7×10²⁰ | 1.1×10²⁰ | 9×10¹⁵ |
| | Hall mobility [cm²/Vs] | 5 | 5 | 6 | 10 | 3 | 7 | 7 | 4 | 8 | 8 | 12 | 28 | 1 | 35 | 17 | 3 | 2 |
| | Resistivity (four probe method) [Ωcm] | 2100 | 1570 | 260 | 40 | 19000 | 15 | 450 | 7800 | 20 | 40 | 10 | 0.22 | 10 | 0.0006 | 0.00053 | 190 | 350 |
| | Energy band gap (eV) | 3.6 | 3.6 | 3.6 | 3.6 | 3.6 | 3.7 | 3.5 | 3.5 | 3.5 | 3.5 | 3.6 | 4.1 | 3.3 | 4.2 | 4.2 | 3.7 | 3.8 |
| | PAN resistance | ○ | ○ | ○ | ○ | ○ | ○ | ○ | ○ | ○ | ○ | ○ | ○ | × | × | × | × | × |
| | Heat resistance | ○ | ○ | ○ | ○ | ○ | ○ | ○ | ○ | ○ | ○ | ○ | ○ | ○ | ○ | ○ | × | × |
| | Light transmittance (%) | 85 | 85 | 85 | 85 | 85 | 89 | 83 | 83 | 83 | 83 | 85 | 84 | 83 | 82 | 82 | 83 | 83 |
| | Refractive index | 1.9 | 1.9 | 1.9 | 1.9 | 1.9 | 1.9 | 1.9 | 1.9 | 1.9 | 1.9 | 1.9 | 1.9 | 2.2 | 2.1 | 2.1 | 2.1 | 2.1 |

FIG. 26

| | | Example | | | | | | | | | | | Comparative Example | | | | | | |
|---|---|---|---|---|---|---|---|---|---|---|---|---|---|---|---|---|---|---|---|
| | | 15 | 16 | 17 | 18 | 19 | 20 | 21 | 22 | 23 | 24 | 25 | 9 | 10 | 11 | 12 | 13 | 14 |
| Film-forming method | | DC magnetron sputtering | DC magnetron sputtering | RF magnetron sputtering | DC magnetron sputtering | DC magnetron sputtering | RF magnetron sputtering | RF magnetron sputtering | RF magnetron sputtering | RF magnetron sputtering | RF magnetron sputtering | RF magnetron sputtering | DC magnetron sputtering | DC magnetron sputtering | DC magnetron sputtering | DC magnetron sputtering | RF magnetron sputtering | RF magnetron sputtering |
| Film-forming conditions | Substrate temperature [°C] | 25 | 25 | 25 | 25 | 25 | 25 | 25 | 25 | 25 | 25 | 25 | 25 | 25 | 25 | 25 | 25 | 25 |
| | Ultimate pressure [×10⁻⁴ Pa] | 10 | 10 | 10 | 10 | 10 | 10 | 10 | 10 | 10 | 10 | 10 | 10 | 10 | 10 | 10 | 10 | 10 |
| | Atmospheric gas | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:100% | Ar:92% H₂:9% | Ar:98% O₂:4% | Ar:95% O₂:5% |
| | Total pressure [Pa] | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| | Partial oxygen pressure [×10⁻³ Pa] | 0 | 0 | 0 | 0 | 0 | 0 | 0 | 0 | 0 | 0 | 0 | 0 | 0 | 0 | 0 | 16 | 20 |
| Film composition | In/(In+X) | 0.95 | 0.95 | 0.95 | 0.97 | 0.93 | 0.98 | 0.99 | 0.98 | 0.98 | 0.98 | 0.98 | 1.00 | 0.00 | 0.95 | 0.95 | 0.55 | 0.55 |
| | X/(In+X) | 0.05 | 0.05 | 0.05 | 0.03 | 0.07 | 0.02 | 0.01 | 0.02 | 0.02 | 0.02 | 0.02 | 0.00 | 1.00 | 0.05 | 0.05 | 0.45 | 0.45 |
| Atomic ratio X | | Zn | Zn | Zn | Zn | Zn | Mg | Cu | Cu | Ni | Co | Zn | Zn | Zn | Zn | Zn | Zn | Zn |
| | Ga/(In+Zn+Ga) | | | | | | | | | | | | | | | | 0.35 | 0.35 |
| Oxidization treatment | | Heat treatment in atmosphere | | | | | | | | | | | Heat treatment in atmosphere | | None | None | None | None |
| | | 300°C | 250°C | 230°C | 300°C | 300°C | 280°C | 280°C | 280°C | 280°C | 280°C | 280°C | 300°C | 300°C | | | | |
| | | 1 hour | 1 hour | 1 hour | 1 hour | 1 hour | 2 hour | 2 hour | 2 hour | 2 hour | 2 hour | 2 hour | 1 hour | 1 hour | | | | |
| Properties of semi-conductor thin film | Crystallinity (X-ray diffraction) | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Poly-crystalline | Amorphous | Amorphous | Amorphous | Amorphous |
| | Hall measurement: Carrier concentration [cm⁻³] | 6×10¹⁴ | 8×10¹⁴ | 4×10¹⁵ | 6×10¹⁴ | 1.1×10¹⁴ | 5×10¹⁶ | 2×10¹⁵ | 2×10¹⁴ | 1×10¹⁶ | 2×10¹⁶ | 6×10¹⁸ | 1×10¹⁸ | 6×10¹⁷ | 3×10²⁰ | 7×10²⁰ | 1.1×10¹⁶ | 9×10¹⁵ |
| | Hall mobility [cm²/Vs] | 5 | 5 | 6 | 10 | 3 | 7 | 7 | 4 | 8 | 8 | 12 | 28 | 1 | 35 | 17 | 3 | 2 |
| | Resistivity (four probe method) [Ωcm] | 2100 | 1570 | 260 | 40 | 19000 | 15 | 450 | 7800 | 20 | 40 | 10 | 0.22 | 10 | 0.0006 | 0.00053 | 190 | 350 |
| | Energy band gap (eV) | 3.6 | 3.6 | 3.6 | 3.6 | 3.6 | 3.7 | 3.5 | 3.5 | 3.5 | 3.5 | 3.6 | 4.1 | 3.3 | 4.2 | 4.2 | 3.7 | 3.8 |
| | PAN resistance | ○ | ○ | ○ | ○ | ○ | ○ | ○ | ○ | ○ | ○ | ○ | ○ | × | × | × | × | × |
| | Heat resistance | ○ | ○ | ○ | ○ | ○ | ○ | ○ | ○ | ○ | ○ | ○ | ○ | ○ | ○ | ○ | × | × |
| | Light transmittance (%) | 85 | 85 | 85 | 85 | 85 | 89 | 83 | 83 | 83 | 83 | 85 | 84 | 83 | 82 | 82 | 83 | 83 |
| | Refractive index | 1.9 | 1.9 | 1.9 | 1.9 | 1.9 | 1.9 | 1.9 | 1.9 | 1.9 | 1.9 | 1.9 | 1.9 | 2.2 | 2.1 | 2.1 | 2.1 | 2.1 |

THIN FILM TRANSISTOR MANUFACTURING METHOD, THIN FILM TRANSISTOR, THIN FILM TRANSISTOR SUBSTRATE AND IMAGE DISPLAY APPARATUS, IMAGE DISPLAY APPARATUS AND SEMICONDUCTOR DEVICE

TECHNICAL FIELD

The present invention relates to a method for producing a thin film transistor, a thin film transistor produced by this production method, a thin film transistor substrate on which this thin film transistor is arranged, and an image display apparatus using this thin film transistor. In the method for producing a thin film transistor, an amorphous oxide film is formed as a channel layer, the amorphous oxide film is patterned and then crystallized, and the thus crystallized crystalline oxide film is a channel layer.

Furthermore, the present invention relates to an image display apparatus in which a crystalline oxide having a prescribed electron carrier concentration is used as an active layer of a field-effect type transistor.

Furthermore, the present invention relates to a semiconductor device, in particular, to a semiconductor device in which a crystalline oxide having a prescribed electron carrier concentration is used as an N-type semiconductor.

BACKGROUND ART

A field-effect type transistor is widely used as a unit electron element of a semiconductor memory integrated circuit, a high-frequency signal amplification element, a liquid crystal driving element or the like. This field-effect type transistor is an electron device which is most practically used in recent years.

A thin film transistor (TFT) is one of field-effect type transistors. With a remarkable development of an image display apparatus in recent years, this thin film transistor (TFT) is widely used in various kinds of image display apparatuses as a switching element which applies a driving voltage to a display element to allow the image display apparatus to drive. Various kinds of an image display apparatus include a liquid crystal image display unit (LCD), an electroluminescence image display unit (EL) and a field emission display (FED).

As a material for a channel layer of a TFT, a silicon semiconductor compound is most widely used. Generally, a silicon single crystal is used in a high-frequency amplification element, an integrated circuit element or the like which needs a high-speed operation. In order to meet a demand for an increased area, amorphous silicon is used in a liquid crystal driving element or the like.

Moreover, since a high temperature of 800° C. or more is needed to attain crystallization, for example, it is difficult to form a crystalline silicon-based thin film on a glass substrate and an organic substance substrate. Therefore, a crystalline silicon-based thin film can be formed only on an expensive heat-resistant substrate formed of silicon wafer, quartz, or the like. Moreover, a large amount of energy and an increased number of steps are needed in manufacturing.

Furthermore, in the case of a TFT using a crystalline silicon-based thin film, it is normally restricted to have a top gate-type configuration. Therefore, cost reduction by reducing the number of masks or the like is usually difficult.

An amorphous silicon semiconductor (amorphous silicon) which can be formed at comparatively low temperatures has a slow switching speed as compared with a crystalline silicon semiconductor. Therefore, an amorphous silicon semiconductor may not be effective to display a high-speed animation when used as a switching element for driving an image display unit.

Furthermore, when irradiated with visible light, this semiconductor active layer exhibits conductivity and causes current leakage. In this case, there is a possibility that the semiconductor active layer may malfunction, and its characteristic as a switching element may deteriorate. Therefore, preparing a light-shielding layer which intercepts visible rays is known. For example, a metal thin film is used as a light-shielding layer.

If a light-shielding layer which is formed of a metal thin film is provided, the number of steps increases. Moreover, since this light-shielding layer has a floating potential, it is required that a light-shielding layer be formed at a ground level. In this case, a disadvantage occurs that a parasitic capacitance generates.

An element formed of a silicon-based semiconductor film constitutes the mainstream as a switching element for driving an image display apparatus. The reason therefor is that a silicon-based thin film is stable, is easy to process, has a high switching speed and exhibits various favorable performances. Generally, this silicon-based thin film is manufactured by the chemical deposition (CVD) method.

Moreover, as one of the structures of the conventional thin film transistor (TFT), an inverted-staggered structure can be given. This inverted-staggered structure is a structure in which a gate electrode, a gate-insulating layer, a semiconductor layer such as a hydrogenated amorphous silicon (a-Si:H) layer, a source electrode and a drain electrode are sequentially arranged on a substrate such as glass. This thin film transistor is used as a driving element for driving a flat panel display, or the like. A flat panel display is represented by an active matrix type liquid crystal display in the field of an image sensor and a device with a large area. However, in these applications, conventional thin film transistors using amorphous silicon are required to have a higher operation speed to meet the advancement in function.

Under such circumstances, in recent years, a transparent semiconductor thin film formed of a metal oxide has attracted attention as a material for a channel layer of a TFT.

This metal oxide excels a silicon-based semiconductor film in stability. Various technologies have been studied widely. As one of such technologies, a PLD (pulse laser deposition) method can be mentioned, in which an amorphous transparent semiconductor film composed of indium oxide, gallium oxide and zinc oxide is formed so as to allow a thin film transistor to drive.

Furthermore, an active matrix-type image display apparatus such as a LCD (liquid crystal display) and an organic EL (Electro Luminescence) display has been widely used in view of display performance, energy saving or the like. In particular, it has come to almost constitute the mainstream as displays of cellular phones, PDAs (Personal Digital Assistant) and personal computers, laptop computers and TVs. Generally, a TFT (field-effect type thin film transistor) substrate is used in these displays.

For example, a liquid crystal display has a configuration in which a display material such as liquid crystal is filled between a TFT substrate and an opposing substrate, and a voltage is selectively applied to this display material for each pixel. Here, a TFT substrate means a substrate in which a TFT using a semiconductor thin film (also referred to as a semiconductor film) such as an amorphous silicon thin film or a polycrystalline silicon thin film is arranged. The above-mentioned image display apparatus is driven by the active matrix circuit of a TFT. Since a TFT is arranged in the shape of an array, a TFT substrate is also referred to as a "TFT array substrate".

Meanwhile, in a TFT substrate used for a liquid crystal display or the like, a set of a TFT and one pixel of the screen of a liquid crystal display (this set is referred to as one unit) are arranged longitudinally and laterally on a glass substrate. In a TFT substrate, for example, a gate wire is arranged longitudinally at equal intervals on a glass substrate and a source wire and a drain wire are arranged laterally at equal intervals. In addition, a gate electrode, a source electrode, and a drain electrode are respectively formed in the above-mentioned unit which constitutes each pixel.

A transistor using the above-mentioned silicon thin film is produced by using a silane-based gas, and hence, it is disadvantageous in respect of safety or equipment cost. In addition, an amorphous silicon thin film has an electron mobility which is as low as about 0.5 $cm^2$/Vs when used in a TFT. In addition, since an amorphous silicon thin film has a small band gap, it may absorb visible rays to cause malfunction. Moreover, a polycrystalline silicon thin film requires a heating process which is conducted at relatively high temperatures, needs a large amount of energy cost, and it is hard to be formed directly on a large-sized glass substrate.

Under such circumstances, a TFT using an oxide semiconductor thin film in which a film can be formed at low temperatures has been actively developed. In addition, a semiconductor device using an oxide semiconductor thin film or the like has also been developed with the development of the above-mentioned TFT.

For example, Patent Document 1 discloses a technology of a thin film transistor in which a gate-insulating film including a first insulating film which has high insulating performance and a second insulating film which is formed of an oxide (for example, $SiO_2$) is formed on a gate electrode and a semiconductor layer using ZnO or the like is formed on the second insulating film. This thin film transistor has a low leak current level in the OFF region, a high mobility and excellent switching characteristics.

In addition, Patent Document 2 discloses a technology of a semiconductor device in which a semiconductor layer is formed of ZnO (zinc oxide) and aluminum is used as a material of an electrode and wiring, which device is free from defects and troubles caused by electric erosion.

Furthermore, Patent Document 3 discloses a technology of a transparent conductive film formed of an amorphous oxide which contains indium (In) and zinc (Zn) as a main cation element and has an atomic ratio of In (In/(In+Zn)) within a range of 0.8 to 0.9 is provided on a transparent substrate, and a method of producing the same. According to this technology, the transparent conductive film has conductivity and light transmittance which are practically satisfactory, and is excellent in thermal stability such as etching characteristics and specific resistance. Furthermore, this transparent conductive film can be provided on a substrate at lower substrate temperatures.

Moreover, Patent Document 4 discloses a technology of a semiconductor device which uses a transparent oxide film. This semiconductor device is provided with a P-type region and an N-type region, and uses in the N-type region an amorphous oxide having an electron carrier concentration of less than $10^{18}/cm^3$ or an amorphous oxide having a tendency that the electron mobility increases with an increase in electron carrier concentration.

Furthermore, Patent Document 5 discloses a technology of an active matrix-type image display apparatus. This image display apparatus has an amorphous oxide having an electron carrier concentration of less than $10^{18}/cm^3$ as an active layer of a field-effect type transistor.

Patent Document 1: JP-A-2003-86808
Patent Document 2: JP-A-2004-273614
Patent Document 3: JP-A-7-235219
Patent Document 4: JP-A-2006-165532
Patent Document 5: JP-A-2006-165528

DISCLOSURE OF THE INVENTION

Problems to be Solved by the Invention

However, in the thin film transistors disclosed in the above-mentioned patent documents, an amorphous oxide film used in a channel layer has a poor chemicals resistance, while it can be etched easily. Therefore, when a thin film such as a conductive film formed on an amorphous oxide film (channel layer) is patterned by wet etching, a problem arises that the amorphous oxide film (channel layer) is also dissolved.

In order to avoid this disadvantage, when a thin film transistor using an amorphous oxide film as a channel layer is produced, in patterning a thin film such as a conductive film on a channel layer, liftoff, dry etching or the like has been performed. Liftoff or dry etching is, however, disadvantageous since it requires expensive equipment and the manufacturing cost thereof is high. Furthermore, these technologies are not suitable for increasing an area, application of these technologies to a middle to large-sized display apparatus such as a liquid crystal display is difficult.

However, of oxide semiconductor thin films (for example, transparent semiconductor films formed of a metal oxide), in particular, a transparent semiconductor thin film obtained by crystallizing zinc oxide at high temperatures has a field-effect mobility (electron mobility) as low as about 1 $cm^2$/V·sec and has a small on-off ratio. In addition, since current leakage tends to occur easily, industrial application is difficult.

Moreover, a number of studies have been made on a crystalline substance-containing oxide semiconductor in which zinc oxide is used. However, when a film is formed by the sputtering method, which is conducted commonly on the industrial basis, an oxide semiconductor encounters the following problems. That is, performance as a TFT may deteriorate. Specifically, it may suffer deteriorated TFT performance such as a low electron mobility, a small on-off ratio, a large amount of current leakage, unclear pinch-off, and easiness of becoming normally-on. Moreover, since it has poor resistance to chemicals, manufacturing processes or use environments are limited such as difficulty in etching. Furthermore, there are also problems associated with industrialization. Specifically, it is necessary to conduct film formation at a high pressure to improve performance, a film-forming speed is lowered when a high pressure is applied, a treatment at a high temperature of 700° C. or more is required, or the like. Furthermore, the configuration of a TFT element is also restricted. Specifically, since TFT performance such as electron mobility is low in the bottom-gate configuration, it is required to use a top-gate configuration and to allow the film thickness to be about 50 nm or more, for example.

Moreover, an amorphous transparent semiconductor thin film has a problem that since the properties thereof largely change with time or by heat, the threshold voltage thereof changes largely when used for a long period of time. In particular, in the manufacturing process of a liquid crystal panel, a heat of about 250° C. or more, occasionally about 300° C. or more, may be applied, change of the properties by heat has become a serious obstacle for industrialization. Regarding this problem, two reasons can be considered. One of the reasons is that the number of careers is too large or that the film is amorphous. Another reason is that the move of oxygen tends to occur easily and the carrier concentration tends to change easily since oxygen is forced to be included in order to increase the partial oxygen pressure at the time of film forming.

Moreover, in the case of an amorphous transparent semiconductor thin film, in many cases, a large amount of oxygen is introduced during film formation, and hence, control is difficult. Moreover, since carrier concentration tends to change easily with time or by environmental temperatures, it is necessary to control precisely the oxygen partial pressure at the time of film forming. Therefore, reproducibility, stability and large-area uniformity for industrialization are defective, and hence, its application to a large-sized liquid crystal display or the like is difficult.

Furthermore, since this transparent semiconductor membrane is amorphous, its resistance to chemicals such as an etching solution, the representative example of which is PAN, is low, a metal wiring on the semiconductor film cannot be subjected to wet etching. Moreover, it has a defect that the refractive index is large and light transmittance of a multilayer film is lowered easily. In addition, since this transparent semiconductor thin film is amorphous, it may adsorb oxygen, water, or the like in an atmospheric gas, whereby electrical properties of the film may be changed or the yield may be lowered. That is, an amorphous oxide has a problem that control of career (electron) density is difficult, and hence it is poor in stability, uniformity, reproducibility, heat resistance and durability.

A film containing a crystalline indium oxide, in particular, a polycrystalline film, tends to suffer from oxygen deficiency. For this reason, it is believed that, even if the oxygen partial pressure at the time of film formation is increased or an oxidization treatment or the like is conducted, it is difficult to allow the carrier concentration to be less than $2 \times 10^{+17}$ cm$^{-3}$. Therefore, almost no attempt has been made to use this film as a semiconductor film or a TFT.

The present invention has been made to solve the above-mentioned problems associated with the above-mentioned conventional technologies, and an object thereof is to provide a method for producing a thin film transistor in which a channel layer is formed by wet etching and a thin film on the channel layer is formed by wet etching, whereby the production cost can be reduced and a large area can be realized, a thin film transistor produced by this production method, a thin film transistor substrate in which this thin film transistor is arranged and an image display apparatus using this thin film transistor.

Another object of the present invention is to provide a novel image display apparatus improved in image quality, durability or the like by utilizing a transistor in which a crystalline oxide is used in an active layer.

Still another object of the present invention is to provide a novel semiconductor device improved in stability, uniformity, reproducibility, heat resistance, durability or the like.

The inventors have studied the amorphous oxide film disclosed in JP-A-2006-165532. This amorphous oxide film has an electron career concentration of less than $1 \times 10^{18}$/cm$^3$, and hence, can be used for the channel of a TFT.

However, a TFT using the above-mentioned amorphous oxide film changes with time, and has been found to be defective in large-area uniformity or reproducibility when it is industrialized. That is, in the case of conventional amorphous oxide films or ZnO polycrystalline films, it is difficult to control electron carrier concentration, and hence, it is difficult to use them for various semiconductor devices excellent in stability, uniformity, reproducibility, heat resistance and durability, and in a circuit or the like using the same.

Then, the inventors produced a TFT by using in its active layer a crystalline oxide obtained by adding In and an element with a small positive valence as a dopant so as to allow the electron carrier concentration to be less than $2 \times 10^{+17}$/cm$^3$. As a result, the inventors have found that the dopant functions as an acceptor and the electron career concentration is controlled, whereby a TFT improved in stability, uniformity, reproducibility, heat resistance and durability can be obtained. As a result of intensive studies on the control by dopant of the electron carrier concentration of an In-containing oxide, the inventors have found that the electron carrier concentration can be stably controlled at less than $2 \times 10^{+17}$/cm$^3$ by controlling the amount of a dopant. Furthermore, it has been proven that such a crystalline oxide can be widely and preferably used in a semiconductor device other than a TFT.

Means for Solving the Problems

In order to attain the above-mentioned object, the method for producing a thin film transistor according to the present invention comprises the steps of: a film-forming step in which an amorphous oxide film is formed; a patterning step in which the amorphous oxide film formed by the film-forming step is patterned by etching; and a crystallization step in which the amorphous oxide film which is patterned in the patterning step is crystallized, wherein a crystalline oxide film obtained by the crystallization is a channel layer.

Due to such a method, in the film-forming step and the patterning step, the oxide film as the channel layer is amorphous which has a poor resistance to chemicals and can be dissolved easily. Therefore, the amorphous oxide film can be patterned easily. Furthermore, in the crystallization step after the patterning step, the amorphous oxide film is crystallized to be a crystalline oxide film. The crystalline oxide film has a higher resistance to chemicals than the amorphous oxide. As a result, a method which is industrially unsuitable since it requires expensive equipment costs or production costs for conducting liftoff or dry etching and cannot realize an increase in area is not required. As a result, patterning of a metal wiring or a thin film such as a transparent conductive film can be conducted easily on the channel layer.

In addition, since the channel layer is crystallized, the possibility that the properties thereof may change by the thermal history or the like during the production process is significantly lowered. As a result, a thin film transistor improved in reliability can be provided, and a highly reliable image display apparatus or the like using this thin film transistor can be provided.

It is preferred that the crystalline oxide film contain In and a positive divalent element.

Due to such a configuration, the positive divalent element can exhibit an effect as a dopant in the oxide layer, and the crystalline oxide film has properties as a semiconductor and can be used as a carrier layer. In addition, the oxide film can be crystallized, the chemicals resistance thereof can be surely improved. Furthermore, if an oxide mainly composed of indium oxide of which the crystallization temperature is low, crystallization can be attained with a low energy. That is, the process temperature can be lowered. Therefore, a large-sized glass substrate or the like can be used. Therefore, it can be preferably applied to a process for producing a middle- to large-sized image display apparatus such as a liquid crystal display. The number of the above-mentioned positive divalent element is not limited to one, and two or more positive divalent elements may be used.

Furthermore, it is preferred that the above-mentioned positive divalent element be one or more elements selected from Zn, Mg, Cu, Co, Ni and Ca.

Due to these elements, the carrier concentration can be controlled effectively, and the yield of the thin film transistor can be improved.

It is preferred that the atomic ratio of the above-mentioned In [In] and the above-mentioned positive divalent element [X][X]/([X]+[In]) be $0.0001 \leq [X]/([X]+[In]) \leq 0.5$.

It is further preferred that the atomic ratio of the above-mentioned In [In] and the above-mentioned positive divalent element [X][X]/([X]+[In]) be $0.01 \leq [X]/([X]+[In]) \leq 0.1$.

With this atomic range, the carrier concentration of the crystalline oxide film can be preferably set, it is possible to produce the crystalline oxide film as a career layer which has more improved semiconductor properties. That is, an amorphous oxide film is crystallized in the middle of a process using the oxide containing In and the positive divalent element with the above-mentioned atomic ratio. As a result, an oxide film which is a conductive film or the like when it is amorphous can be changed to a semiconductor film, and chemicals resistance can be improved, and selective etching for the channel layer of a thin film on the channel layer can be realized.

Moreover, for the above-mentioned film-forming step, it is preferable to use any of the film-forming methods selected from the sputtering method, the vapor vacuum deposition method, the ion plating method, the CVD method, the spray method and the dipping method.

In this way, conventional film-forming technology can be used.

It is preferred that the sputtering method be used in the above-mentioned film-forming step, and that the sputtering method be any of the DC magnetron sputtering method, the AC magnetron sputtering method and the RF magnetron sputtering method.

In this way, it is possible to use conventional film-forming technologies improved in economy, productivity, product quality or the like.

Moreover, it is preferred that wet etching be used in the above-mentioned patterning step.

By using wet etching, economy and productivity can be improved as compared with the case where dry etching is performed.

Moreover, in the above-mentioned crystallization step, it is preferable to crystallize the above-mentioned amorphous oxide film using one or more treating methods selected from the heat treatment, the plasma treatment, and the laser irradiation treatment.

In this way, the amorphous oxide film can be crystallized by using the conventional treatment technologies.

Furthermore, it is preferred that the oxidization treatment of the crystalline oxide film be performed in the crystallization step or after the crystallization step.

In this way, the conductivity of the crystalline oxide film can be lowered and the characteristics as a transistor can be adjusted. Moreover, according to the kind, the atomic ratio or the like of the positive divalent element, semiconductor properties can be imparted to the crystalline oxide film.

Moreover, it is preferable to use in the above-mentioned oxidization treatment one or more treatment methods selected from the heat-treatment in the presence of oxygen, the ozone treatment and the plasma treatment.

By such a treatment method, an oxidization treatment can be performed by using the conventional treatment technologies.

Furthermore, it is preferred that, in the above-mentioned film-forming step, the above-mentioned amorphous oxide film be formed by the sputtering method at a temperature lower than 150° C., and in the above-mentioned patterning step, patterning be performed with an etching solution containing oxalic acid, and in the above-mentioned crystallization step, the heat treatment be conducted at a temperature of 150 to 500° C. in the presence of oxygen.

In this way, in contrast to the case where a crystalline silicone-based thin film requires a high temperature of 800° C. or higher, for example, for crystallization, a carrier layer formed of a crystalline oxide film can be manufactured easily at a sufficiently low temperature.

In addition, in the above-mentioned sputtering method, it is preferred that water or hydrogen be contained in an atmospheric gas.

Due to the presence of water or hydrogen, the yield of the semiconductor transistor can be improved.

Furthermore, it is preferable to form a thin film on the above-mentioned crystalline material oxide film after the above-mentioned crystallization step, and to pattern this thin film by wet etching.

In this way, as compared with the case where liftoff, dry etching, or the like are performed, economy and productivity can be improved and the production cost can be reduced. Moreover, when a common etching solution can be used in the patterning step, productivity can be further improved. In addition, wet etching is suited to increasing area as compared with liftoff or dry etching. As a result, the method can be applied to middle- to large-sized displays such as a liquid crystal display.

Preferably, the above-mentioned wet etching be conducted by using an etching solution containing one or more acids selected from oxalic acid, hydrochloric acid and phosphoric acid.

In this way, conventional etching solutions can be used.

In order to attain the above-mentioned object, the thin film transistor of the present invention has a configuration produced by the method for producing a thin film transistor according to any one of claims 1 to 15.

Due to such a configuration, the production cost can be reduced, and reliability can be improved.

In order to attain the above-mentioned object, the thin film transistor substrate of the present invention has a configuration in which the thin film transistor according to claim 16 is arranged in a plural number on a substrate or a sheet-like base.

Due to such a configuration, it is possible to provide a thin film transistor substrate which is capable of reducing the production cost and increasing an area, and is improved in reliability. As for the thin film transistor substrate, normally, a thin film transistor is arranged on a glass substrate. However, the configuration of the thin film transistor substrate is not limited thereto. For example, a thin film transistor may be arranged on a flexible, sheet-like base formed of a resin or the like.

Furthermore, in order to attain the above-mentioned object, the image display apparatus of the present invention has a configuration in which the thin film transistor according to claim 16 is used.

In this way, it is possible to produce an image display apparatus which is capable of reducing the production cost and increasing an area.

In order to attain the above-mentioned object, the image display apparatus of the present invention is an active matrix-type image display apparatus provided with a light control element and a field-effect type transistor for driving this light control element, wherein the active layer of the field-effect type transistor is a crystalline oxide and the active layer has an electron carrier concentration of less than $2\times10^{+17}/\text{cm}^3$.

In this way, it can be driven as a TFT without fail. When driven as a TFT, problems such as occurrence of the normally-on state, an increase in threshold voltage, a lowering in the on-off ratio and an increase in the amount of current leakage can be eliminated. As a result, image quality can be improved.

In the case of the semiconductor film according to the present invention, it is preferred that the electron carrier concentration at around room temperature be less than about $10^{+17}\,\text{cm}^{-3}$, more preferably about $2\times10^{+16}\,\text{cm}^{-3}$ or less. With this range, reliability and performance of the TFT can be further improved.

In addition, it is preferred that the crystalline oxide contain In and a positive divalent element.

Due to the presence of these elements, a bixbite type crystal of indium oxide is contained, and due to the bixbite structure, electron mobility can be increased. The reason therefor is assumed that the 5S orbit of indium has an edge-sharing structure.

Furthermore, it is preferred that indium be solid-solution-substituted by at least part of a positive divalent element such as zinc. The reason therefor is that, since indium, which is a positive trivalent element, is solid-solution-substituted by a positive divalent element, electron carrier concentration can be effectively lowered.

It is further preferred that the crystalline oxide be a polycrystalline oxide containing In and one or more positive divalent elements selected from Zn, Mg, Cu, Ni, Co and Ca, and that the atomic ratio of the above-mentioned In [In] and the above-mentioned positive divalent element [X][X]/([X]+[In]) be 0.0001 to 0.13.

With this range, the electron carrier concentration can be about less than $2\times10^{+17}\,\text{cm}^3$. That is, the inventors have found that, by preparing a crystal film which is composed mainly of In and containing as a dopant a positive divalent element and by controlling the dopant concentration or post treatment conditions, the electron carrier concentration can be less than about $2\times10^{+17}\,\text{cm}^3$.

In addition, in the semiconductor thin film of the present invention, the atomic ratio of In [In] and the above-mentioned positive divalent element [X]X/(X+In) is 0.0001 to 0.13. The reasons therefor are as follows. If the atomic ratio [X/(X+In)] is smaller than 0.0001, the number of carriers may not be controlled. In addition, if the atomic ratio [X/(X+In)] exceeds 0.13, the interface or surface may be denatured and may become unstable. Furthermore, the crystallization temperature may be elevated to make crystallization difficult, whereby the electron carrier concentration may be increased, the electron carrier concentration may change with time, the Hall mobility may be lowered, the heat resistance may be lowered and the chemicals resistance may be lowered. Moreover, when the transistor is driven, the threshold voltage may vary or driving may become unstable.

It is preferred that the crystalline oxide be resistant to PAN.

Due to PAN resistance, the degree of freedom in the manufacturing process is enhanced, whereby a TFT substrate can be produced efficiently.

Moreover, it is preferred that the electron mobility relative to the electron career concentration of the crystalline oxide logarithmically proportionally increase in a predetermined range with an increase in the above-mentioned electron career concentration.

In this way, since the electron mobility increases by controlling the production conditions, the on-off ratio is increased, thereby improving the properties of a transistor.

Furthermore, it is preferred that the concentration of Li and Na in the crystalline oxide be 1000 ppm or less.

With this range, the properties do not change largely when driven for a long period of time, whereby the reliability of a transistor can be improved.

In addition, it is preferred that the light control element be a liquid crystal element or an EL element.

In this way, it is possible to provide a liquid crystal image display apparatus or an EL image display apparatus improved in image quality.

Furthermore, in order to attain the above-mentioned object, the semiconductor device of the present invention is a semiconductor device in which a crystalline oxide is used as an N-type semiconductor and the electron carrier concentration of the crystalline oxide is less than $2\times10^{+17}\,\text{cm}^3$.

As mentioned above, by using a crystalline oxide having more excellent properties as compared with an amorphous oxide as an N-type semiconductor, the stability, uniformity, reproducibility, heat resistance, durability or the like of the semiconductor device can be improved, in addition, if the semiconductor device is a TFT, it is possible to provide a TFT improved in large-area uniformity or reproducibility. Here, the semiconductor device means a semiconductor element, a semiconductor component, a semiconductor apparatus, an integrated circuit or the like.

If the semiconductor device of the present invention is a thin film transistor or the like, it is preferred that the electron carrier concentration at around room temperature be less than about $10^{+17}\,\text{cm}^{-3}$, more preferably about $2\times10^{+16}\,\text{cm}^{-3}$ or less. With this range, reliability and performance of a thin film transistor or the like can be further improved.

Furthermore, the crystalline oxide contains a mono-crystalline oxide, an epitaxial oxide, and a polycrystalline oxide. A polycrystalline oxide is preferable since it can be easily produced on the industrial basis.

It is preferred that the crystalline oxide contain In and a positive divalent element.

Due to these elements, a bixbite type crystal of indium oxide is contained, and due to the bixbite structure, electron mobility can be increased. The reason therefor is assumed that the 5S orbit of indium has an edge-sharing structure.

Furthermore, it is preferred that indium is solid-solution-substituted by at least part of a positive divalent element such as zinc. The reason therefor is that, since iridium, which is positive trivalent, is solid-solution-substituted by a positive divalent element, electron carrier concentration can be effectively lowered.

It is further preferred that the crystalline oxide be a polycrystalline oxide containing In and one or more positive divalent elements selected from Zn, Mg, Cu, Ni, Co and Ca, and that the atomic ratio of the above-mentioned In [In] and the above-mentioned positive divalent element [X][X]/([X]+[In]) be 0.0001 to 0.13.

With this range, the electron carrier concentration can be about less than $2\times10^{17}/\text{cm}^3$. That is, the inventors have found that, by preparing a crystal film which is composed mainly of In and containing as a dopant a positive divalent element, and by controlling the dopant concentration or post treatment conditions, the electron carrier concentration can be less than about $2\times10^{17}/\text{cm}^3$.

In addition, in the semiconductor thin film of the present invention, the atomic ratio of In [In] and the above-mentioned positive divalent element [X]X/(X+In) is 0.0001 to 0.13. The reasons therefor are as follows. If the atomic ratio [X/(X+In)] is smaller than 0.0001, the number of carriers may not be controlled. In addition, if the atomic ratio [X/(X+In)] exceeds 0.13, the interface or surface may be denatured easily and may become unstable. Furthermore, the crystallization temperature may be high to make crystallization difficult, whereby the electron carrier concentration may be increased, the electron carrier concentration may change with time, the Hall mobility may be lowered, the heat resistance may be lowered and the chemicals resistance may be lowered. Moreover, when the transistor is driven, the threshold voltage may vary or driving may become unstable.

Moreover, it is preferred that the electron mobility relative to the electron career concentration of the crystalline oxide logarithmically proportionally increase by at least changing the atomic ratio of said In [In] and said positive divalent element [X].

In this way, the semiconductor properties can be set easily, and the added value of the semiconductor can be improved.

It is preferred that the crystalline oxide be resistant to PAN.

Due to PAN resistance, the degree of freedom in the manufacturing process is enhanced, whereby a semiconductor device can be produced efficiently.

Furthermore, it is preferred that the concentration of Li and Na in the crystalline oxide be 1000 ppm or less.

With this range, the properties do not change largely when driven for a long period of time, whereby the reliability of a transistor can be improved.

It is preferred that the semiconductor device be a thin film transistor, and the crystalline oxide be used as the channel layer.

Due to such a configuration, the stability, uniformity, reproducibility, heat resistance, durability or the like of a thin film transistor can be improved.

It is preferred that the semiconductor device be provided with a P-type region and an N-type region and the crystalline oxide be used in the N-type region.

Due to such a configuration, the stability, uniformity, reproducibility, heat resistance, durability or the like of a semiconductor device provided with a P-type region and a N-type region can be improved.

Furthermore, it is preferred that the semiconductor device be a PN junction type transistor.

Due to such a configuration, the stability, uniformity, reproducibility, heat resistance, durability or the like of a PN junction type transistor can be improved.

Furthermore, it is preferred that the semiconductor device be a static induction transistor, a Schottky barrier transistor, a Schottky diode or a resistive element, and the crystalline oxide be used as an electron conductor.

In this way, the stability, uniformity, reproducibility, heat resistance, durability or the like of a Schottky barrier transistor, a Schottky diode or a resistive element can be improved.

Moreover, it is preferred that the semiconductor device be an integrated circuit, and that an N-type thin film transistor using the crystalline oxide be contained.

In this way, the stability, uniformity, reproducibility, heat resistance, durability or the like of an integrated circuit can be improved. In this integrated circuit, the N-type thin film transistor can be used in a logical circuit, a memory circuit, a differential amplification circuit or the like, for example.

Furthermore, it is preferred that the semiconductor device be provided with a first region composed of the crystalline oxide and a second region forming a hetero junction for the first region.

Due to such a configuration, the stability, uniformity, reproducibility, heat resistance, durability or the like of a semiconductor device having a hetero junction can be improved.

BRIEF DESCRIPTION OF THE DRAWINGS

FIG. 3 is a schematic view showing the state in which a gate electrode is formed in the method for producing a thin film transistor according to the first embodiment of the present invention, in which (a) shows a cross-sectional view of a substrate, (b) is a cross-sectional view showing the state in which a conductor film is formed, and (c) is a cross-sectional view showing the state in which a gate electrode is formed;

FIG. 4 is a schematic cross-sectional view showing the state in which an insulator film is formed by the method for producing a thin film transistor according to the first embodiment of the present invention;

FIG. 5 is a schematic view showing the state in which a channel layer is formed by the method for producing a thin film transistor according to the first embodiment of the present invention, in which (a) is a cross-sectional view showing the state in which an amorphous oxide film is formed, (b) is a cross-sectional view showing the state in which the amorphous oxide film is patterned, and (c) is a cross-sectional view showing the state in which the amorphous oxide film is crystallized and a channel layer composed of the crystalline oxide film is formed;

FIG. 6 is a schematic view showing the state in which a source electrode and a drain electrode are formed by the method for forming a thin film transistor according to the first embodiment of the present invention, in which (a) is a cross-sectional view showing the state in which a conductor film is formed and (b) is a cross-sectional view showing the state in which the conductor film is patterned, whereby a source electrode and a drain electrode are formed;

FIG. 12 is a schematic view of a third application example of the thin film transistor produced by the method for producing a thin film transistor according to the first embodiment of the present invention, in which (a) shows a plan view and (b) shows an enlarged view of essential parts in (a) taken along the line A-A;

FIG. 19 is a table showing the film-forming method, the film-forming conditions, the atomic ratio in the film composition, the oxidization treatment conditions and the properties of the semiconductor thin film in Examples 4 to 14 and Comparative Examples 3 to 8;

FIG. 26 is a table Showing the film-forming method, the film-forming conditions, the atomic ratio in the film composition, the oxidization treatment conditions and the properties of the semiconductor thin film in Examples 15 to 25 and Comparative Examples 9 to 14;

BEST MODE FOR CARRYING OUT THE INVENTION

Hereinafter, an explanation is made on preferred embodiments of the method for producing a thin film transistor, a thin film transistor, a thin film transistor substrate, an image display apparatus, and a semiconductor device according to the present invention.

[First Embodiment of the Method for Producing a Thin Film Transistor]

Figure 1:
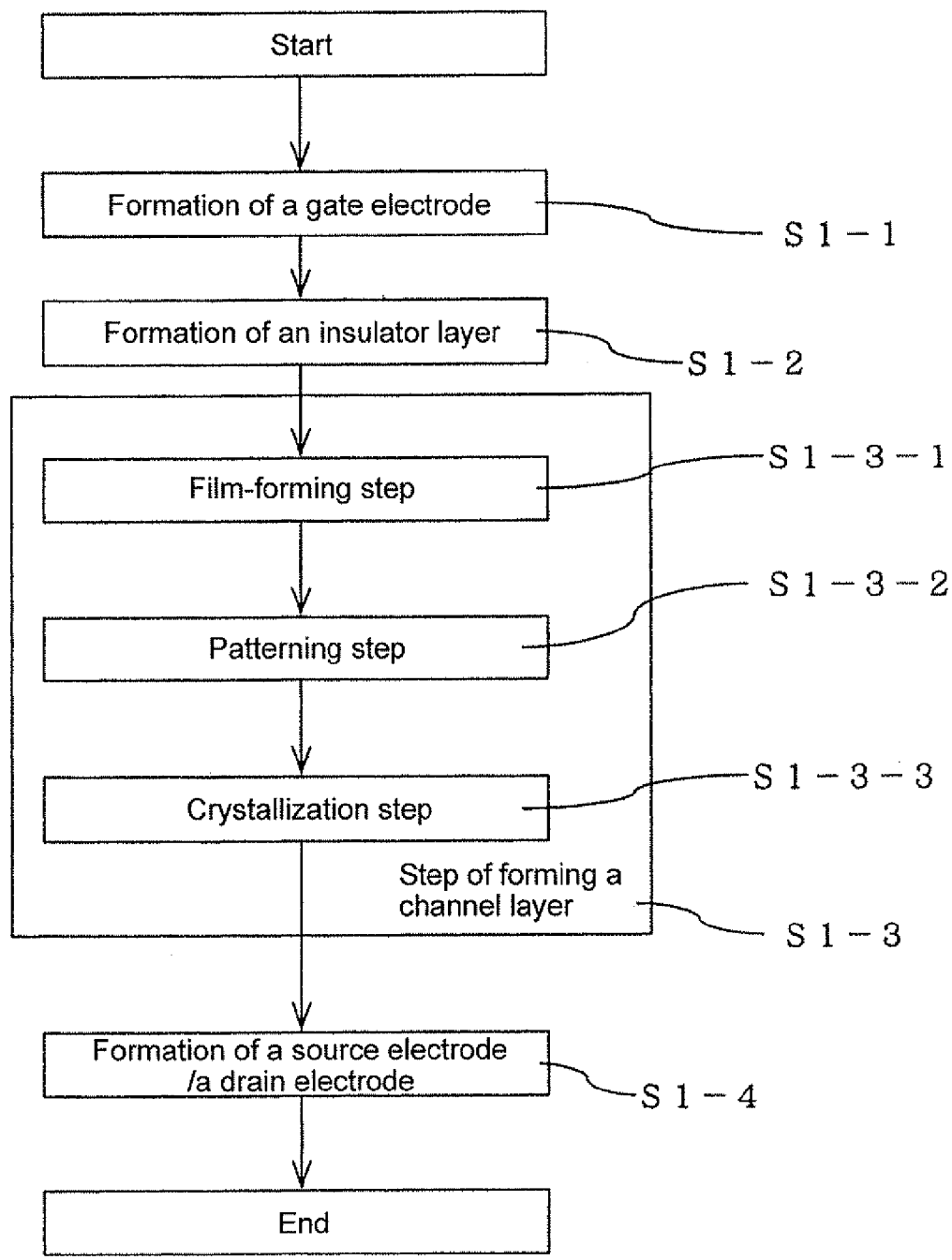
FIG. 1 is a schematic flow chart of the method for producing a thin film transistor according to a first embodiment of the present invention.

FIG. 1 is a schematic flow chart of the method for producing a thin film transistor according to the first embodiment of the present invention.

In FIG. 1, this embodiment is the method for producing the so-called inverted staggered-type thin film transistor (see FIG. 2), in which a gate electrode 1002 is formed on a substrate 1006 (S1-1), an insulating film 1003 is formed on the gate electrode 1002 (S1-2), a channel layer is formed on the insulator film 1003 (S1-3), and then, a source electrode 1004 and a drain electrode 1005 are formed (S1-4), whereby a thin film transistor is produced.

Moreover, the step of forming a channel layer (S1-3) includes a film-forming step (S1-3-1) in which an amorphous oxide film 1001a is formed, a patterning step (S1-3-2) in which the amorphous oxide film 1001a formed in the film-forming step (S1-3-1) is patterned by etching, and a crystallization step (S1-3-3) in which the amorphous oxide film 1001b patterned in the patterning step (S1-3-2) is crystallized and the thus crystallized crystalline oxide film 1001 is allowed to be a channel layer.

Next, with reference to the drawings, an explanation is made on the method for producing the inverted-staggered type thin film transistor.

FIG. 3 is a schematic view showing the state in which a gate electrode is formed in the method for producing a thin film transistor according to the first embodiment of the present invention, in which (a) shows a cross-sectional view of a substrate, (b) is a cross-sectional view showing the state in which a conductor film is formed, and (c) is a cross-sectional view showing the state in which a gate electrode is formed.

In FIG. 3(a), the substrate 1006 is a glass substrate and is formed in a predetermined size and shape. In addition, non-alkaline glass is used for the above-mentioned glass substrate.

Next, as shown in FIG. 3(b), a conductor film 1002a formed of Mo is formed by using the DC magnetron sputtering method.

In addition, the material of the conductor film 1002a is not limited to Mo as mentioned above, and transparent electrode materials such as IZO and ZnO, metal materials such as Al, Ag, Cr, Ni, Au, Ti, and Ta, or alloy materials containing the above-mentioned metal material may be used.

Then, as shown in FIG. 3(c), patterning is conducted by wet etching with a photoresist and a PAN etching solution (an etching solution containing phosphoric acid, nitric acid, and acetic acid), whereby the gate electrode 1002 is formed (S1-1).

FIG. 4 is a schematic cross-sectional view showing the state in which an insulator film is formed by the method for producing a thin film transistor according to the first embodiment of the present invention.

In FIG. 4, on the substrate 1006 and the gate electrode 1002, an insulator film 1003 of a single layer of SiNx is formed by the CVD method (S2-1).

Meanwhile, the material of the insulator film 1003 is not limited to SiNx as mentioned above, and can be selected arbitrarily from the materials which are generally used within a range which does not impair the advantageous effects of present invention in this embodiment. For example, oxides such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$ and AlN can be used. Of these, it is preferable to use $SiO_2$, SiNx, $Y_2O_3$, $Hf_2O_3$ and $CaHfO_3$. It is more preferable to use $SiO_2$, SiNx, $Al_2O_3$, $Y_2O_3$, $Hf_2O_3$ and $CaHfO_3$, with $Y_2O_3$ being particularly preferable. The number of oxygen in these oxides does not necessarily agree with the chemical stoichiometric ratio (for example, they may be $SiO_2$ or SiOx). In addition, the insulator film 1003 may have a structure in which two or more insulating films formed of the above-mentioned different material are stacked. The insulator film 1003 may be mono-crystalline, polycrystalline or amorphous. It is preferred that the insulator film 1003 be polycrystalline or amorphous since a polycrystalline or amorphous insulator film can be easily produced on the industrial basis.

FIG. 5 is a schematic view showing the state in which a channel layer is formed by the method for producing a thin film transistor according to the first embodiment of the present invention, in which (a) is a cross-sectional view showing the state in which an amorphous oxide film is formed, (b) is a cross-sectional view showing the state in which the amorphous oxide film is patterned, and (c) is a cross-sectional view showing the state in which the amorphous oxide film is crystallized and a channel layer composed of the crystalline oxide film is formed.

In FIG. 5(a), in the above-mentioned step of forming a channel layer (S1-3), an amorphous oxide film 1001a is formed at first (S1-3-1).

The thickness of this amorphous oxide film 1001a is normally about 0.5 to 500 nm, preferably 1 to 150 nm, more preferably about 3 to 80 nm, and particularly preferably about 10 to 60 nm. This is because it will become difficult to form a film uniformly on the industrial base if the thickness is smaller than about 0.5 nm. On the other hand, if the thickness is larger than about 500 nm, the time required for film forming is too long to be industrially implemented. On the other hand, if the thickness is within the range of about 3 to 80 nm, the TFT characteristics including the mobility and the on-off ratio are particularly improved.

As for the above-mentioned film forming method, any of the film forming method selected from the sputtering method, the vacuum deposition method, the ion plating method, the CVD method and the dipping method can be used. These film forming methods are conventional technologies, and can be easily implemented.

As for the sputtering method, the DC sputtering method, the DC magnetron sputtering method, the AC sputtering method, the AC magnetron sputtering method, the RF sputtering method, the RF magnetron sputtering method, the opposite target sputtering method, the cylindrical target sputtering method, the ECR sputtering method, or the like may be used.

The DC magnetron sputtering method or the AC magnetron sputtering method is industrially preferable in view of stable discharge, low cost and easiness in increasing in size. The DC magnetron sputtering method is particularly preferable. Furthermore, the RF magnetron sputtering method has a large degree of freedom in selecting materials, and is improved in flexibility as an apparatus. In addition, the DC magnetron sputtering method, the AC magnetron sputtering method and the RF magnetron sputtering method are conventional technologies improved in economy, productivity and quality, and can be readily implemented.

In addition, co-sputtering, reactive sputtering, RF-superimposed DC sputtering or the like may be used.

In the case of the sputtering method, the ultimate pressure is normally about $5 \times 10^{-2}$ Pa or less. The reason therefor is that, if the ultimate pressure is larger than about $5 \times 10^{-2}$ Pa, the mobility may be lowered due to impurities in an atmospheric gas. In order to avoid such disadvantage more effectively, the ultimate pressure is preferably about $5 \times 10^{-3}$ Pa or less, more preferably about $5 \times 10^{-4}$ Pa or less, further preferably about $1 \times 10^{-4}$ Pa or less, with about $5 \times 10^{-5}$ Pa or less being particularly preferable.

In the case of the sputtering method, the partial pressure of oxygen in an atmospheric gas is normally about $1 \times 10^{-2}$ Pa or less. The reason therefor is that, if the partial pressure of oxygen in an atmospheric gas is larger than about $1 \times 10^{-2}$ Pa, the mobility may be lowered, the electron carrier concentration may be instable, or etching residues may be generated at the time of wet etching. In order to avoid such a disadvantage more effectively, the partial pressure of oxygen in an atmospheric gas is preferably about $40 \times 10^{-3}$ Pa or less, more preferably about $10 \times 10^{-3}$ Pa or less, with about $1 \times 10^{-3}$ Pa or less being particularly preferable.

The substrate-target distance (S-T distance) during sputtering is normally about 150 mm or less, preferably about 110 mm, with about 80 mm or less being particularly preferable. The reason therefor is as follows. If the S-T distance is short, activation of a positive divalent element can be expected since the substrate is exposed to plasma during sputtering. If the S-T distance is longer than 150 mm, the film forming speed may become too slow to be industrially applicable.

Normally, a film is physically formed at a substrate temperature of about 150° C. or less. The reason therefor is that, if the substrate temperature is higher than about 150° C., the effects of the post treatment may not be exhibited sufficiently, whereby it becomes difficult to keep a low electron carrier concentration and a high mobility, or residues may remain after wet etching. In order to effectively avoid such disadvantages, the substrate temperature is preferably about 130° C. or less, more preferably about 110° C. or less, further preferably about 80° C. or less, and particularly preferably about 50° C. or less.

It is preferred that water or hydrogen be contained in an atmospheric gas in the sputtering method. The concentration of water ($H_2O$) or hydrogen ($H_2$) in an atmospheric gas is normally about 0.001 to 30 vol %, preferably about 0.01 to 15 vol %, more preferably about 0.1 to 10 vol %, further preferably about 0.5 to 5 vol %, and particularly preferably about 1 to 3 vol %. The reason therefor is that, if the concentration is smaller than about 0.001 vol %, etching residues may remain at the time of wet etching. If the amount of etching residues is large, the thin film transistor becomes difficult to operate, resulting in a poor yield. If the concentration is larger than 30 vol %, the field-effect mobility of the thin film transistor may be lowered. If the field-effect mobility of the thin film transistor is lowered, the thin film transistor becomes hard to operate, resulting in a poor yield and a lowered production efficiency.

Inclusion of water or hydrogen in an atmospheric gas during the above-mentioned sputtering method is particularly effective when the content of In is large.

As the vapor deposition method, the resistance heating method, the electron beam heating method, the pulse laser deposition (PLD) method or the like can be used.

As the ion plating method, the ARE (Activated Reactive Evaporation) method and the HDPE (High Density polyethylene) method can be used.

As the CVD (Chemical Vapor Deposition) method, the thermal CVD method and the plasma CVD method can be used.

As mentioned above, according to each of the above-mentioned methods, the amorphous oxide film 1001a can be formed easily.

The amorphous oxide film 1001a is formed of an oxide composed mainly of In (indium). For example, when an oxide composed of indium oxide having a low crystallization temperature is used, the process temperature can be decreased since crystallization can be performed with low energy. Therefore, a large-sized glass substrate or the like can be used, and hence, can be suitably applied to the production process of a middle- to large-sized image display apparatus such as a liquid crystal display. Here, the expression "mainly composed of" means that indium is contained in an amount of 50 at % or more in atomic ratio, excluding oxygen.

Meanwhile, the main component of the amorphous oxide film 1001a is not limited to In, and it may be Sn. However, when comparing In with Sn, In is more preferable. The amorphous oxide film 1001a may be formed of an oxide containing one or more element selected from In, Sn, Ga and Zn. Within a range with does not impair the advantageous effects of the present invention, other elements such as a positive trivalent element may be contained.

The amorphous oxide film 1001a may contain a lanthanoid (La, Ce, Pr, Nd, Pm, Sm, Eu, Gd, Tb, Dy, Ho, Er, Tm, Tb, Lu) in order to reduce the amount of etching residues after wet etching as well as to improve reliability of a thin film transistor. The content of a lanthanoid is preferably about 20 at % or less in terms of atomic ratio, more preferably about 10 at % or less, and particularly preferably about 5 at % or less. The reason therefor is that, if a lanthanoid is contained in an amount larger than about 20 at %, the carrier mobility may decrease when a thin film transistor is formed.

In addition, it is preferred that the amorphous oxide film 1001a contain In and a positive divalent element. Here, the positive divalent element means an element which can have two positive valences as the valence in the ionic state.

Examples of the above-mentioned positive divalent element include Zn, Be, Mg, Ca, Sr, Ba, Ti, V, Cr, Mn, Fe, Co, Ni, Pd, Pt, Cu, Ag, Cd, Hg, Sm, Eu and Yb. Of these, Zn, Mg, Mn, Co, Ni, Cu, and Ca are preferable. Furthermore, since career concentration can be controlled efficiently, Zn, Mg, Cu, Ni, Co, and Ca are more preferable. In view of the effect of the career concentration control by the addition, Cu and Ni are preferable. In view of transmittance and the width of the band gap, Zn and Mg are particularly preferable. Zn is most preferable since the amount of etching residues is decreased. The number of these positive divalent elements is not limited to one, and a plurality of positive divalent elements may be used in combination insofar as the advantageous effects of this embodiment are not impaired.

That is, if the amorphous oxide film 1001a contains In and a positive divalent element, the positive divalent element can exhibit advantageous effects as a dopant in the oxide film, and the crystalline oxide film 1001 can have properties as a semiconductor and can be used as a carrier layer. In addition, since the oxide film can be crystallized, chemicals resistance can be improved without fail.

Furthermore, it is preferred that the amorphous oxide film contain a small amount of a tetravalent element. If the amorphous oxide film contains a small amount of a tetravalent element, the valence number is well-balanced. As a result, the positive divalent element becomes stable in an oxide of indium which is a positive trivalent element. As a result, reliability or uniformity is hard to be lowered. In order to allow such advantageous effects to be exhibited, the ratio of the positive tetravalent element ([IV]) and the positive divalent element ([II]) ([IV]/[II]) be 0.0001 or more and 0.5 or less, more preferably 0.001 or more and 0.1 or less, and further preferably 0.001 or more and 0.05 or less. As the positive tetravalent element, Sn, Ge, Si, C, Pb, Zr, Ce, Nd, Tb, Ti, V, Hf, Mo, Ru or the like can be given. Of these, Sn, Ge, Si, C an Zr are preferable since they can stabilize the positive divalent element easily.

If the amorphous oxide film 1001a contains In and a positive divalent element, it is preferred that the atomic ratio of In [In] and the positive divalent element [X][X]/([X]+[In]) be $0.0001 \leq [X]/([X]+[In]) \leq 0.5$, more preferably $0.01 \leq [X]/([X]+[In]) \leq 0.1$, particularly preferably $0.05 \leq [X]/([X]+[In]) \leq 0.09$. The reason therefor is that, if the atomic ratio [X]/([X]+[In]) is smaller than 0.0001, the advantageous effects as a dopant are small, and the electron carrier concentration may increase or residues may remain after wet etching. If the atomic ratio is larger than 0.5, crystallization may be difficult.

With this amount range, since the electron carrier concentration of the crystalline oxide film 1001 can be preferably set, the crystalline oxide film 1001 can be produced as a carrier layer having more improved semiconductor properties. Specifically, by using an oxide containing In and a positive divalent element in the above-mentioned atomic ratio and by crystallizing the amorphous oxide film 1001b during the process, an oxide film, which is a conductive film or the like when it is amorphous, is changed into a semiconductor film, the chemicals resistance is improved, and selective etching for the channel layer of a conductive film 1004a on the channel layer can be realized.

The amorphous oxide film 1001a in this embodiment is an oxide containing in and a positive divalent element. However, the amorphous oxide film is not limited thereto. For example, the amorphous oxide film 1001a may be formed of an oxide which contains Sn, a positive trivalent element and/or a positive divalent element.

Next, as shown in FIG. 5(b), patterning is conducted by wet etching using a photoresist and an oxalic acid-based etching solution, whereby an amorphous oxide film 1001b with a predetermined shape and size is formed (S1-3-2). Furthermore, it is preferred that the above-mentioned oxalic acid-based etching solution be used at a temperature of about 15 to 60° C.

Although not shown, this wet etching is conducted as follows. A photoresist is applied on the surface of the amorphous oxide film 1001a and part of the photoresist corresponding to an unnecessary part of the amorphous oxide film 1001a is removed. Thereafter, the amorphous oxide film is immersed in an etching solution, whereby the exposed amorphous oxide film 1001a is dissolved. Here, the amorphous oxide film 1001a has poor resistance to chemicals since it is amorphous, and hence, it can be easily and accurately patterned by wet etching. That is, since dry etching is unnecessary, economy and productivity can be improved.

Furthermore, it is preferred that the wet etching be conducted by using an etching solution containing one or more acids selected from oxalic acid, hydrochloric acid and phosphoric acid. In this way, conventional etching solutions can be used.

As for the predetermined shape of the amorphous oxide film 1001b, the ratio of the channel width W and the channel length L W/L is normally about 0.1 to 100, preferably about 1 to 20, and particularly preferably about 2 to 8. The reason therefor is that, if the W/L exceeds about 100, current leakage may increase or the on-off ratio may be lowered. If the W/L is smaller than about 0.1, the field-effect mobility may be lowered or the pinch-off may be unclear.

As for the predetermined size of the amorphous oxide film 1001b, the channel length L is normally about 0.1 to 1000 µm, preferably about 1 to 100 µm, and further preferably about 2 to 10 µm. The reason therefor is that, if the channel length is about 0.1 µm or less, production on the industrial basis may be difficult, a short-channel effect may be caused, or the amount of current leakage may be increased. On the other hand, a channel length of about 1000 µm or more is not preferable, since a device may become too large or the driving voltage may be too high.

Then, as shown in FIG. 5(c), the amorphous oxide film 1001b which has been patterned in the patterning step (S1-3-2) is crystallized, and the crystalline oxide film 1001 which has been crystallized is allowed to be a channel layer (S1-3-3).

Preferably, in the above-mentioned crystallization step (S1-3-3), the amorphous oxide film 1001b may be crystallized by using one or more treatment methods selected from a heat treatment, a plasma treatment and a laser irradiation treatment. By such a treatment method, the amorphous oxide film 1001b can be crystallized by using conventional treatment technologies. As the heat treatment method, conventional heat treatment methods such as heating in a heating furnace or LRTA (lamp rapid thermal annealing) can be used.

The above-mentioned crystallization step (S1-3-3) may be conducted in an atmosphere such as an inactive gas atmosphere such as an argon atmosphere or a nitrogen atmosphere, an atmosphere in the presence of oxygen such as an ambient atmosphere, a vacuum atmosphere, a low-pressure atmosphere or the like. It is preferred that the crystallization be conducted in an inactive gas atmosphere in which removal of oxygen hardly occurs or in an atmosphere in the presence of oxygen.

In this embodiment, the amorphous oxide film 1001b is crystallized by a heat treatment.

If a heat treatment is conducted, it is preferred that the temperature of the film surface at the time of a heat treatment is higher by about 100 to 270° C. than the substrate temperature at the time of film formation. The reason therefor is that, if the temperature difference is smaller than about 100° C., no advantageous effects are brought about by a heat treatment. On the other hand, if the temperature difference is larger than about 270° C., the substrate may deform or the interface of a semiconductor thin film is denatured to cause deterioration of semiconductor properties. In order to avoid such disadvantage more effectively, it is preferred that the film temperature at the time of a heat treatment be larger than the substrate temperature at the time of film formation by about 130 to 240° C., particularly preferably by about 160 to 210° C.

Here, the crystalline oxide (or crystal oxide) means an oxide which shows a specific diffraction pattern in an X-ray diffraction spectrum. The crystalline oxides include a single crystal oxide, a polycrystalline oxide or the like. Thin films of the crystalline oxide include a single crystal film, an epitaxial film, a polycrystalline film or the like. Of these, an epitaxial film or a polycrystalline film is preferable, with a polycrystalline film being particularly preferable. The reason therefor is that, although an epitaxial film or a polycrystalline film can be formed uniformly in a large area; a single crystal film is difficult to be formed uniformly in a large area.

The amorphous oxide is an oxide which exhibits a harrow pattern and does not exhibit any specific diffraction pattern. In the present invention, a microcrystal may be included in the amorphous oxide.

It is preferred that, in the crystallization step (S1-3-3), or after the crystallization step (S1-3-3), the crystalline oxide film 1001 be subjected to an oxidization treatment. The oxidization treatment includes a case where, in the crystallization step (S1-3-3), the amorphous oxide film 1001b is not only crystallized but also oxidized. By such an oxidization treatment, the conductivity of the crystalline oxide film 1001 can be lowered to allow the properties as a transistor to be improved. Depending on the kind, the atomic ratio or the like of the positive divalent element, by such an oxidization treatment, it is possible to impart the crystalline oxide film with semiconductor properties.

It is further preferred that the above-mentioned oxidization treatment be performed by one or more treatment methods selected from a heat treatment in the presence of oxygen, an ozone treatment and a plasma treatment. By such a treatment method, an oxidization treatment can be conducted by using conventional treatment technologies.

In addition, a temperature at which the amorphous oxide film 1001b is heat-treated and crystallized in the presence of oxygen is preferably about 150 to 500° C., more preferably about 170 to 450° C., further preferably about 190 to 390° C., and particularly preferably about 210 to 290° C. The treatment time is normally about 0.5 to 6000 minutes, preferably about 1 to 1200 minutes, more preferably 10 to 600 minutes, and particularly preferably 30 to 240 minutes.

When crystallization and oxidization are performed all at once in the crystallization step (S1-3-3), it is preferred that the sputtering method be used in the film-forming step to form an amorphous oxide film at a temperature lower than about 150° C., patterning be performed with an etching solution containing oxalic acid in the patterning step, and a heat treatment be performed in the presence of oxygen in the crystallization step at a temperature of about 150 to 500° C. In this way, for example, in contrast to the case where a temperature as high as 800° C. or higher is required for crystallizing a silicon-based thin film, a carrier layer composed of a crystalline oxide film can be formed easily at a sufficiently low temperature.

The partial pressure of water or hydrogen at the time of film formation is preferably $10^{-5}$ Pa or more and 0.5 Pa or less, more preferably $10^{-4}$ Pa or more and 0.1 Pa or less, and still more preferably $10^{-3}$ Pa or more and $5\times10^{-2}$ Pa or less. When the partial pressure of water or hydrogen is smaller than $10^{-5}$ Pa, the film tends to be crystallized easily, and residues may remain after wet etching or in-plane uniformity of the etching rate at the time of wet etching may decrease. If the partial pressure of water or hydrogen is larger than 0.5 Pa, the amount of hydrogen in the thin film tends to be large, and the mobility may tend to be lowered or reliability may be lowered.

Furthermore, it is preferred that the hydrogen concentration be shifted to the film thickness direction. In particular, it is preferred that the hydrogen concentration be higher on the side nearer to the insulating film than on the side away from the insulating film, since etching residues are hard to remain.

In the above-mentioned crystallization step (S1-3-3), the amorphous oxide film 1001b is crystallized to be a crystalline oxide film 1001. Due to such crystallization, the oxide film which is conductive when it is amorphous can be changed to a semiconductor film, and chemicals resistance can be improved. That is, by controlling the materials, the composition ratio (including the atomic ratio), the manufacturing conditions, the post-treatment conditions or the like of an oxide which becomes the crystalline oxide film 1001 (channel layer), for example, the electron carrier concentration is allowed to be about $10^{12}/cm^3$ or more and less than about $10^{18}/cm^3$, more preferably about $10^{13}/cm^3$ or more and about $10^{17}/cm^3$ or less, and further preferably about $10^{15}/cm^3$ or more and about $10^{16}/cm^3$ or less.

The electron carrier concentration of the crystalline oxide film 1001 (channel layer) according to the present invention is a value measured at room temperature. The room temperature is, for example, 25° C. Specifically, it is a temperature which can be appropriately selected from a range of about 0 to 40° C. The electron carrier concentration of the crystalline oxide film 1001 (channel layer) according to the present invention does not necessarily fall within the above-mentioned range in the entire temperature range of about 0 to 40° C. For example, it suffices that a carrier electron concentration of less than about $10^{17}/cm^3$ be realized at 25° C. In addition, the yield of a normally-off thin film transistor is improved if the carrier electron concentration is further lowered to about $3 \times 10^{16}/cm^3$ or less, more preferably about $10^{16}/cm^3$ or less. The lower limit of the electron carrier concentration is not particularly limited insofar as it can be applied as the channel layer of the thin film transistor. For example, the lower limit value is about $10^{12}/cm^3$.

The electron carrier concentration can be measured by the Hall effect measurement. It is preferred to perform the AC Hall measurement when measuring an electron carrier concentration of less than about $1 \times 10^{17}/cm^3$.

FIG. 6 is a schematic view showing the state in which a source electrode and a drain electrode are formed by the method for forming a thin film transistor according to the first embodiment of the present invention, in which (a) is a cross-sectional view showing the state in which a conductor film is formed and (b) is a cross-sectional view showing the state in which the conductor film is patterned, whereby a source electrode and a drain electrode are formed.

In FIG. 6(*a*), on an insulator film 1003 and a crystalline oxide film 1001 (channel layer), a conductor film 1004*a* composed of an Al—Nd alloy is formed by the DC magnetron sputtering method. The material for the conductor film 1004*a* is not limited to the above-mentioned Al—Nd alloy. For example, a transparent electrode material such as IZO and ZnO, a metal material such as Al (aluminum), Ag (silver), Cr (chromium), Ni (nickel), Au (gold), Ti (titanium) and Ta (tantalum), or an alloy material containing the above-mentioned metal material may be used.

Subsequently, as shown in FIG. 6(*b*), patterning is conducted by wet etching using a photoresist and a PAN etching solution, whereby a source electrode 1004 and a drain electrode 1005 are formed (S1-4). When the conductive film 1004*a* is patterned by etching, as compared with the case where liftoff or dry etching or the like is performed, economy and productivity can be improved, leading to a reduction in production cost. In addition, wet etching is suited for an increase in area, it becomes possible to apply the method to a middle- to large-sized display such as a liquid crystal display.

As for the etching solution used in this wet etching, a PAN etching solution is preferable. As the PAN etching solution, one containing about 20 to 95 wt % of phosphoric acid, about 0.5 to 5 wt % of nitric acid and about 3 to 50 wt % of acetic acid is preferable. The temperature of the solution at the time of etching is preferably about 15 to 60° C., more preferably about 20 to 45° C. The reason therefor is that, if the temperature of the solution is lower than about 15° C., the etching rate is lowered, and if the temperature of the solution is higher than about 60° C., water vapor may be generated and condensed in the environment.

As mentioned above, according to the method for producing a thin film transistor in this embodiment, an oxide film which serves as a channel layer is amorphous in the film-forming step (S1-3-1) and the patterning step (S1-3-2), has poor resistance to chemicals and is easily dissolved. Therefore, in the patterning step, the amorphous oxide film 1001*b* can be patterned easily. Furthermore, in the crystallization step (S1-3-3) after the patterning step, the amorphous oxide film 1001*b* is crystallized to be a crystalline oxide film 1001. The crystalline oxide film has a higher resistance to chemicals than the amorphous oxide. As a result, for example, without using a method such as liftoff or dry etching, which not only requires expensive equipment or a high production cost, but also does not suit to an increase in area and industrialization, it is possible to conduct easily patterning of the conductive film 1004*a* such as a metal wiring and a transparent conductor film on the channel layer (S1-4).

In addition, since the channel layer is crystallized, a possibility that the properties thereof may change due to thermal history during the production process can be significantly lowered. Therefore, it is possible to provide a thin film transistor improved in reliability, as well as to provide an image display apparatus, which is improved in reliability, using this thin film transistor.

Next, an explanation is made on Examples 1 to 3 and Comparative Examples 1 and 2 of this embodiment.

Example 1

Figure 2:
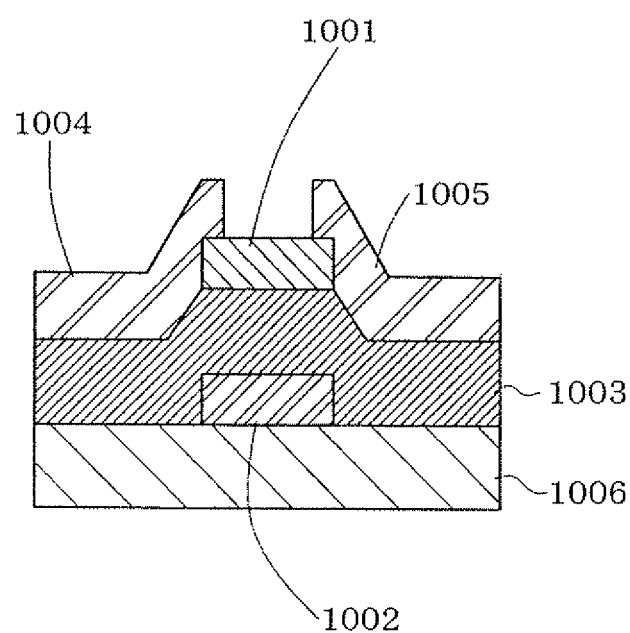
FIG. 2 is a schematic cross-sectional view explaining the thin film transistor produced by the method for producing the thin film transistor according to the first embodiment of the present invention.

In this example, an inverted-staggered type thin film transistor shown in FIG. 2 was manufactured according to the process shown in FIG. 1.

(1) Non-alkaline glass (Corning 1737 glass, manufactured by Corning Inc.) was used as a substrate 1006 (see FIG. 3 (*a*)).

(2) Mo was formed into a film of 200 nm by the DC magnetron sputtering method as a conductive film 1002*a* (see FIG. 3(*b*)).

(3) The conductive film 1002*a* was patterned by the photolithography using a PAN etching solution (40° C.), whereby a gate electrode 1002 was formed (see FIG. 3(*c*), S1-1).

(4) SiNx was formed as a gate-insulating film by the CVD method, whereby an insulator film 1003 was formed (see FIG. 4, S1-2).

Figure 7:
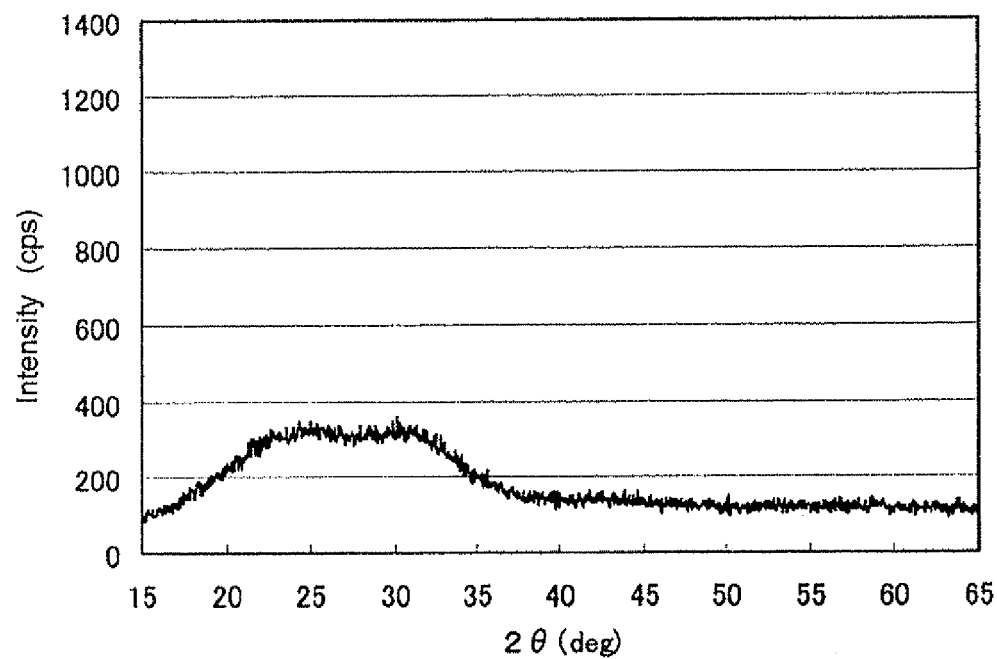
FIG. 7 is a measurement graph of the X-ray diffraction of the amorphous oxide film in the film-forming step in the thin film transistor in Example 1 of the present invention.

(5) An $In_2O_3$—ZnO sputtering target (atomic ratio [In/(In+Zn)]=0.93, atomic ratio [Zn/(In+Zn)]=0.07) and the glass substrate 1006 obtained in (4) above were installed in the film-forming equipment of the DC magnetron sputtering method, which is one of the DC sputtering methods, and a film was formed. The sputtering conditions are as follows. Substrate temperature: 25° C., ultimate pressure: $1 \times 10^{-4}$ Pa, atmospheric gas: Ar, 100 vol %, sputtering pressure (total pressure): $4 \times 10^{-1}$ Pa, input power: 100 W, and film-forming time: 10 minutes: S-T distance: 95 mm. As a result, a thin film with a thickness of 50 nm was formed on the insulator film 1003 of the glass substrate 1006 (see FIG. 5(*a*), S1-3-1). This thin film was confirmed to be an amorphous oxide film 1001*a* which does not exhibit a clear peak by the X-ray diffraction, as shown in FIG. 7.

(6) Then, patterning was performed by the photolithography using an etching solution (40° C.) containing oxalic acid, whereby the amorphous oxide film 1001*b* was formed (see FIG. 5(*b*), S1-3-2). An electron microscopic observation after etching with this oxalic acid etching solution revealed that almost no etching residues remained.

Figure 8:
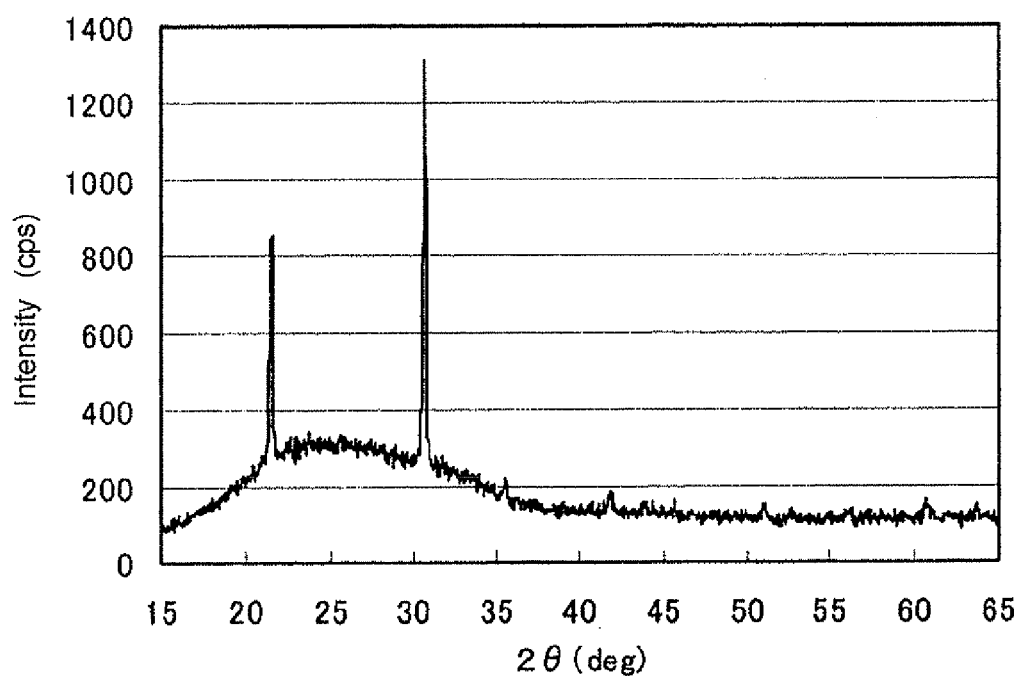
FIG. 8 is a measurement graph of the X-ray diffraction of the crystalline oxide film in the crystallization step in the thin film transistor in Example 1 of the present invention.

(7) An annealing treatment (heat treatment) was performed for 2 hours at 280° C. in the air (in the presence of oxygen), whereby the amorphous oxide 1001b was crystallized. It was confirmed by the X-ray diffraction that the thus crystallized thin film was a polycrystalline film having a bixbite crystal structure as shown in FIG. 8. That is, the amorphous oxide 1001b was crystallized to form a crystalline oxide film 1001 (crystalline oxide semiconductor thin film) (see FIG. 5(c), S1-3-3).

(8) As the conductor film 1004a, an Al—Nd alloy was formed into a film by the DC magnetron sputtering method (see FIG. 6(a)).

(9) The conductive film 1004a was patterned by photolithography using a PAN etching solution (40° C.), and a source electrode 1004 and a drain electrode 1005 were formed (refer to FIG. 6(b), S1-4).

The thin film transistor produced by the method as mentioned above had a channel width L of 100 μm, the channel length W of 500 μm, and a W/L of 5. This thin film transistor exhibited the field-effect mobility of 25 (cm$^2$/Vs), $10^7$ or more of an on-off ratio and normally-off properties.

In addition, 20 thin film transistors were manufactured by the same method as mentioned above. It was found that all 20 transistors operated normally.

Example 2

The method for producing a thin film transistor in this example was substantially the same as that in Example 1, except that, in the sputtering in (5), an In$_2$O$_3$—ZnO sputtering target (atomic ratio [In/(In+Zn)]=0.98, atomic ratio [Zn/(In+Zn)]=0.02) was used.

The thin film transistor produced by the method as mentioned above had a channel width L of 100 μm, the channel length W of 500 μm, and a W/L of 5. This thin film transistor exhibited the field-effect mobility of 35 (cm$^2$/Vs), $10^4$ or more of an on-off ratio and normally-off properties.

An electron microscopic observation after the etching with an oxalic acid etching solution in (6) above revealed that a slight amount of etching residues remained.

In addition, 20 thin film transistors were manufactured by the same method as mentioned above. It was found that 17 of them operated normally, while 3 did not operate.

Example 3

The method for producing a thin film transistor in this example was substantially the same as that in Example 2, except that the atmospheric gas used in the sputtering in (5) composed of 99 vol % of Ar and 1 vol % of H$_2$O.

The thin film transistor produced by the method as mentioned above had a channel width L of 100 μm, the channel length W of 500 μm, and a W/L of 5. This thin film transistor exhibited a field-effect mobility of 35 (cm$^2$/Vs), $10^6$ or more of an on-off ratio and normally-off properties.

An electron microscopic observation after the etching with an oxalic acid etching solution in (6) above revealed that almost no etching residues remained.

In addition, 20 thin film transistors were manufactured by the same method as mentioned above. It was found that all 20 transistors operated normally.

Comparative Example 1

The method for producing a thin film transistor in this comparative example was substantially the same as that in Example 1, except that the annealing treatment in (7) was not conducted.

The thin film transistor produced by the method as mentioned above did not have transistor properties since the channel layer was dissolved.

Comparative Example 2

The method for producing a thin film transistor in this comparative example was substantially the same as that in Example 1, except that, in the sputtering in (5), an In$_2$O$_3$—ZnO—Ga$_2$O$_3$ sputtering target (atomic ratio [In/(In+Zn+Ga)]=0.33, atomic ratio [Zn/(In+Zn+Ga)]=0.34, atomic ratio [Ga/(In+Zn+Ga)]=0.33) was used, the RF magnetron sputtering method was used, and the atmospheric gas was composed of 95% of Ar and 5% of O$_2$.

The annealing treatment in (7) was conducted. However, by the annealing treatment in an atmosphere (in the presence of oxygen) at 280° C. for 2 hours, no clear X-ray diffraction pattern was observed and the amorphous oxide 1001b was not crystallized.

The thin film transistor produced by the method as mentioned above did not have transistor properties since the channel layer was dissolved.

(Example of the Electron Carrier Concentration and the Electron Mobility of the Thin Film)

Then, an example of the electron carrier concentration and the electron mobility of the thin film will be explained with reference to the drawing.

Figure 9:
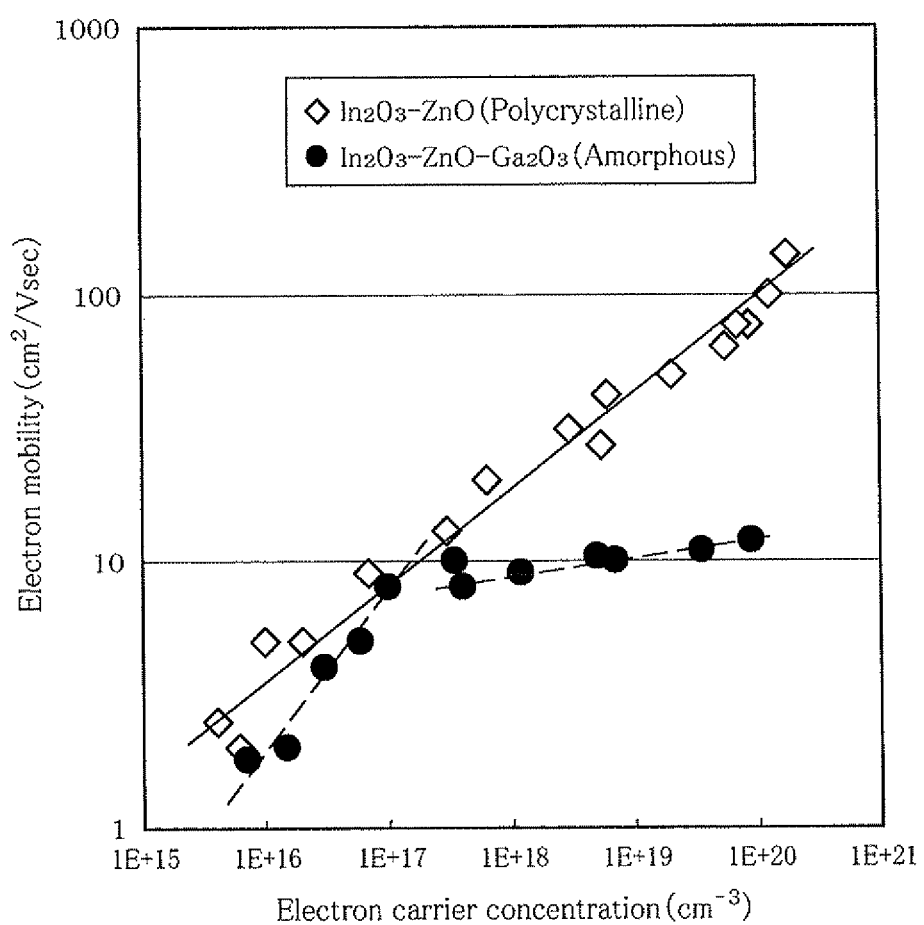
FIG. 9 is a measurement graph of the electron mobility plotted against the electron carrier concentration of a polycrystalline thin film composed of $In_2O_3$—ZnO and an amorphous thin film composed of $In_2O_3$—ZnO—$Ga_2O_3$.

FIG. 9 is a measurement graph of the electron mobility plotted against the electron carrier concentration of a polycrystalline thin film composed of In$_2$O$_3$—ZnO and an amorphous thin film composed of In$_2$O$_3$—ZnO—Ga$_2$O$_3$.

Each thin film which consisted of amorphous In$_2$O$_3$—ZnO—Ga$_2$O$_3$ in FIG. 9 was formed by using a sputtering target composed of In$_2$O$_3$—ZnO—Ga$_2$O$_3$ (atomic ratio [In/(In+Zn+Ga)]=0.33, atomic ratio [Zn/(In +Zn+Ga)]=0.34, atomic ratio [Ga/(In+Zn+Ga)]=0.33) by the RF magnetron sputtering method at a partial oxygen pressure of $10^{-3}$ to $5\times10^{-1}$ Pa. However, the conductivity of the In$_2$O$_3$—ZnO—Ga$_2$O$_3$ thin film formed at a condition at a partial pressure of oxygen exceeding $10^{-1}$ Pa could not be measured since it had an excessively high electric resistance. In this case, the electron mobility could not be measured, but assumed by extrapolating the value of a film with a large electron carrier concentration.

As each thin film composed of polycrystalline In$_2$O$_3$—ZnO, at first, amorphous oxide films were obtained by using an In$_2$O$_3$—ZnO sputtering target (atomic ratio [Zn/(In+Zn)]=0.0001 to 0.1 and by the RF magnetron sputtering method at a substrate temperature of 25° C. Subsequently, a heat treatment was conducted in vacuum or in the presence of oxygen at 280° C. for 1 to 10 hours, whereby polycrystalline oxide films were obtained. Then, the electron carrier, concentration and the mobility of these polycrystalline oxide films were measured.

As shown in FIG. 9, in both a thin film composed of amorphous In$_2$O$_3$—ZnO—Ga$_2$O$_3$ and a thin film composed of polycrystalline In$_2$O$_3$—ZnO, the electron carrier concentration could be controlled to less than $10^{16}$ cm$^{-3}$. As for the mobility at $10^{17}$ cm$^{-3}$ or more, In$_2$O$_3$—ZnO (polycrystalline film) was higher than In$_2$O$_3$—ZnO—Ga$_2$O$_3$ (amorphous film). From this, it is revealed that not only reliability but also a high degree of mobility can be expected when a polycrystalline film containing In and a positive divalent element represented by In$_2$O$_3$—ZnO (polycrystalline film) is formed into a thin film transistor. That is, the present invention can exhibit advantageous effects by enabling a film containing crystalline indium oxide, in particular, a polycrystalline oxide film to be preferably used in the carrier layer of a TFT. Almost no attempt has heretofore been made to use this film as a semiconductor film or a TFT.

Various thin film transistors (application examples) produced by utilizing the above-mentioned embodiments will be explained with reference to the drawings.

Figure 10:
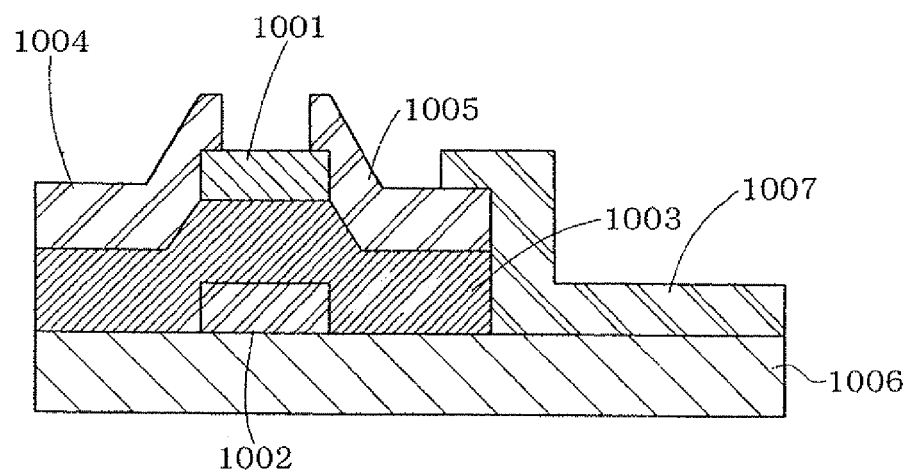
FIG. 10 is a schematic cross-sectional view of a first application example of the thin film transistor produced by the method for producing a thin film transistor according to the first embodiment of the present invention.

FIG. 10 is a schematic cross-sectional view of a first application example of the thin film transistor produced by the method for producing a thin film transistor according to the first embodiment of the present invention.

In FIG. 10, the thin film transistor has a structure in which a transparent electrode (pixel electrode) 1007 composed of a transparent conductive material is joined with a drain electrode 1005.

Figure 11:
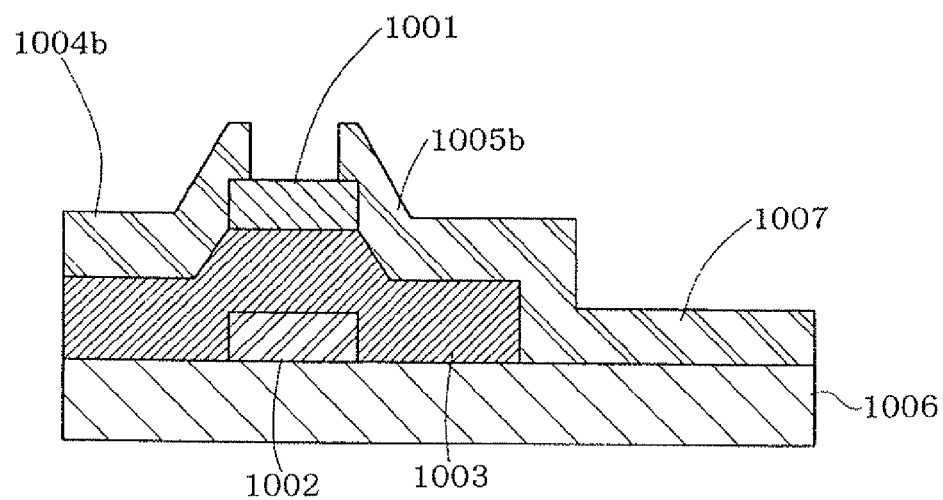
FIG. 11 is a schematic cross-sectional view of a second application example of the thin film transistor produced by the method for producing a thin film transistor according to the first embodiment of the present invention.

FIG. 11 is a schematic cross-sectional view of a second application example of the thin film transistor produced by the method for producing a thin film transistor according to the first embodiment of the present invention.

In FIG. 11, in the thin film transistor, a transparent source electrode 1004b and a transparent drain electrode 1005b, which are composed of a transparent conductive material, are formed. Furthermore, a transparent electrode (pixel electrode) 1007 and a transparent drain electrode 1005b, which are composed of a transparent conductive material, are integrally formed.

FIG. 12 is a schematic view of a third application example of the thin film transistor produced by the method for producing a thin film transistor according to the first embodiment of the present invention, in which (a) shows a plan view and (b) shows an enlarged view of essential parts in (a) taken along the line A-A. In FIG. 12(a), for the sake of understanding, a passivation film 1008 is omitted.

In FIG. 12, in the thin film transistor, the passivation film 1008 covering the entire thin film transistor is formed above the crystalline oxide film 1001 (channel layer), the source electrode 1004 and the drain electrode 1005.

On the upper surface of the passivation film 1008, a transparent electrode (pixel electrode) 1007a is formed. This transparent electrode 1007a is joined with the drain electrode 1005 through the passivation layer 1008. Meanwhile, the insulator layer 1009 is formed at the intersection of the source wire to be connected with the source electrode 1004 and the gate wire to be connected with the gate electrode such that the source wire and the gate wire are separated by the insulator layer 1009, whereby the source wire and the gate electrode are insulated.

[Second Embodiment of the Method for Producing a Thin Film Transistor]

Then, the method for producing a thin film transistor according to the second embodiment of the present invention will be explained with reference to the drawings.

Figure 13:
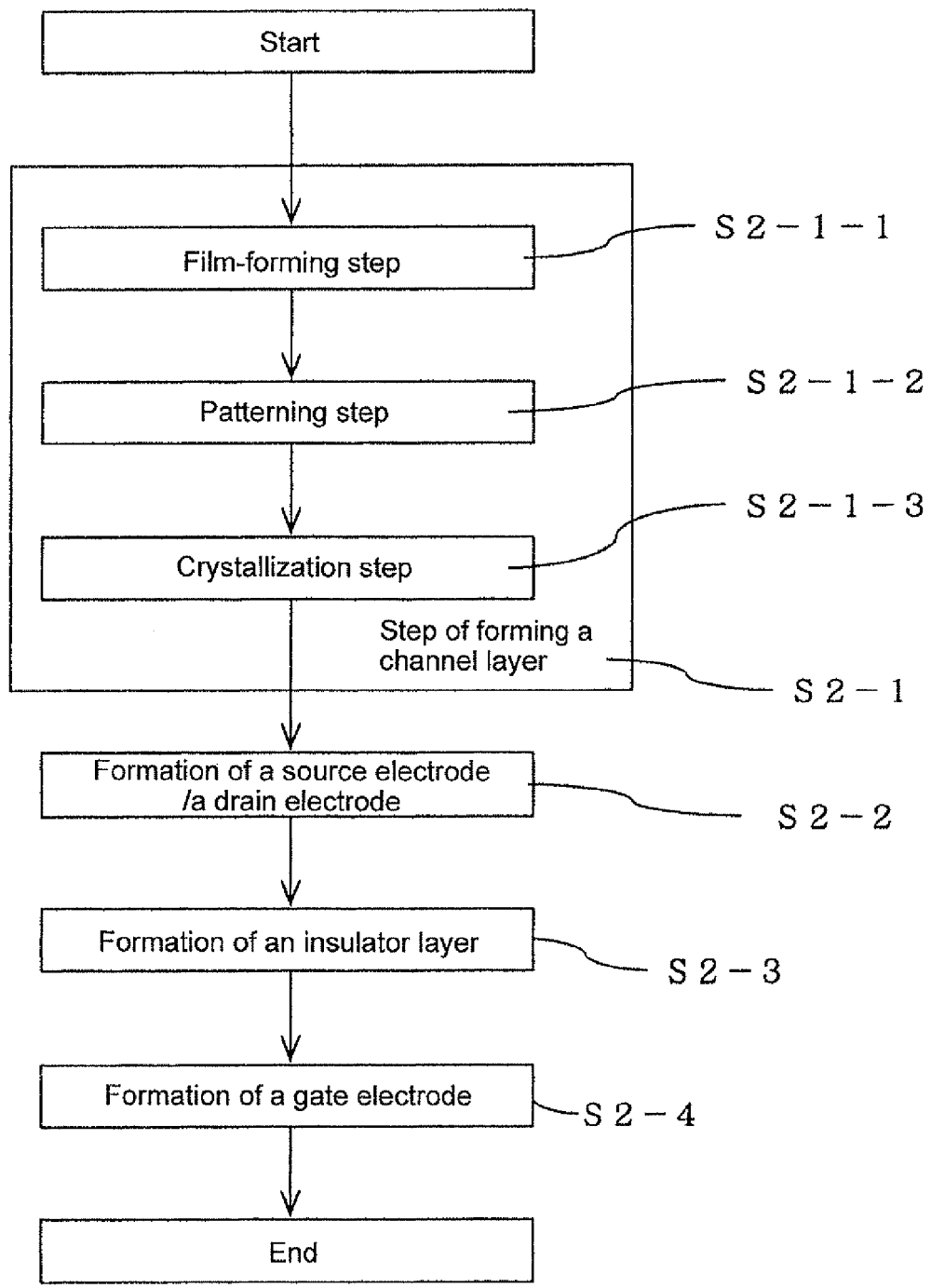
FIG. 13 is a schematic flow chart of the method for producing a thin film transistor according to a second embodiment of the present invention.

FIG. 13 is a schematic flow chart of the method for producing a thin film transistor according to the second embodiment of the present invention.

Figure 14:
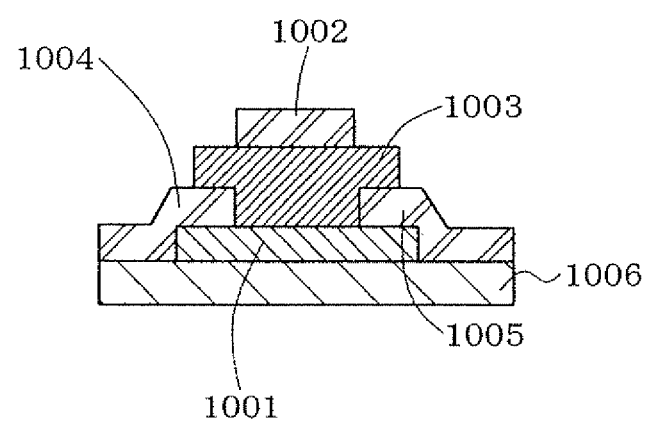
FIG. 14 is a schematic cross-sectional view for explaining the thin film transistor produced by the method for producing a thin film transistor according to the second embodiment of the present invention.

In FIG. 13, this embodiment is a method for producing a so-called staggered type thin film transistor (see FIG. 14). This method differs from the method of the above-mentioned first embodiment in the layer-stacking order.

The other methods or the like are almost the same as that in the first embodiment.

As shown in FIG. 14, on the substrate 1006, a crystalline oxide film 1001 as the channel layer is formed (S2-1). In this case, as in the first embodiment, an amorphous oxide film is formed on the substrate 1006 (S2-1-1), for example, by using the sputtering method. Next, the amorphous oxide film is patterned by wet etching (S2-1-2). Then, the amorphous oxide film is crystallized by a heat treatment or the like, whereby the crystalline oxide film 1001 is allowed to be a channel layer (S2-1-3).

Then, the source electrode 1004 and the drain electrode 1005 are formed on the crystalline oxide film 1001 (S2-2), an insulator film 1003 is formed on the source electrode 1004 and the drain electrode 1005 (S2-3), and a gate electrode is formed on the insulator film 1003 (S2-4).

According to the method for a thin film transistor of the present embodiment, almost similar advantageous effects as those in the first embodiment can be exhibited. That is, by forming the crystalline oxide film 1001 (channel layer) by wet etching and by forming the source electrode 1004 and the drain electrode 1006 on the channel layer by wet etching, the production cost can be drastically reduced and the area of a TFT substrate can be increased.

The method for producing a thin film transistor of the present invention can be applied not only to an inverted-staggered type (bottom-gate type) thin film transistor shown in the first embodiment but also to a staggered type (top-gate type) shown in this embodiment, and it is possible to improve the degree of freedom in circuit design using a thin film transistor.

[One Embodiment of the Thin Film Transistor]

In addition, the present invention is effective as the invention of a thin film transistor.

The thin film transistor of this embodiment has a configuration obtained by the above-mentioned method for producing a thin film transistor. That is, the thin film transistor of this embodiment is shown in FIGS. 2, 10, 11, 12 and 14. However, the structure of the thin film transistor is not limited to these structures, and various thin film transistors may be included.

As mentioned above, according to the thin film transistor of this embodiment, the production cost can be significantly lowered. Furthermore, since the channel layer is crystallized, the possibility that the properties thereof may change due to thermal history in the manufacturing process is drastically lowered, whereby reliability can be improved.

[One Embodiment of the Thin Film Transistor Substrate]

In addition, the present invention is effective as the invention of a thin film transistor substrate.

The thin film transistor substrate of this embodiment has a configuration in which a plurality of the above-mentioned thin film transistor is arranged on a substrate or a sheet-like base.

As mentioned above, according to the thin film transistor substrate of this embodiment, reduction in production cost and an increase in area become possible. Furthermore, since the channel layer is crystallized, the possibility that the properties thereof may change due to thermal history in the manufacturing process is drastically lowered, whereby reliability can be improved. Meanwhile, as for the thin film transistor substrate, a thin film transistor is normally arranged on a glass substrate. However, the configuration is not limited to thereto. For example, a thin film transistor may be arranged on a sheet-like base composed of a flexible material such as a resin.

[First Embodiment of the Image Display Apparatus]

The present invention is also effective as an invention of an image display apparatus.

Figure 15:
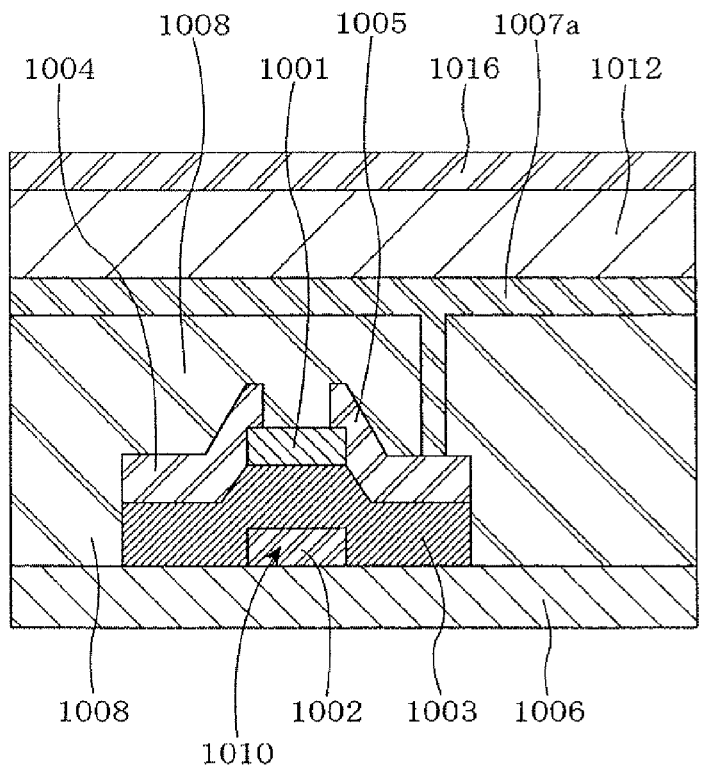
FIG. 15 is a schematic cross-sectional view of essential parts for explaining an image display apparatus according to a first embodiment of the present invention.

FIG. 15 is a schematic cross-sectional view for explaining an image display apparatus according to the first embodiment of the present invention.

As shown in FIG. 15, the image display apparatus in this embodiment has a configuration in which the inverted-staggered type thin film transistor 1010 according to the third application example produced by the production method according to the first embodiment (see FIG. 12), an emitting layer 1012 such as an organic EL and an (opposing) electrode 1016 composed of a transparent electrode material such as IZO are provided.

This image display apparatus operates by varying a gate pressure of the gate electrode 1002 of the thin film transistor 1010. When current is flown from the source electrode 1004 to the drain electrode 1005 and the transparent electrode (pixel electrode) 1007a, a difference in potential is generated between the electrode 1013 and the transparent electrode (pixel electrode) 1007a. As a result, electrons and holes are injected to the emitting layer 1012, and electrons and holes are recombined within the emitting layer 1012 to emit light.

In the image display apparatus of this embodiment, due to the use of the above-mentioned thin film transistor 1010, the production cost can be decreased and an increase in area can be realized. Since the channel layer is crystallized, the possibility that the properties thereof may change due to thermal history in the manufacturing process is drastically lowered, whereby reliability can be improved, and image quality can be improved.

[Second Embodiment of the Image Display Apparatus]

The present invention is also effective as an invention of an image display apparatus.

Figure 16:
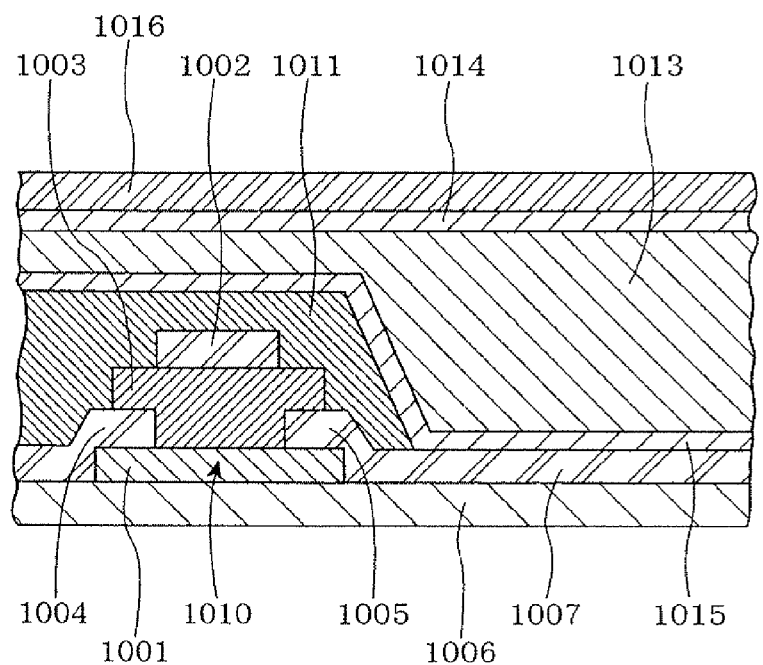
FIG. 16 is a schematic cross-sectional view of essential parts for explaining an image display apparatus according to a second embodiment of the present invention.

FIG. 16 is a schematic cross-sectional view of essential parts for explaining an image display apparatus according to the second embodiment of the present invention.

In FIG. 16, the image display apparatus of this embodiment is provided with the staggered type thin film transistor 1010 produced by the production method according to the above-mentioned second embodiment (see FIG. 14), a liquid crystal 1013, and the (opposing) electrode 1016 composed of a transparent electrode material such as IZO. In addition, the image display apparatus is provided with an interlayer insulating film 1011 covering the thin film transistor 1010 or high-resistant films 1014 and 1015.

This image display apparatus operates by varying a gate pressure of the gate electrode 1002 of the thin film transistor 1010. When current is flown from the source electrode 1004 to the drain electrode 1005 and the transparent electrode (pixel electrode) 1007, a difference in potential is generated between the electrode 1013 and the transparent electrode (pixel electrode) 1007. Due to such difference in potential, a liquid crystal 1012 operates, whereby light from a light source (not shown) is adjusted.

In the image display apparatus of this embodiment, due to the use of the above-mentioned thin film transistor 1010, the production cost can be decreased and an increase in area can be realized. Since the channel layer is crystallized, the possibility that the properties thereof may change due to thermal history in the manufacturing process is drastically lowered, whereby reliability can be improved, and image quality can be improved.

[Third Embodiment of the Image Display Apparatus]

The image display apparatus according to the third embodiment of the present invention is provided with a light-control element utilizing liquid crystal and a field-effect type transistor for operating this light control element. This field-effect type transistor is arranged as a thin film transistor in a matrix form on a transparent glass substrate.

The light control element of the present invention is not limited to one which contains a liquid crystal. For example, it may be an element containing electrophoretic particles and utilizing electrophoretic particles, or a self-emitting organic EL device or an inorganic EL device.

The base on which the above-mentioned transistor is formed is not limited to a transparent glass substrate. It may be a resin film having flexibility, for example.

Figure 17:
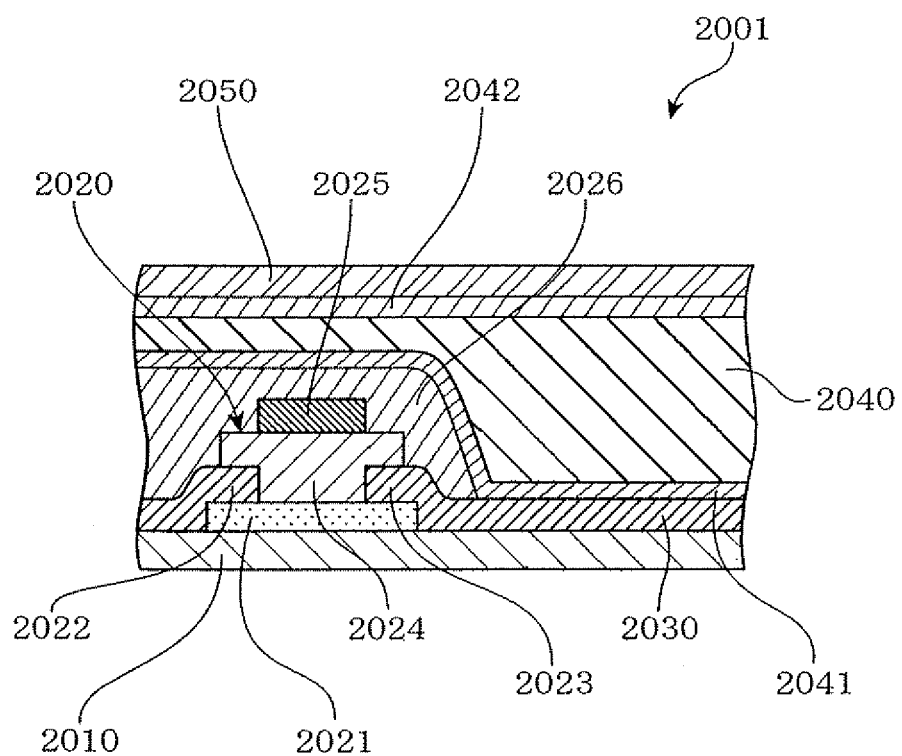
FIG. 17 is a schematic enlarged cross-sectional view of essential parts for explaining the configuration of the field-effect type thin film transistor of the image display apparatus according to a third embodiment of the present invention.

FIG. 17 is a schematic enlarged cross-sectional view of essential parts for explaining the configuration of the field-effect type thin film transistor of the image display apparatus according to the third embodiment of the present invention.

In FIG. 17, an image display apparatus 2001 is provided with a glass substrate 2010, a field-effect type thin film transistor 2020, a pixel electrode 2030, a liquid crystal 2040 and an opposing electrode 2050.

The field-effect type thin film transistor 2020 (hereinafter, appropriately abbreviated as the transistor 2020) is provided with, on a glass substrate 2010, a crystalline oxide 2021 as an active layer, a source electrode 2022 and a drain electrode 2023 provided at the both ends of the crystalline oxide 2021, a gate-insulating film 2024 formed on the source electrode 2022 and the drain electrode 2023, and a gate electrode 2025 formed on the gate-insulating film 2024. In addition, on the transistor 2020, an interlayer insulating film 2026 composed of silicon oxide or silicon nitride is formed.

Meanwhile, the transistor 2020 is not limited to the top-gate type transistor with the above-mentioned configuration. For example, it may be various transistors including a bottom-gate type transistor. Furthermore, it may be have a configuration in which a switch transistor, a driving transistor or the like are provided for one pixel.

The pixel electrode 2030 is formed on the glass substrate 2010 and connected with the drain electrode 2023. On the pixel electrode 2030 and the interlayer insulating film 2026, high-resistant films 2041 and 2042 as orientation films and an opposing electrode 2050 are formed. In a gap between the high-resistant film 2041 and the high-resistant film 2042, a liquid crystal 2040 is injected. Normally, the high-resistant film 2042 and the opposing electrode 2050 are formed on an opposing substrate (not shown). In addition, for each electrode 2022, 2023, 2025, 2030 and 2050, a transparent electrode such as $In_2O_3$—$ZnO$ (IZO (registered trademark)) or $In_2O_3$—$SnO_2$(ITO) is preferably used.

The crystalline oxide 2021 of the above-mentioned transistor 2020 has an electron carrier concentration of less than $2\times10^{17}/cm^3$. Here, the reason for allowing the electron carrier concentration to be less than $2\times10^{17}/cm^3$ is that, if an oxide with an electron carrier concentration of $2\times10^{17}/cm^3$ or more is used in the channel layer of the transistor 2020, the on-off ratio cannot be increased sufficiently. If no gate voltage of the transistor 2020 is applied, a large amount of current is flown between the source electrode 2022 and the drain electrode 2023, and a normally-off operation cannot be realized. That is, the inventors of the present invention have found that the transistor 2020 with desired properties can be obtained by producing the transistor 2020 by using, as the active layer of the transistor 2020, the crystalline oxide 2021 with an electron carrier concentration of less than $2\times10^{17}/cm^3$, and can be applied to an image display apparatus 2001.

The electron carrier concentration of the crystalline oxide 2021 according to the present invention is a value measured at room temperature. The room temperature is, for example, 25° C. Specifically, it is a temperature which can be appropriately selected within a range of about 0 to 40° C. The electron carrier concentration of the crystalline oxide 2021 according to the present invention does not necessarily be less than $2\times10^{17}/cm^3$ in the entire temperature range of about 0 to 40° C. For example, it suffices that a carrier electron density of less than about $2\times10^{17}/cm^3$ be realized at 25° C. It is preferred that the electron carrier concentration be further decreased to $10^{17}/cm^3$ or less, more preferably $2\times10^{16}/cm^3$ or less. With this range, a normally-off transistor 2020 can be obtained in a high yield.

The lower limit of the electron carrier concentration of the crystalline oxide 2021 of the present invention is not particularly limited insofar as it can be applied as the channel layer of the TFT. Therefore, in the present invention, by controlling the material, the composition ratio, the production conditions, the post-treatment conditions or the like as in the case of each of Examples 4 to 14, given later, the electron carrier concentration is allowed to be $10^{12}/cm^3$ or more and less than $2\times10^{17}/cm^3$. It is preferred that the electron carrier concentration be $10^{13}/cm^3$ or more and $10^{17}/cm^3$ or less, with $10^{15}/cm^3$ or more and $2\times10^{16}/cm^3$ or less being further preferable. With this range, a normally-off transistor 2020 having a predetermined electron mobility can be obtained in a high yield.

The electron carrier concentration is measured by the Hall effect measurement. It is preferred to perform the AC Hall measurement when measuring the electron carrier concentration of less than about $10^{17}/cm^3$. The reason therefor is that, in the case of the DC Hall measurement, there is a large degree of variation in measurement values, which may cause measurement reliability to be deteriorated.

The active layer of the transistor 2020 (semiconductor thin film) is a thin film containing a crystalline substance (that is, the crystalline oxide 2021). As for the crystalline oxide 2021, at least part or all of the semiconductor thin film is crystalline. As a result, as compared with the case where the semiconductor thin film is amorphous, the carrier concentration can be decreased or controlled easily, and the operation of the transistor 2020 becomes stable. As a result, a transistor 2020 improved in stability, uniformity, reproducibility, heat resistance and durability can be prepared.

The crystalline substance to be contained in the thin film may be either mono-crystalline or polycrystalline (including an epitaxial film). A polycrystalline film which is easily manufactured on the industrial basis and can be increased in area is preferable. A polycrystal is preferable, since a single crystal film may have cracks by bending or impact during the production process or impact. For this reason, it is preferable to use a polycrystal.

In the present invention, the crystalline oxide 2021 means an oxide exhibiting a specific diffraction pattern in the X-ray diffraction spectrum. On the other hand, an amorphous oxide means an oxide which shows a harrow pattern and does not exhibit a specific diffraction pattern.

Furthermore, it is preferred that the energy band gap between the conduction band and the valence band of the semiconductor thin film according to the present invention be about 2.8 eV or more. Due to such a band gap, a disadvantage that electrons of the valence band are excited to allow current leakage to occur frequently by the irradiation with visible rays can be effectively avoided.

It is preferred that the crystalline oxide 2021 contain in (indium) and a positive divalent element. Due to the presence of In and a positive divalent element, the crystalline oxide 2021 normally contains bixbite-type crystals of indium oxide. Due to the bixbite structure, the electron mobility may be increased. The reason therefor is assumed that the 5S orbit of indium has an edge-sharing structure.

Furthermore, it is preferred that indium be solid-solution-substituted by at least part of the positive divalent element such as zinc. The reason therefor is that, since indium, which is a positive trivalent element, is solid-solution-substituted by a positive divalent element, electron carrier concentration can be effectively lowered.

It is further preferred that the crystalline oxide 2021 be a polycrystalline oxide containing In and one or more positive divalent elements selected from Zn, Mg, Cu, Ni, Co and Ca, and that the atomic ratio of the above-mentioned In [In] and the above-mentioned positive divalent element [X][X]/([X]+[In]) be 0.0001 to 0.13. With this range, the electron carrier concentration can be about less than $2\times10^{+17}/cm^3$. That is, the inventors have found that, by preparing a crystal film which is composed mainly of In and containing as a dopant a positive divalent element and by controlling the dopant concentration or post treatment conditions, the electron carrier concentration can be less than about $2\times10^{+17}/cm^3$.

In addition, in the semiconductor thin film of the present invention, the atomic ratio of in [In] and the above-mentioned positive divalent element [X]X/(X+In) is 0.0001 to 0.13. The reasons therefor are as follows. If the atomic ratio [X/(X+In)] is smaller than 0.0001, the number of carriers may not be controlled. Further, when wet etching is performed, the etching rate may be lowered or etching residues may remain. On the other hand, if the atomic ratio [X/(X+In)] exceeds 0.13, the interface or surface may be denatured and may become unstable. Furthermore, the crystallization temperature may be elevated to make crystallization difficult, whereby the electron carrier concentration may be increased, the electron carrier concentration may be changed with time, the electron mobility may be lowered, the heat resistance may be lowered and the chemicals resistance may be lowered. Moreover, when the transistor 2020 is driven, the threshold voltage may vary or driving may become unstable.

Furthermore, it is more preferred that [X]/([X]+[In]) be 0.01 to 0.1, it is further preferred that [X]/([X]+[In]) be 0.05 to 0.099, and it is most preferred that [X]/([X]+[In]) be 0.06 to 0.098.

Preferably, the transistor 2020 has resistance to PAN. Due to the PAN resistance, the freedom of the production process is increased, whereby the transistor 2020 can be manufactured efficiently.

Furthermore, it is preferred that the electron mobility relative to the electron carrier concentration of the crystalline oxide 2021 logarithmically proportionally increase in a predetermined range with an increase in the electron carrier concentration.

In this way, since the electron mobility increases by controlling the production conditions, the on-off ratio is increased, thereby improving the properties of the transistor 2020.

Furthermore, it is preferred that the concentration of Li and Na in the crystalline oxide 2021 be 1000 ppm or less. With this range, the possibility that the properties may change with time when driven for a long period time is lowered, whereby reliability of the transistor 2020 can be improved. The concentration of Li and Na is more preferably 100 ppm or less, more preferably 10 ppm or less, with 1 ppm or less being most preferable.

Then, the results of the measurement of the electron carrier concentration and the electron mobility of the crystalline oxide 2021 are explained with reference to the drawings.
(Measurement Results of the Electron Carrier Concentration and the Electron Mobility of the Thin Film)

A thin film composed of polycrystalline $In_2O_3$—$ZnO$ (crystalline oxide 2021) and a thin film composed of amorphous $In_2O_3$—$ZnO$—$Ga_2O_3$, which were used as the active layer of the transistor 2020, were formed, and the resulting two thin films, the electron mobility relative to the electron carrier concentration was measured.

First, an $In_2O_3$—$ZnO$ sputtering target with an atomic ratio of [Zn/(In+Zn)]=0.0001 to 0.1 was used, and film formation was conducted by the RF magnetron sputtering method at a substrate temperature of about 25° C., whereby an amorphous thin film composed of $In_2O_3$—ZnO was obtained. Thereafter, under vacuum or in the presence of oxygen, a heat treatment was conducted at about 280° C. for about 1 to 10 hours, whereby a plurality of thin films composed of polycrystalline $In_2O_3$—ZnO (a plurality of crystalline oxide 2021) was obtained.

Subsequently, by using $In_2O_3$—ZnO—$Ga_2O_3$ sputtering target with an atomic ratio [In/(In+Zn+Ga)]=0.33, an atomic ratio [Zn/(In+Zn+Ga)]=0.34 and an atomic ratio [Ga/(In+Zn+Ga)]=0.33, film formation was conducted by the RF sputtering method at a partial oxygen pressure of $1\times10^{-3}$ to $5\times10^{-1}$ Pa, whereby a plurality of amorphous thin films composed of $In_2O_3$—ZnO—$Ga_2O_3$ was obtained.

Furthermore, by using an $In_2O_3$—ZnO sputtering target with an atomic ratio [In/(In+Zn)]=0.83 and an atomic ratio [Zn/(In+Zn)]=0.17, film formation was conducted by the RF magnetron sputtering method at a partial oxygen pressure of $1\times10^{-3}$ to $5\times10^{-1}$ Pa, whereby a plurality of amorphous thin films composed of $In_2O_3$—ZnO was obtained.

Subsequently, the electron carrier concentration and the electron mobility of these three films were measured.

Figure 18A:
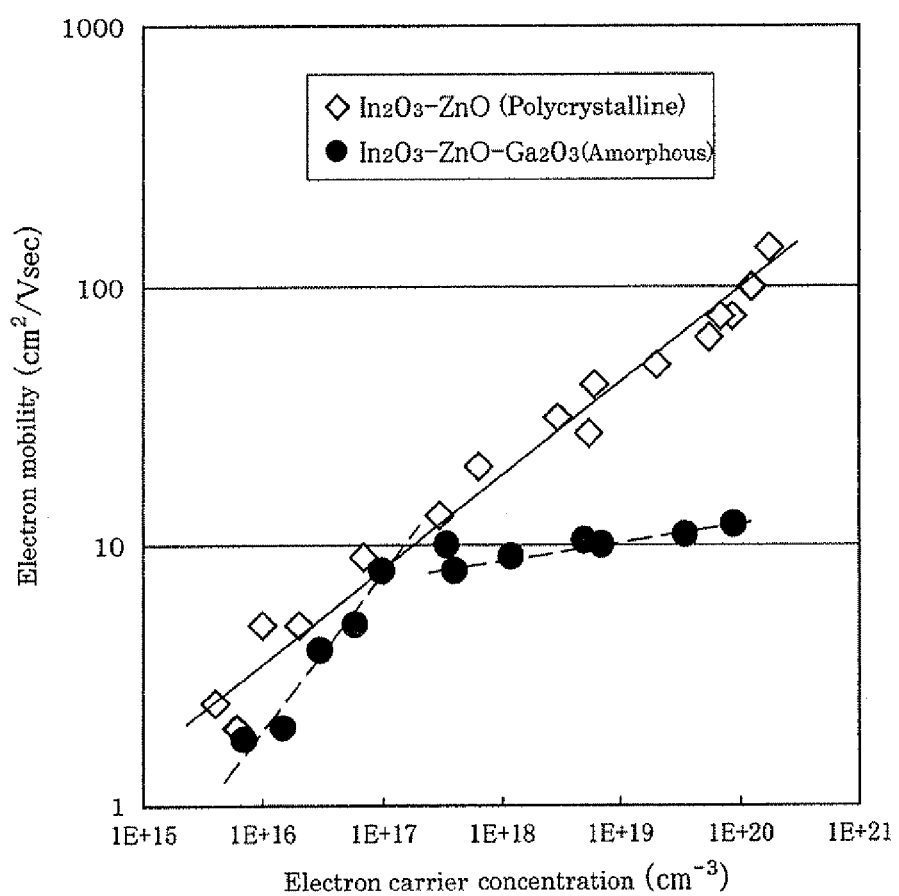
FIG. 18a is a measurement graph of the electron mobility plotted against the electron carrier concentration of a polycrystalline thin film composed of $In_2O_3$—ZnO and an amorphous thin film composed of $In_2O_3$—ZnO—$Ga_2O_3$.

FIG. 18a is a measurement graph of the electron mobility plotted against the electron carrier concentration of a polycrystalline thin film composed of $In_2O_3$—ZnO and an amorphous thin film composed of $In_2O_3$—ZnO—$Ga_2O_3$.

In FIG. 18a, for both two films, by appropriately setting the production conditions, the electron carrier concentration could be controlled to less than $1\times10^{16}$ cm$^{-3}$.

In the case of the thin film composed of polycrystalline $In_2O_3$—ZnO (a plurality of crystalline oxide 2021), the electron mobility logarithmically proportionally increases within an electron carrier concentration range of $1\times10^{16}$ to $1\times10^{20}$/cm$^3$ with an increase in the electron carrier concentration. That is, if the electron carrier concentration (X coordinate) and the electron mobility (Y coordinate) are plotted in the graph of the both logarithms, the plotted points are almost on a straight line rising from the left to the right.

On the other hand, in the case of the thin film composed of amorphous $In_2O_3$—ZnO—$Ga_2O_3$, within an electron carrier concentration range of $1\times10^{16}$ to $1\times10^{17}$/cm$^3$, the electron mobility increases with an increase in electron carrier concentration almost as in the case of a thin film composed of polycrystalline $In_2O_3$—ZnO. However, within an electron carrier concentration range of $1\times10^{17}$ to $1\times10^{20}$/cm$^3$, the electron mobility slightly increases with an increase in electron carrier concentration. However, this increase was so small as compared with the case of a thin film composed of polycrystalline $In_2O_3$—ZnO.

From the above-mentioned measurement results, it was found that, in the case of a polycrystalline film containing In and a positive divalent element represented by a polycrystalline film of $In_2O_3$—ZnO, when formed into a thin film transistor, not only reliability but also a high degree of electron mobility can be expected. In particular, in an electron carrier concentration of $1\times10^{17}$ to $2\times10^{17}$/cm$^3$, the electron mobility of a thin film composed of polycrystalline $In_2O_3$—ZnO was larger than the electron mobility of a thin film composed of amorphous $In_2O_3$—ZnO—$Ga_2O_3$.

Figure 18B:
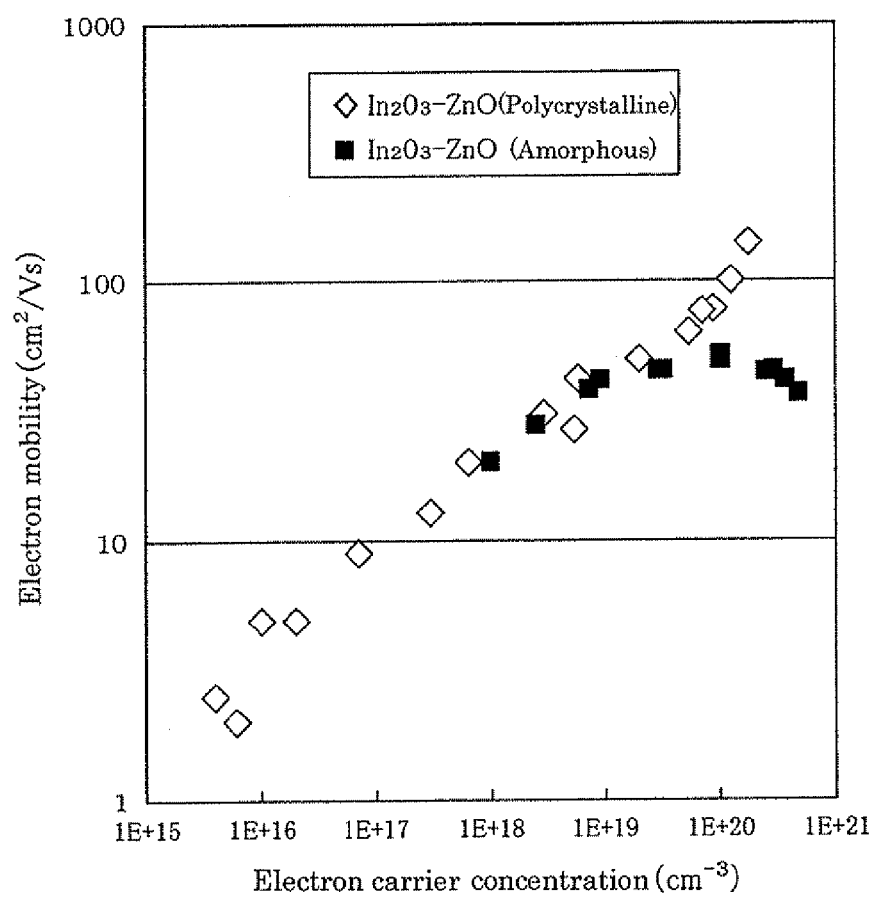
FIG. 18b is a measurement graph of the electron mobility plotted against the electron carrier concentration of a polycrystalline thin film composed of $In_2O_3$—ZnO and an amorphous thin film composed of $In_2O_3$—ZnO.

FIG. 18b is a measurement graph of the electron mobility plotted against the electron carrier concentration of a polycrystalline thin film composed of $In_2O_3$—ZnO and an amorphous thin film composed of $In_2O_3$—ZnO.

In FIG. 18b, in the case of polycrystalline $In_2O_3$—ZnO, the electron carrier concentration could be controlled to less than $1\times10^{16}$ cm$^{-3}$ by appropriately setting the production conditions. However, in the case of amorphous $In_2O_3$—ZnO, the electron carrier concentration could be controlled only to about $1\times10^{18}$ cm$^{-3}$. From this result, it is understood that, when used as a thin film transistor, a polycrystalline $In_2O_3$—ZnO can form a transistor with a small off-current or a normally-off transistor.

In the case of a thin film composed of polycrystalline $In_2O_3$—ZnO (a plurality of crystalline oxides 2021), in an electron carrier concentration range of $1\times10^{16}$ to $1\times10^{20}$/cm$^3$, the electron mobility logarithmically proportionally increases with an increase in the electron carrier concentration. That is, if the electron carrier concentration (X coordinate) and the electron mobility (Y coordinate) are plotted in the graph of the both logarithms, the plotted points are almost on a straight line rising from the left to the right.

On the other hand, in the case of the thin film composed of amorphous $In_2O_3$—ZnO, within an electron carrier concentration range of $1\times10^{18}$ to $1\times10^{19}$/cm$^3$, the electron mobility increases with an increase in electron carrier concentration almost as in the case of a thin film composed of polycrystalline $In_2O_3$—ZnO. However, within an electron carrier concentration range of $1\times10^{19}$ to $1\times10^{20}$/cm$^3$, while the electron mobility slightly increases, the electron mobility shows almost no increase, reaching the uppermost limit. Furthermore, in an electron carrier concentration range of $1\times10^{20}$/cm$^3$ or more, the electron mobility decreases with an increase in electron carrier concentration.

Then, Examples 4 to 14 according to the present invention and Comparative Examples 3 to 8 will be explained with reference to the drawings.

Example 4

FIG. 19 is a table showing the film-forming method, the film-forming conditions, the atomic ratio in the film composition, the oxidization treatment conditions and the properties of the semiconductor thin film in Examples 4 to 14 and Comparative Examples 3 to 8.
[Example of Producing a Crystalline Oxide]
(1) Production and Evaluation of Sputtering Target
1. Production of Target As a raw material, indium oxide with an average particle size of about 3.4 µm and zinc oxide with an average particle size of about 0.6 µm were mixed such that the atomic ratio [(In/In+Zn)] became about 0.95 and the atomic ratio [(Zn/(In+Zn)) became about 0.05. The mixture was then supplied to a wet ball mill and mixed and pulverized for about 72 hours, whereby raw material fine powder was obtained.

After granulating, the raw material fine powder was press-molded to have a diameter of about 10 cm and a thickness of about 5 mm. The molded product was put in a firing furnace, and firing was performed at about 1400° C. for about 48 hours to obtain a sintered body (target). The heating rate was about 3° C./min.
2. Evaluation of Target For the resulting target, the density and the bulk resistance were measured. As a result, it was found that the theoretical relative density was about 99% and the bulk resistance value measured by the four probe method was about 80 mΩ.
(2) Formation of Semiconductor Thin Film The sputtering target obtained in (1) above was installed in the film-forming apparatus of the DC magnetron sputtering method, which is one of the DC sputtering methods. As a result, a semiconductor thin film was formed on a glass substrate (Cornig 1737).

The sputtering conditions are as follows. Substrate temperature: about 25° C., ultimate pressure: about $1\times10^{-3}$ Pa, atmosphere gas: Ar, about 100%, sputtering pressure (total pressure): about 4×10⁻¹ Pa, input power: about 100 W, and film-forming time: about 20 minutes: S-T distance: about 95 mm.

As a result, an oxide was formed on the glass substrate with a film thickness of about 100 nm.

The film composition was analyzed by the ICP method, and it was found that the atomic ratio [In/(In+Zn)] was about 0.95 and the atomic ratio [Zn/(In+Zn)] was about 0.05.

(3) Oxidization Treatment of Semiconductor Thin Film

The oxide obtained in (2) above was heated at about 300° C. for about 1 hour in atmosphere (in the presence of oxygen) (heat treatment in atmosphere) to conduct an oxidization treatment (crystallization treatment).

(4) Evaluation of Semiconductor Thin Film

The electron carrier concentration (electron carrier concentration) and the Hall mobility (electron mobility) of the transparent semiconductor thin film obtained in (3) above was measured by a Hall measurement apparatus. The electron carrier concentration was found to be about $6 \times 10^{14}$ cm$^{-3}$ and the Hall mobility was about 5 cm$^2$/Vs. The specific resistance measured by the four probe method was about 2100 Ωcm. The composition of the thin film was analyzed and it was found that the concentration of Li and Na was 1 ppm or less.

The Hall measurement apparatus and the Hall measurement conditions are as follows.

[Hall Measurement Apparatus]

Resi Test 8310: manufactured by Toyo Corporation

[Measurement Conditions]

Room temperature (about 25° C.), about 0.5 [T], about $10^{-4}$ to $10^{-12}$ A, AC magnetic field Hall measurement In addition, as a result of measurement by means of a spectrophotometer, it was found that this semiconductor thin film had a transmittance for light with a wavelength of about 400 nm of about 85%, which means this thin film was excellent in transparency. In addition, the energy band gap was about 3.6 eV, which was sufficiently large.

As a result of an X-ray-crystallography, it was found that the thin film was polycrystalline. An XFAS measurement revealed that In and Zn had a similar local structure. That is, at least part of zinc Zn substitutes the indium site of a bixbite type crystal of indium oxide.

For these Examples and Comparative Examples, evaluation was made on PAN resistance and heat resistance, and the results of these measurement are shown in the table together with the transmittance and the reflectance (wavelength: about 500 nm) of the semiconductor thin film.

[PAN Resistance]

Films which exhibited a PAN etching rate of about 10 nm/min or more was indicated as poor (x) and other films were indicated as good (○) in the table.

Here, the evaluation of PAN resistance was conducted by using a PAN etching solution of about 45° C. (phosphoric acid: about 91.4 wt %, nitric acid: about 3.3 wt % and acetic acid: about 10.4 wt %). Meanwhile, as a PAN etching solution, one containing about 20 to 95 wt % of phosphoric acid, about 0.5 to 5 wt % of nitric acid and about 3 to 50 wt % of acetic acid is normally used.

[Heat Resistance]

Films of which the specific resistance was decreased by about 1/10 or less by a heat treatment at about 260° C. for about one hour are indicated as poor (x) and other films are indicated as good (○) in the table.

As for the remaining evaluation of the semiconductor thin films, the PAN resistance was good, the heat resistance was good, the semiconductor film reflective index (wavelength: about 500 nm) was about 1.9.

That is, the above-mentioned polycrystalline oxide in Example 4 had excellent properties as a transparent semiconductor thin film.

Example 5

In Example 5, an oxide was prepared in substantially the same manner as in Example 4 (the film-forming method, the film-forming conditions, the atomic ratio in the film composition, the oxidization treatment), the RF magnetron sputtering method was used and the oxidization treatment was conducted at about 250° C. Other than this difference, the production conditions were almost the same as those in Example 4.

As for the properties of the oxide which was prepared in the above-mentioned conditions, as shown in FIG. 19, the oxide was polycrystalline, had an electron carrier concentration of about $8 \times 10^{14}$ cm$^{-3}$ and a Hall mobility of about 5 cm$^2$/Vs. The specific resistance value measured by the four probe method was about 1570 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 5 had excellent properties as a semiconductor thin film.

Example 6

In Example 6, an oxide was prepared in substantially the same manner as in Example 4 (the film-forming method, the film-forming conditions, the atomic ratio in the film composition, the oxidization treatment), except that the RF magnetron sputtering method was used and the oxidization treatment was conducted at about 230° C. Other than these differences, the production conditions were almost the same as those in Example 4.

As for the properties of the oxide which was prepared in the above-mentioned conditions, as shown in FIG. 19, the oxide was polycrystalline, had an electron carrier concentration of about $4 \times 10^{15}$ cm$^{-3}$ and a Hall mobility of about 6 cm$^2$/Vs. The specific resistance value measured by the four probe method was about 260 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 6 had excellent properties as a transparent semiconductor thin film, and hence, could be preferably used as an active layer of a transistor.

Example 7

In Example 7, an oxide was prepared in substantially the same manner as in Example 4 (the film-forming method, the film-forming conditions, the atomic ratio in the film composition, the oxidization treatment), except that the atomic ratio [In/(In+Zn)] was about 0.97 and the atomic ratio [Zn/(In+Zn)] was about 0.03. Other than these differences, the production conditions were almost the same as those in Example 4.

As for the properties of the oxide which was prepared in the above-mentioned conditions, as shown in FIG. 19, the oxide was polycrystalline, had an electron carrier concentration of about $6 \times 10^{14}$ cm$^{-3}$ and a Hall mobility of about 10 cm$^2$/Vs.

The specific resistance value measured by the four probe method was about 40 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 7 had excellent properties as a transparent semiconductor thin film.

Example 8

In Example 8, an oxide was prepared in substantially the same manner as in Example 4 (the film-forming method, the film-forming conditions, the atomic ratio in the film composition, the oxidization treatment), except that the atomic ratio [In/(In+Zn)] was about 0.93 and the atomic ratio [Zn/(In+Zn)] was about 0.07. Other than these differences, the production conditions were almost the same as those in Example 4.

As for the properties of the oxide which was prepared in the above-mentioned conditions, as shown in FIG. 19, the oxide was polycrystalline, had an electron carrier concentration of about $1.1 \times 10^{14}$ cm$^{-3}$ and a Hall mobility of about 3 cm$^2$/Vs. The specific resistance value measured by the four probe method was about 19000 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 8 had excellent properties as a transparent semiconductor thin film.

Example 9

In Example 9, an oxide was prepared in substantially the same manner as in Example 4 (the film-forming method, the film-forming conditions, the atomic ratio in the film composition, the oxidization treatment), except that the RF magnetron sputtering method was used and the atomic ratio [In/(In+Mg)] was about 0.98, the atomic ratio [Mg/(In+Mg)] was about 0.02, and the oxidization treatment was conducted at about 280° C. for about 2 hours. Other than these differences, the production conditions were almost the same as those in Example 4.

As for the properties of the oxide which was prepared in the above-mentioned conditions, as shown in FIG. 19, the oxide was polycrystalline, had a carrier concentration of about $5 \times 10^{16}$ cm$^{-3}$ and a Hall mobility of about 7 cm$^2$/Vs. The specific resistance value measured by the four probe method was about 15 Ωcm. In addition, the energy band gap was about 3.7 eV, the PAN resistance was good, the heat resistance was good, the light transmittance was about 89% and the refractive index of the thin film (wavelength: about 500 nm) was about 1.9.

That is, the above-mentioned polycrystalline oxide prepared in Example 9 had excellent properties as a transparent semiconductor thin film.

Example 10

In Example 10, an oxide was prepared in substantially the same manner as in Example 9 (the film-forming method, the film-forming conditions, the atomic ratio in the film composition, the oxidization treatment), except that the atomic ratio [In/(In+Cu)] was about 0.99 and the atomic ratio [Cu/(In+Cu)] was about 0.01. Other than these differences, the production conditions were almost the same as those in Example 9.

As for the properties of the oxide which was prepared in the above-mentioned conditions, as shown in FIG. 19, the oxide was polycrystalline, had an electron carrier concentration of about $2 \times 10^{15}$ cm$^{-3}$ and a Hall mobility of about 7 cm$^2$/Vs. The specific resistance value measured by the four probe method was about 450 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 10 had excellent properties as a transparent semiconductor thin film.

Example 11

In Example 11, an oxide was prepared in substantially the same manner as in Example 10 (the film-forming method, the film-forming conditions, the atomic ratio in the film composition, the oxidization treatment), except that the atomic ratio [In/(In+Cu)] was about 0.98 and the atomic ratio [Cu/(In+Cu)] was about 0.02. Other than these differences, the production conditions were almost the same as those in Example 10.

As for the properties of the oxide which was prepared in the above-mentioned conditions, as shown in FIG. 19, the oxide was amorphous, had an electron carrier concentration of about $2 \times 10^{14}$ cm$^{-3}$ and a Hall mobility of about 4 cm$^2$/Vs. The specific resistance value measured by the four probe method was about 7800 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned amorphous oxide prepared in Example 11 had excellent properties as a transparent semiconductor thin film.

Example 12

In Example 12, an oxide was prepared in substantially the same manner as in Example 11 (the film-forming method, the film-forming conditions, the atomic ratio in the film composition, the oxidization treatment), except that the atomic ratio [In/(In+Ni)] was about 0.98 and the atomic ratio [Ni/(In+Ni)] was about 0.02. Other than these differences, the production conditions were almost the same as those in Example 11.

As for the properties of the oxide which was prepared in the above-mentioned conditions, as shown in FIG. 19, the oxide was amorphous, had an electron carrier concentration of about $1 \times 10^{16}$ cm$^3$ and a Hall mobility of about 8 cm$^2$/Vs. The specific resistance value measured by the four probe method was about 20 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 12 had excellent properties as a transparent semiconductor thin film.

Example 13

In Example 13, an oxide was prepared in substantially the same manner as in Example 11 (the film-forming method, the film-forming conditions, the atomic ratio in the film composition, the oxidization treatment), except that the atomic ratio [In/(In+Co)] was about 0.98 and the atomic ratio [Co/(In+Co)] was about 0.02. Other than these differences, the production conditions were almost the same as those in Example 11.

As for the properties of the oxide which was prepared in the above-mentioned conditions, as shown in FIG. 19, the oxide was polycrystalline, had an electron carrier concentration of about $2\times10^{16}$ cm$^{-3}$ and a Hall mobility of about 8 cm$^2$/Vs. The specific resistance value measured by the four probe method was about 40 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 13 had excellent properties as a transparent semiconductor thin film.

Example 14

In Example 14, an oxide was prepared in substantially the same manner as in Example 11 (the film-forming method, the film-forming conditions, the atomic ratio in the film composition, the oxidization treatment), except that the atomic ratio [In/(In+Zn)] was about 0.98 and the atomic ratio [Zn/(In+Zn)] was about 0.02. Other than these differences, the production conditions were almost the same as those in Example 11.

As for the properties of the oxide which was prepared in the above-mentioned conditions, as shown in FIG. 19, the oxide was polycrystalline, had an electron carrier concentration of about $6\times10^{16}$ cm$^{-3}$ and a Hall mobility of about 12 cm$^2$/Vs. The specific resistance value measured by the four probe method was about 10 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 14 had excellent properties as a transparent semiconductor thin film.

Comparative Example 3

In Comparative Example 3, an oxide was prepared in substantially the same manner as in Example 4 (the film-forming method, the film-forming conditions, the atomic ratio in the film composition, the oxidization treatment), except that the atomic ratio [In/(In+Zn)] was about 1.00 and the atomic ratio [Zn/(In+Zn)] was about 0.00. Other than these differences, the production conditions were almost the same as those in Example 4.

As for the properties of the oxide which was prepared in the above-mentioned conditions, as shown in FIG. 19, the oxide was polycrystalline, had an electron carrier concentration of about $1\times10^{18}$ cm$^{-3}$ and a Hall mobility of about 28 cm$^2$/Vs. The specific resistance value measured by the four probe method was about 0.22 Ωcm. In addition, the energy band gap was about 4.1 eV, the PAN resistance was good, the heat resistance was good, the light transmittance was about 84% and the refractive index of the thin film (wavelength: about 500 nm) was about 1.9.

That is, the above-mentioned polycrystalline oxide prepared in Comparative Example 3 had an electron carrier concentration value larger than $2\times10^{17}$ cm$^{-3}$.

Comparative Example 4

In Comparative Example 4, an oxide was prepared in substantially the same manner as in Example 4 (the film-forming method, the film-forming conditions, the atomic ratio in the film composition, the oxidization treatment), except that the atomic ratio [In/(In+Zn)] was about 0.00 and the atomic ratio [Zn/(In+Zn)] was about 1.00. Other than these differences, the production conditions were almost the same as those in Example 4.

As for the properties of the oxide which was prepared in the above-mentioned conditions, as shown in FIG. 19, the oxide was polycrystalline, had an electron carrier concentration of about $6\times10^{17}$ cm$^{-3}$ and a Hall mobility of about 1 cm$^2$/Vs. The specific resistance value measured by the four probe method was about 10 Ωcm. In addition, the energy band gap was about 3.3 eV, the PAN resistance was poor, the heat resistance was good, the light transmittance was about 83% and the refractive index of the thin film (wavelength: about 500 nm) was about 2.2.

That is, the above-mentioned polycrystalline oxide prepared in Comparative Example 4 had an electron carrier concentration value larger than $2\times10^{17}$ cm$^{-3}$, and PAN resistance was poor.

Comparative Example 5

In Comparative Example 5, an oxide was prepared in substantially the same manner as in Example 5 (the film-forming method, the film-forming conditions, the atomic ratio in the film composition, the oxidization treatment), except that no crystallization treatment by heating was conducted. Other than this, difference, the production conditions were almost the same as those in Example 5.

As for the properties of the oxide which was prepared in the above-mentioned conditions, as shown in FIG. 19, the oxide was amorphous, had an electron carrier concentration of about $3\times10^{20}$ cm$^{-3}$ and a Hall mobility of about 35 cm$^2$/Vs. The specific resistance value measured by the four probe method was about 0.0006 Ωcm. In addition, the energy band gap was about 4.2 eV, the PAN resistance was poor, the heat resistance was good, the light transmittance was about 82% and the refractive index of the thin film (wavelength: about 500 nm) was about 2.1.

That is, the above-mentioned amorphous oxide prepared in Comparative Example 5 had an electron carrier concentration value larger than $2\times10^{17}$ cm$^{-3}$, and PAN resistance was poor.

Comparative Example 6

In Comparative Example 6, an oxide was prepared in substantially the same manner as in Comparative Example 5 (the film-forming method, the film-forming conditions, the atomic ratio in the film composition, the oxidization treatment), except that the composition of the atmospheric gas at the time of sputtering was changed to about 92% of Ar and about 8% of H$_2$. Other than this difference, the production conditions were almost the same as those in Comparative Example 5.

As for the properties of the oxide which was prepared in the above-mentioned conditions, as shown in FIG. 19, the oxide was amorphous, had an electron carrier concentration of about $7\times10^{20}$ cm$^{-3}$ and a Hall mobility of about 17 cm$^2$/Vs. The specific resistance value measured by the four probe method was about 0.00053 Ωcm. In addition, the energy band gap was about 4.2 eV, the PAN resistance was poor, the heat resistance was good, the light transmittance was about 82% and the refractive index of the thin film (wavelength: about 500 nm) was about 2.1.

That is, the above-mentioned amorphous oxide prepared in Comparative Example 6 had an electron carrier concentration value larger than $2\times10^{17}$ cm$^{-3}$, and PAN resistance was poor.

Comparative Example 7

In Comparative Example 7, an oxide was prepared in substantially the same manner as in Comparative Example 6 (the film-forming method, the film-forming conditions, the atomic ratio in the film composition, the oxidization treatment), except that the RF magnetron sputtering method was used, the composition of the atmospheric gas at the time of sputtering was changed to about 96% of Ar and about 4% of O$_2$, the partial pressure of oxygen was about $16\times10^{-3}$ Pa, the atomic ratio [In/(In+Zn)] was about 0.55, the atomic ratio [Zn/(In+Zn)] was about 0.45 and the atomic ratio [Ga/(In+Zn+Ga)] was about 0.35. Other than these differences, the production conditions were almost the same as those in Comparative Example 6.

As for the properties of the oxide which was produced in the above-mentioned conditions, as shown in FIG. 19, the oxide was amorphous, had an electron carrier concentration of about $1.1\times10^{16}$ cm$^{-3}$ and a Hall mobility of about 3 cm$^2$/Vs. The specific resistance value measured by the four probe method was about 190 Ωcm. In addition, the energy band gap was about 3.7 eV, the PAN resistance was poor, the heat resistance was poor, the light transmittance was about 83% and the refractive index of the thin film (wavelength: about 500 nm) was about 2.1.

That is, the above-mentioned amorphous oxide prepared in Comparative Example 7 had poor PAN resistance and poor heat resistance.

Comparative Example 8

In Comparative Example 8, an oxide was prepared in substantially the same manner as in Comparative Example 7 (the film-forming method, the film-forming conditions, the atomic ratio in the film composition, the oxidization treatment), except that the composition of the atmospheric gas at the time of sputtering was changed to about 95% of Ar and about 5% of O$_2$, and the partial pressure of oxygen was about $20\times10^{-3}$ Pa. Other than these differences, the production conditions were almost the same as those in Comparative Example 7.

As for the properties of the oxide which was produced in the above-mentioned conditions, as shown in FIG. 19, the oxide was amorphous, had an electron carrier concentration of about $9\times10^{15}$ cm$^{-3}$ and a Hall mobility of about 2 cm$^2$/Vs. The specific resistance value measured by the four probe method was about 350 Ωcm. In addition, the energy band gap was about 3.8 eV, the PAN resistance was poor, the heat resistance was poor, the light transmittance was about 83% and the refractive index of the thin film (wavelength: about 500 nm) was about 2.1.

That is, the above-mentioned amorphous oxide prepared in Comparative Example 8 had poor PAN resistance and poor heat resistance.

Next, thin film transistors (TFT) were prepared by using the semiconductor thin film (oxide) shown in the table, and evaluated. As a result, TFTs prepared by using the oxides in Examples 4 to 14 and Comparative Examples 4, 7 and 8 were confirmed to have transistor properties. However, no transistor properties were confirmed in TFTs prepared by using the oxides in Comparative Examples 3, 5 and 6. As for a TFT prepared by using the oxide of Comparative Example 4, although transistor properties could be confirmed, unclear pinch off was observed in output properties. That is, it was revealed that TFTs prepared by using the oxides in Comparative Examples 3, 4, 5 and 6 could not exhibit sufficient transistor properties due to a large electron carrier concentration.

Next, of the TFTs prepared above, representative TFTs will be explained below.

[Preparation Example 1 of TFT: Top-Gate Type Transparent Thin Film Transistor/Insulating Substrate]

Figure 20:
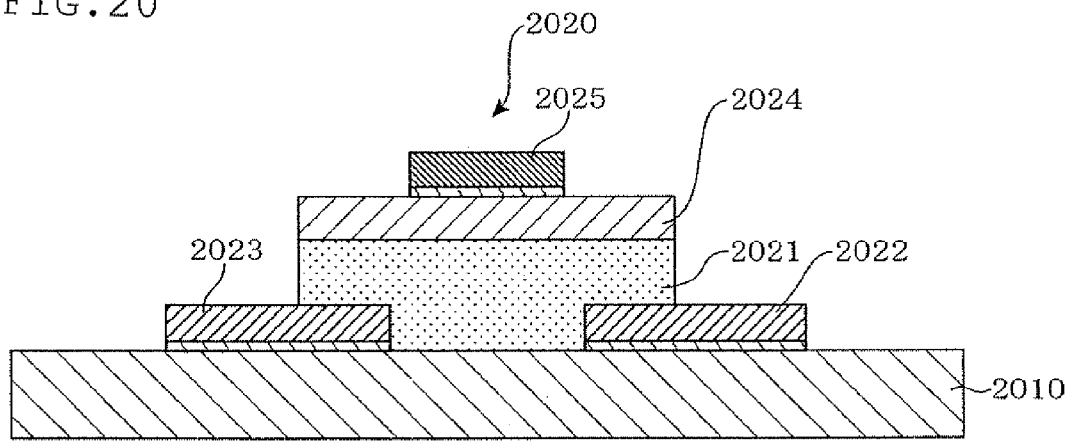
FIG. 20 is a schematic cross-sectional view of essential parts of a top-gate type TFT formed on an insulating substrate.

FIG. 20 is a schematic cross-sectional view of essential parts of a top-gate type TFT formed on an insulating substrate.

In FIG. 20, a transistor 2020 of this preparation example 1 is a top-gate type transistor, in which a source electrode 2022, a drain electrode 2023 and a crystalline oxide 2021 were formed on a glass substrate 2010 such that the channel length and the channel width about 10 μm and about 150 μm, respectively. As this crystalline oxide 2021, a transparent semiconductor film with a thickness of about 30 nm prepared in the same manner as in Example 4 was used. As a gate-insulating film 2024, yttrium oxide with a high dielectric constant was stacked to have a thickness of 170 nm. Furthermore, as a source electrode 2022, a drain electrode 2023 and a gate electrode 2025, a Ti layer with a thickness of about 5 nm and an Au layer with a thickness of about 40 nm were used.

As a result, the transistor 2020 of this Preparation Example 1 showed a field-effect mobility of 35 cm$^2$/Vs, an on-off ratio of $10^8$ or more and a threshold voltage (Vth) of +2.0 V (normally-off). The output properties showed a clear pinch-off.

[Preparation Example 2 of TFT: Bottom-Gate Type Transparent Thin Film Transistor/Insulating Substrate]

Figure 21:
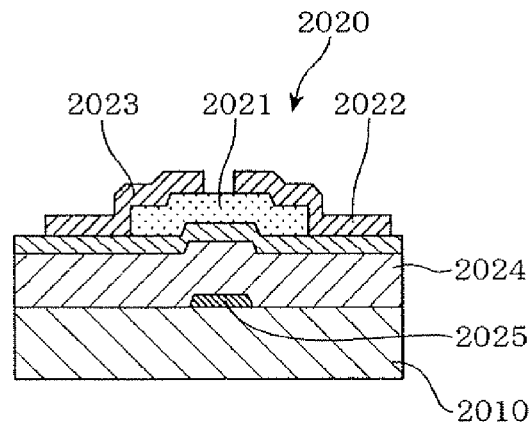
FIG. 21 is a schematic cross-sectional view of essential parts of a bottom-gate type TFT formed on an insulating substrate.

FIG. 21 is a schematic cross-sectional view of essential parts of a bottom-gate type TFT formed on an insulating substrate.

In FIG. 21, a transistor 2020 of this preparation example 2 is a bottom-gate type transistor, in which a gate electrode 2025 and a gate-insulating film 2024 were formed on a glass substrate 2010, followed by formation of the crystalline oxide 2021. As this crystalline oxide 2021, a transparent semiconductor film with a thickness of about 100 nm prepared in the same manner as in Example 4 was used. The source electrode 2022 and the drain electrode 2023 were formed such that the channel length and the channel width about 5 μm and about 25 μm, respectively. As the gate-insulating film 2024, an SiNx layer with a thickness of about 340 nm and a CaHfOx layer with a thickness of about 30 nm were used. Furthermore, as the source electrode 2022 and the drain electrode 2023, an Al layer with a thickness of about 70 nm was used, and as the gate electrode 2025, a Ta layer with a thickness of about 320 nm was used.

As a result, the transistor 2020 of this Preparation Example 2 showed a field-effect mobility of 70 cm$^2$/Vs, an on-off ratio of $10^7$ or more and a threshold voltage (Vth) of +0.5 V (normally-off). The output properties showed a clear pinch-off.

[Preparation Example 3 of TFT: Bottom-Gate Type Transparent Thin Film Transistor/Conductive Substrate]

Figure 22:
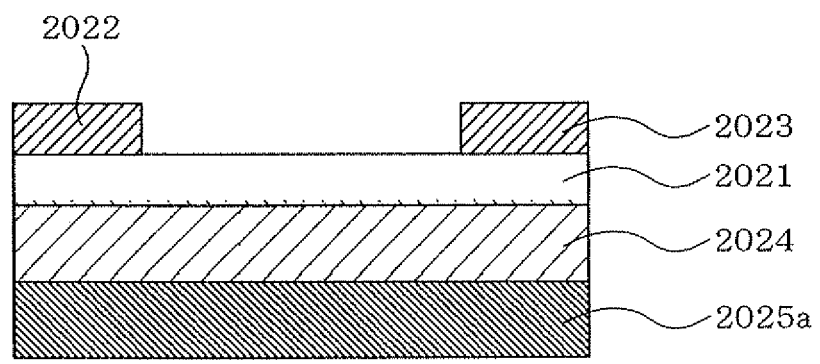
FIG. 22 is a schematic cross-sectional view of essential parts of a bottom-gate type TFT formed on a conductive substrate, in which a source electrode and a drain electrode are formed on a semiconductor film.

FIG. 22 is a schematic cross-sectional view of essential parts of a bottom-gate type TFT formed on a conductive substrate, in which a source electrode and a drain electrode are formed on a semiconductor film.

With a configuration shown in FIG. 22, on a conductive silicon substrate 2025*a*, a bottom-gate type thin film transistor with a channel length of about 100 μm and a channel width of about 1500 μm was formed.

As the semiconductor thin film (crystalline oxide 2021), a transparent semiconductor film with a thickness of about 50 nm, which had been prepared under the same conditions as in Example 7, was used. As the gate-insulating film 2024, an $SiO_2$ thermal oxide film with a thickness of about 300 nm was used, and as the source electrode 2022 and the drain electrode 2023, an Au layer with a thickness of about 50 nm was used.

As a result, the transistor of this Preparation Example 3 showed a field-effect mobility of 19 $cm^2/Vs$, an on-off ratio of $10^6$ or more and normally-off properties. The output properties showed a clear pinch-off.

[Preparation Example 4 of TFT: Bottom-Gate Type Transparent Thin Film Transistor/Conductive Substrate]

With a configuration shown in FIG. 22, on a conductive silicon substrate 2025a, a bottom-gate type thin film transistor with a channel length of about 100 μm and a channel width of about 1500 μm was formed.

As the semiconductor thin film (crystalline oxide 2021), a transparent semiconductor film with a thickness of about 50 nm, which had been prepared under the same conditions as in Example 14, was used. As the gate-insulating film 2024, an $SiO_2$ thermal oxide film with a thickness of about 300 nm was used, and as the source electrode 2022 and the drain electrode 2023, an Au layer with a thickness of about 50 nm was used.

As a result, the transistor of this Preparation Example 4 showed a field-effect mobility of 24 $cm^2/Vs$, an on-off ratio of $10^5$ or more and normally-off properties. The output properties showed a clear pinch-off.

[Preparation Example 5 of TFT: Bottom-Gate Type Transparent Thin Film Transistor/Conductive Substrate]

Figure 23:
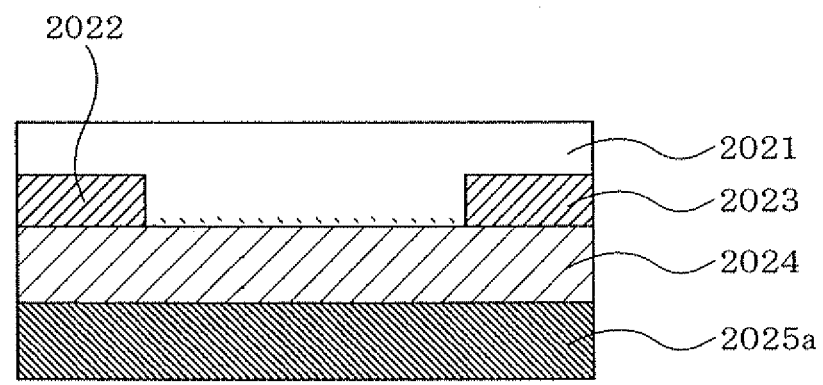
FIG. 23 is a schematic cross-sectional view of essential parts of a bottom-gate type TFT formed on a conductive substrate, in which a semiconductor film is formed on a source electrode and a drain electrode.

FIG. 23 is a schematic cross-sectional view of essential parts of a bottom-gate type TFT formed on a conductive substrate, in which a semiconductor film is formed on a source electrode and a drain electrode.

With a configuration shown in FIG. 23, on a conductive silicon substrate 2025a, a bottom-gate type thin film transistor with a channel length of about 100 μm and a channel width of about 2000 μm was formed.

As the semiconductor thin film (crystalline oxide 2021), a transparent semiconductor film with a thickness of about 50 nm, which had been prepared under the same conditions as in Example 7, was used. As the gate-insulating film 2024, an $SiO_2$ thermal oxide film with a thickness of about 300 nm was used, and as the source electrode 2022 and the drain electrode 2023, an Au layer with a thickness of about 50 nm was used.

As a result, the transistor of this Preparation Example 5 showed a field-effect mobility of 10 $cm^2/Vs$, an on-off ratio of $10^5$ or more and normally-off properties. The output properties showed a clear pinch-off.

[Preparation Example 6 of TFT: Bottom-Gate Type Transparent Thin Film Transistor/Conductive Substrate]

With a configuration shown in FIG. 23, on a conductive silicon substrate 2025a, a bottom-gate type thin film transistor with a channel length of about 100 μm and a channel width of about 2000 μm was formed.

As the semiconductor thin film (crystalline oxide 2021), a transparent semiconductor film with a thickness of about 20 nm, which had been prepared under the same conditions as in Example 9, was used. As the gate-insulating film 2024, an $SiO_2$ thermal oxide film with a thickness of 300 nm was used, and as the source electrode 2022 and the drain electrode 2023, Au with a thickness of about 50 nm was used.

As a result, the transistor of this Preparation Example 6 showed a field-effect mobility of 11 $cm^2/Vs$, an on-off ratio of $10^4$ or more and normally-off properties. The output properties showed a clear pinch-off.

[Preparation Example 7 of TFT: Bottom-Gate Type Transparent Thin Film Transistor/Conductive Substrate]

With a configuration shown in FIG. 23, on a conductive silicon substrate 2025a, a bottom-gate type thin film transistor with a channel length of about 100 μm and a channel width of about 2000 μm was formed.

As the semiconductor thin film (crystalline oxide 2021), a transparent semiconductor film with a thickness of about 20 nm, which had been prepared under the same conditions as in Example 10, was used. As the gate-insulating film 2024, an $SiO_2$ thermal oxide film with a thickness of 300 nm was used, and as the source electrode 2022 and the drain electrode 2023, Au with a thickness of about 50 nm was used.

As a result, the transistor of this Preparation Example 7 showed a field-effect mobility of 11 $cm^2/Vs$, an on-off ratio of $10^6$ or more and normally-off properties. The output properties showed a clear pinch-off.

[Comparative Example (1) of TFT: Top-Gate Type Transparent Thin Film Transistor/Insulating Substrate]

With a configuration shown in FIG. 20, on a glass substrate 2010, a top-gate type thin film transistor 2020 with a channel length of about 10 μm and a channel width of about 150 μm was formed by using a transparent semiconductor thin film (crystalline oxide 2021) prepared under the same conditions as in Comparative Example 4.

As the gate-insulating film 2024, yttrium oxide with a high dielectric constant was stacked to have a thickness of about 170 nm. Furthermore, as the source electrode 2022, the drain electrode 2023 and the gate electrode 2025, a Ti layer with a thickness of about 5 nm and an Au layer with a thickness of about 40 nm were used.

As a result, the transistor of this Comparative Example (1) of TFT showed a field-effect mobility of 0.5 $cm^2/Vs$, an on-off ratio of $10^3$ and a threshold voltage (Vth) of −0.5 V (normally-on). The output properties showed an unclear pinch-off.

[Comparative Example (2) of TFT: Bottom-Gate Type Transparent Thin Film Transistor/Insulating Substrate]

With a configuration shown in FIG. 21, on a glass substrate 2010, a bottom-gate type thin film transistor 2020 with a channel length of about 5 μm and a channel width of about 25 μm was formed. As the channel layer, a transparent semiconductor thin film (crystalline oxide 2021) with a thickness of about 100 nm, which had been prepared under the same conditions as in Comparative Example 4 was used. As the gate-insulating film 2024, a CaHfOx film with a thickness of about 30 nm and an SiNx film with a thickness of about 340 nm were used. Furthermore, as the source electrode 2022 and the drain electrode 2023, an Al layer with a thickness of about 70 nm was used, and as the gate electrode 2025, a Ta layer with a thickness of about 320 nm were used.

As a result, the transistor of this Comparative Example (2) of TFT showed a field-effect mobility of 0.3 $cm^2/Vs$, an on-off ratio of $10^2$ or more and a threshold voltage (Vth) of −1.5 V (normally-on). The output properties showed an unclear pinch-off.

[Comparative Example (3) of TFT: Bottom-Gate Type Transparent Thin Film Transistor/Conductive Substrate]

With a configuration shown in FIG. 22, on a conductive silicon substrate 2025a, a bottom-gate type thin film transistor with a channel length of about 100 μm and a channel width of about 1500 μm was formed.

As the semiconductor thin film (crystalline oxide 2021), a transparent semiconductor thin film with a thickness of about 50 nm, which had been prepared under the same conditions as in Comparative Example 3 was used. As the gate-insulating film 2024, a $SiO_2$ thermal oxide film with a thickness of about 300 nm was used, and as the source electrode 2022 and the drain electrode 2023, an Au layer with a thickness of about 50 nm was used.

As a result, the transistor of this Comparative Example (3) of TFT became normally-on, and no transistor properties could be confirmed by changing the gate voltage.

[Comparative Example (4) of TFT: Bottom-Gate Type Transparent Thin Film Transistor/Conductive Substrate]

With a configuration shown in FIG. 23, on a conductive silicon substrate 2025a, a bottom-gate type thin film transistor with a channel length of about 100 μm and a channel width of about 2000 μm was formed.

As the semiconductor thin film (crystalline oxide 2021), a transparent semiconductor thin film with a thickness of about 50 nm, which had been prepared under the same conditions as in Comparative Example 3 was used. As the gate-insulating film 2024, a SiO$_2$ thermal oxide film with a thickness of about 300 nm was used, and as the source electrode 2022 and the drain electrode 2023, an Au layer with a thickness of about 50 nm was used.

As a result, the transistor of this Comparative Example (4) of TFT became normally-on, and no transistor properties could be confirmed by changing the gate voltage.

[Comparative Example (5) of TFT: Bottom-Gate Type Transparent Thin Film Transistor/Conductive Substrate]

With a configuration shown in FIG. 22, on a conductive silicon substrate 2025a, a bottom-gate type thin film transistor with a channel length of about 100 μm and a channel width of about 1500 μm was formed.

As the semiconductor thin film (amorphous oxide 2021), a transparent semiconductor thin film with a thickness of about 50 nm, which had been prepared under the same conditions as in Comparative Example 8 was used. As the gate-insulating film 2024, a SiO$_2$ thermal oxide film with a thickness of about 300 nm was used, and as the source electrode 2022 and the drain electrode 2023, an Au layer with a thickness of about 50 nm was used.

As a result, the transistor this Comparative Example (5) of TFT showed properties of a field-effect mobility of 8 cm$^2$/Vs, an on-off ratio of 10$^4$ or more and normally-off properties. The output properties showed a clear pinch-off.

As mentioned above, according to this embodiment, by using a crystalline oxide in the active layer of the field-effect type thin film transistor and by allowing the electron carrier concentration of this crystalline oxide of less than about 2×10$^{17}$/cm$^3$, it is possible to provide a novel image display apparatus improved in image quality, durability or the like.

In addition, by using, as the crystalline oxide, a polycrystalline oxide containing In and one or more positive divalent element selected from Zn, Mg, Cu, Ni, Co and Ca, and by allowing an atomic ratio of In [In] and the positive divalent element [X][X]/([X]+[In]) to be 0.0001 to 0.13, the electron carrier concentration can be less than about 2×10$^{17}$/cm$^3$.

[First Embodiment of the Semiconductor Device]

Figure 24:
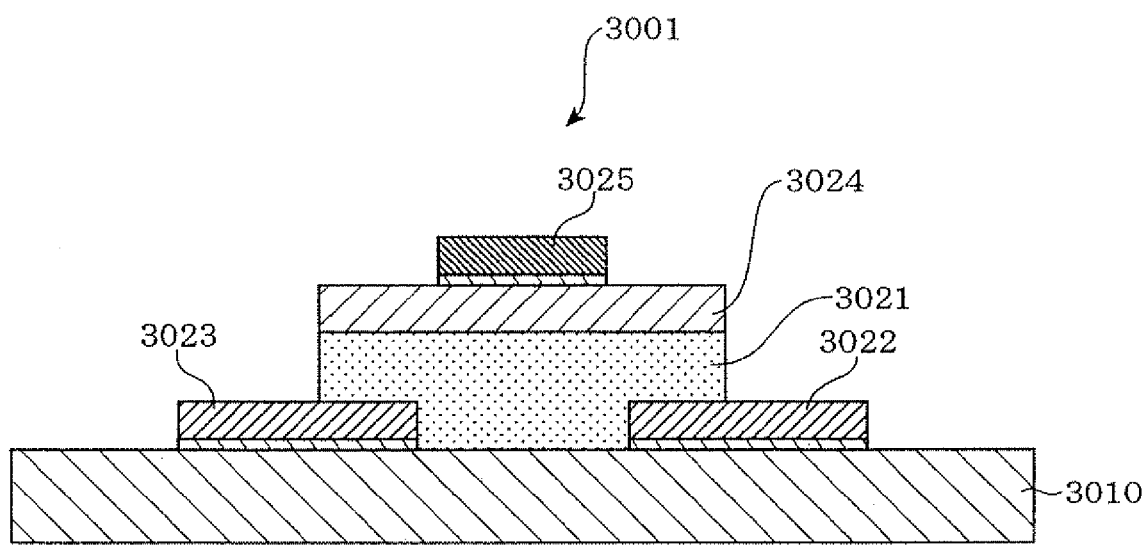
FIG. 24 is a schematic cross-sectional view of essential parts of a field-effect type thin film transistor which is a semiconductor device according to a first embodiment of the present invention.

FIG. 24 is a schematic cross-sectional view of essential parts of a field-effect type thin film transistor which is a semiconductor device according to the first embodiment of the present invention.

In FIG. 24, a field-effect type thin film transistor 3001 (hereinafter, appropriately abbreviated as TFT 3001) is provided with a source electrode 3022 and a drain electrode 3023 which are formed on a glass substrate 3010 such that they are separated from each other, a crystalline oxide 3021 as the active layer which is formed such that it covers part of the source electrode 3022 and the drain electrode 3023, a gate-insulating film 3024 formed on the crystalline oxide 3021 and a gate electrode 3025 formed on the gate-insulating film 3024.

Meanwhile, the TFT 3001 is not limited to the top-gate type TFT with the above-mentioned configuration. For example, the TFT 3001 may have various configurations including a bottom-gate type TFT. In addition, a base on which the TFT 3001 is formed is not limited to the glass substrate 3010, and it may be a flexible resin film.

In the TFT 3001, the crystalline oxide 3021 is used as an N-type semiconductor (a channel layer in this embodiment). In addition, the electron carrier concentration of the crystalline oxide 3021 is less than 2×10$^{17}$/cm$^3$. The reason that the electron carrier concentration is allowed to be less than 2×10$^{17}$/cm$^3$ is that, if an oxide with an electron carrier concentration of 2×10$^{17}$/cm$^3$ or more is used as the channel layer of the TFT 3001, the on-off ratio cannot be increased sufficiently. Furthermore, if no gate voltage is applied to the TFT 3001, a large amount of current is flown between the source electrode 3022 and the drain electrode 3023, resulting in impossibility in realization of a normally-off operation. That is, the inventors of the present invention have found that the TFT 3001 with desirable properties can be obtained when the TFT 3001 is prepared by using as the active layer the crystalline oxide 3021 with an electron carrier concentration of less than 2×10$^{17}$/cm$^3$.

The electron carrier concentration of the crystalline oxide 3021 according to the present invention is a value measured at room temperature. The room temperature is, for example, 25° C. Specifically, the room temperature is a temperature appropriately selected from a range from about 0 to 40° C. The electron carrier concentration of the crystalline oxide 3021 according to the present invention does not necessarily satisfy less than 2×10$^{17}$/cm$^3$ in the entire temperature range of from about 0 to 40° C. For example, it suffices that an electron carrier concentration be less than 2×10$^{17}$/cm$^3$ at about 25° C. Preferably, the electron carrier concentration is further decreased to 10$^{17}$/cm$^3$ or less, more preferably to 2×10$^{16}$/cm$^3$ or less. In this way, the TFT 3001 with normally-off properties can be obtained in a high yield.

The lower limit value of the electron carrier concentration of the crystalline oxide 3021 is not particularly limited insofar as the crystalline oxide can be applied as the channel layer of a TFT. Therefore, in the present invention, by controlling the materials, the composition ratio, the production conditions, the post-treatment conditions or the like of the crystalline oxide as in Examples 15 to 25, which will be given later, the electron carrier concentration may preferably be about 10$^{12}$/cm$^3$ or more and less than about 2×10$^{17}$/cm$^3$, more preferably about 10$^{13}$/cm$^3$ or more and about 10$^{17}$/cm$^3$ or less, and further preferably about 10$^{15}$/cm$^3$ or more and about 2×10$^{16}$/cm$^3$ or less. In this way, the TFT 3001 with a prescribed electron mobility and normally-off properties can be obtained in a high yield.

The electron carrier concentration is measured by the Hall effect measurement. It is preferred to perform the AC Hall measurement when measuring an electron carrier concentration of less than about 10$^{17}$/cm$^3$. The reason therefor is that, if the DC Hall measurement is conducted, a large degree of variation in measurement values occurs, resulting in lowered reliability in measurement.

The active layer (semiconductor thin film) of the TFT 3001 is a thin film containing crystalline substance (that is, the crystalline oxide 3021). As for the crystalline oxide 3021, at least part or all of the semiconductor thin film is crystalline. As a result, as compared with the case where the semiconductor thin film is amorphous, the electron carrier concentration can be decreased or controlled easily, and the operation of the TFT 3001 becomes stable. As a result, the TFT 3001 improved in stability, uniformity, reproducibility, heat resistance and durability can be prepared.

The crystalline substance to be contained in the thin film may be either mono-crystalline or polycrystalline (including an epitaxial film). A polycrystalline film which is easily manufactured on the industrial basis and can be increased in area is preferable. A single crystal is preferable may have cracks by bending or impact during the production process or impact. For this reason, it is preferable to use a polycrystal.

In the present invention, the crystalline oxide 3021 means an oxide exhibiting a specific diffraction pattern in the X-ray diffraction spectrum. On the other hand, an amorphous oxide means an oxide which shows a harrow pattern and does not exhibit a specific diffraction pattern.

Furthermore, it is preferred that the energy band gap between the conduction band and the valence band of the semiconductor thin film according to the present invention be about 2.8 eV or more. By this band gap, a disadvantage that electrons of the valence band are excited to allow current leakage to occur frequently by the irradiation with visible rays can be effectively avoided.

It is preferred that the crystalline oxide 3021 contain In and a positive divalent element. Due to the presence of In and a positive divalent element, the crystalline oxide normally contains bixbite-type crystals of indium oxide. Due to the bixbite structure, the electron mobility may be increased. The reason therefor is assumed that the 5S orbit of indium has an edge-sharing structure.

Furthermore, it is preferred that indium be solid-solution-substituted by at least part of the positive divalent element such as zinc. The reason therefor is that, since indium, which is a positive trivalent element, is solid-solution-substituted by a positive divalent element, the electron carrier concentration can be effectively lowered.

In this embodiment, as the positive divalent element to be contained in the In-containing crystalline oxide, Zn, Be, Mg, Ca, Sr, Ba, Ti, V, Cr, Mn, Fe, Co, Ni, Pd, Pt, Cu, Ag, Cd, Hg, Sm, Eu, Yb or the like can be given, for example. Of these, Zn, Mg, Mn, Co, Ni, Pd, Pt and Cu are preferable. Zn, Mg, Cu, Ni and Co are more preferable since they can be easily solid-solution-substituted with indium and the electron carrier concentration can be controlled efficiently. Zn or Mg is most preferable in respect of transparency. These positive divalent elements may be used in combination as long as the advantageous effects of this embodiment cannot be impaired.

It is preferred that the crystalline oxide 3021 be a polycrystalline oxide containing In and one or more positive divalent elements selected from Zn, Mg, Cu, Ni, Co and Ca, and the atomic ratio of In [In] and the positive divalent element [X] [X]/([X]+[In]) is 0.0001 to 0.13. In this way, the electron carrier concentration can be about less than $2 \times 10^{17}/\text{cm}^3$. That is, the inventors have found that, by preparing a crystalline film composed mainly of In which contains a positive divalent element as a dopant and by controlling the dopant concentration or the post treatment conditions, the electron carrier concentration can be allowed to be about less than $2 \times 10^{17}/\text{cm}^3$.

In addition, in the semiconductor thin film of the present invention, the atomic ratio of In [In] and the above-mentioned positive divalent element [X]X/(X+In) is 0.0001 to 0.13. The reasons therefor are as follows. If the atomic ratio [X/(X+In)] is smaller than 0.0001, the number of carriers may not be controlled. Further, when wet etching is performed, the etching rate may be lowered or etching residues may remain. In addition, if the atomic ratio [X/(X+In)] exceeds 0.13, the interface or surface may be denatured and may become unstable. Furthermore, the crystallization temperature may be elevated to make crystallization difficult, whereby the carrier concentration may be increased, the electron carrier concentration may be changed with time, the electron mobility may be lowered, the heat resistance may be lowered and the chemicals resistance may be lowered. Moreover, when the TFT 3001 is driven, the threshold voltage may vary or driving may become unstable.

Furthermore, it is more preferred that [X]/([X]+[In]) be 0.01 to 0.1, it is further preferred that [X]/([X]+[In]) be 0.05 to 0.099, and it is most preferred that [X]/([X]+[In]) be 0.06 to 0.098.

The crystalline oxide 3021 is configured to contain In and a positive divalent element. However, the configuration is not limited to this. For example, it may have a configuration in which it contains Sn and a positive divalent element or a positive trivalent element. As the positive trivalent element to be contained in the polycrystalline oxide containing Sn, In, Ga, Al, La, Ce, Pr, Nd, Sm, Eu, Gd, Tb, Dy, Ho, Er, T, Yb, Lu or the like can be given. As the positive divalent element to be contained in the Sn-containing polycrystalline oxide, the same elements as those contained in the above-mentioned polycrystalline oxide containing In can be given.

The above-mentioned positive trivalent element and positive divalent element respectively mean an element which can have three positive valences and two positive valences as the valence in the ionic state.

Preferably, the crystalline oxide 3021 has resistance to PAN.

Due to the PAN resistance, the freedom of the production process is increased, whereby the TFT 3001 can be manufactured efficiently. Meanwhile, the crystalline oxide 3021 of this embodiment is patterned in an amorphous state, followed by crystallization. Since the crystallized crystalline oxide 3021 has PAN resistance, the gate electrode 3025 can be patterned easily.

Furthermore, as for the crystalline oxide 3021, by varying at least the above-mentioned atomic ratio of In [In] and the positive divalent element [X], the electron mobility relative to the electron carrier concentration of the crystalline oxide 3021 logarithmically proportionally increases. In this way, not only the semiconductor properties can be readily set by controlling the production conditions, but also the added value of the semiconductor can be improved. That is, since the electron mobility increases with an increase in the electron carrier concentration, the on-off ratio can be increased easily. In addition, the amount of off-current is not increased easily even if the mobility is increased, thereby improving the properties of the TFT 3001.

Furthermore, it is preferred that the concentration of Li and Na in the crystalline oxide 3021 be 1000 ppm or less. In this way, the possibility that the properties may change with time when driven for a long period time is lowered, whereby reliability of the transistor 3020 can be improved. The concentration of Li and Na is more preferably 100 ppm or less, more preferably 10 ppm or less, with 1 ppm or less being most preferable.

Then, the results of the measurement of the electron carrier concentration and the electron mobility of the crystalline oxide 3021 are explained with reference to the drawings.

(Measurement Results of the Electron Carrier Concentration and the Electron Mobility of the Thin Film)

A thin film composed of polycrystalline $In_2O_3$—ZnO (crystalline oxide 3021), a thin film composed of amorphous $In_2O_3$—ZnO—$Ga_2O_3$, and a thin film composed of amorphous $In_2O_3$—ZnO, which were used as the active layer of the TFT 3001, were formed, and the resulting three thin films, the electron mobility relative to the electron carrier concentration was measured.

First, an $In_2O_3$—ZnO sputtering target with an atomic ratio of [Zn/(In+Zn)]=0.0001 to 0.13 was used, and film formation was conducted by the RF magnetron sputtering method at a substrate temperature of about 25° C., whereby an amorphous thin film composed of $In_2O_3$—ZnO was obtained. Thereafter, under vacuum or in the presence of oxygen, a heat treatment was conducted at 280° C. for about 1 to 10 hours, whereby a plurality of thin films composed of polycrystalline $In_2O_3$—ZnO (a plurality of crystalline oxide 3021) was obtained.

Subsequently, by using $In_2O_3$—ZnO—$Ga_2O_3$ sputtering target with an atomic ratio [In/(In+Zn+Ga)]=0.33, an atomic ratio [Zn/(In+Zn+Ga)]=0.34 and an atomic ratio [Ga/(In+Zn+Ga)]=0.33, film formation was conducted by the RF sputtering method at a partial oxygen pressure of $1\times10^{-3}$ to $5\times10^{-1}$ Pa, whereby a plurality of amorphous thin films composed of $In_2O_3$—ZnO—$Ga_2O_3$ was obtained.

Furthermore, by using an $In_2O_3$—ZnO sputtering target with an atomic ratio [In/(In+Zn)]=0.83 and an atomic ratio [Zn/(In+Zn)]=0.17, film formation was conducted by the RF magnetron sputtering method at a partial oxygen pressure of $1\times10^{-3}$ to $5\times10^{-1}$ Pa, whereby a plurality of amorphous thin films composed of $In_2O_3$—ZnO was obtained.

Subsequently, the electron carrier concentration and the electron mobility of these three films were measured.

Figure 25A:
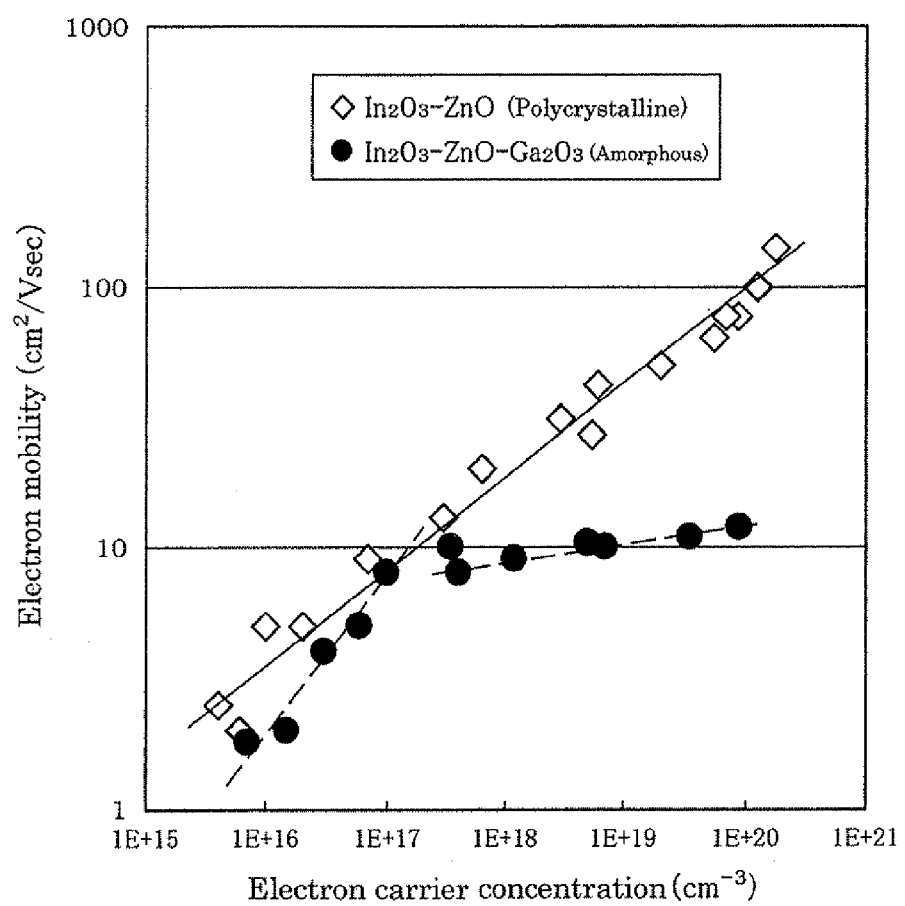
FIG. 25a is a measurement graph of the electron mobility plotted against the electron carrier concentration of a polycrystalline thin film composed of $In_2O_3$—ZnO and an amorphous thin film composed of $In_2O_3$—ZnO—$Ga_2O_3$.

FIG. 25*a* is a measurement graph of the electron mobility plotted against the electron carrier concentration of a polycrystalline thin film composed of $In_2O_3$—ZnO and an amorphous thin film composed of $In_2O_3$—ZnO—$Ga_2O_3$.

In FIG. 25*a*, in both films, the electron carrier concentration could be controlled to less than about $1\times10^{16}$ $cm^{-3}$.

In the case of the thin film composed of polycrystalline $In_2O_3$—ZnO (a plurality of crystalline oxide 3021), the electron mobility logarithmically proportionally increases within an electron carrier concentration range of $1\times10^{16}$ to $1\times10^{20}$/$cm^3$ with an increase in the electron carrier concentration. That is, if the electron carrier concentration (X coordinate) and the electron mobility (Y coordinate) are plotted in the graph of the both logarithms, the plotted points are almost on a straight line rising from the left to the right.

On the other hand, in the case of the thin film composed of amorphous $In_2O_3$—ZnO—$Ga_2O_3$, within an electron carrier concentration range of $1\times10^{16}$ to $1\times10^{17}$/$cm^3$, the electron mobility increases with an increase in electron carrier concentration almost as in the case of a thin film composed of polycrystalline $In_2O_3$—ZnO. However, within an electron carrier concentration range of $1\times10^{17}$ to $1\times10^{20}$/$cm^3$, the electron mobility slightly increases with an increase in electron carrier concentration. However, this increase was so small as compared with the case of a thin film composed of polycrystalline $In_2O_3$—ZnO.

From the above-mentioned measurement results, it was found that, in the case of a polycrystalline film containing In and a positive divalent element represented by a polycrystalline film of $In_2O_3$—ZnO, when formed into a thin film transistor, not only reliability but also a high degree of electron mobility can be expected, as compared with an amorphous film of which the electron carrier concentration is controlled by the partial pressure of oxygen. In particular, in an electron carrier concentration of $1\times10^{17}$ to $2\times10^{17}$/$cm^3$, the electron mobility of a thin film composed of polycrystalline $In_2O_3$—ZnO was larger than the electron mobility of a thin film composed of amorphous $In_2O_3$—ZnO—$Ga_2O_3$.

While the properties of the thin film composed of an amorphous $In_2O_3$—ZnO—$Ga_2O_3$ film deteriorated after the heat resistance test at 220° C. for 100 hours, the properties of a thin film composed of a Zn-doped $In_2O_3$ crystal oxide (polycrystalline) in the examples given later hardly changed even after the similar heat resistance test at 220° C. for 100 hours. As a result, the temperature range where the semiconductor device is used can be increased, and also the reliability thereof can be improved.

Figure 25B:
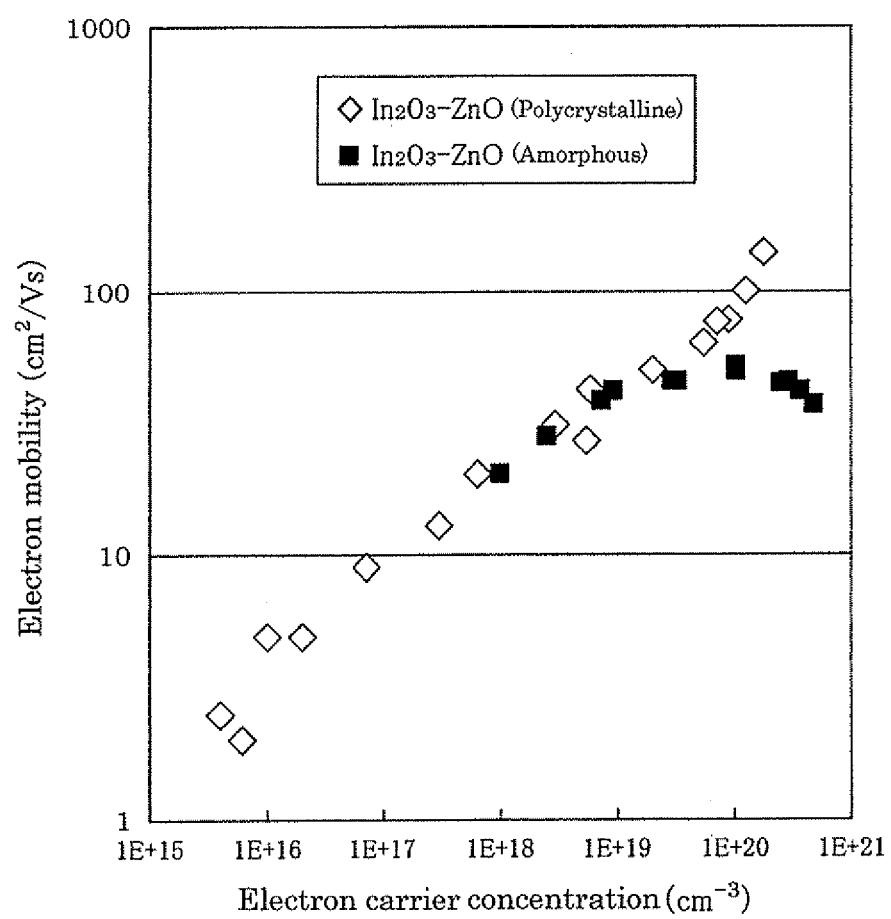
FIG. 25b is a measurement graph of the electron mobility plotted against the electron carrier concentration of a polycrystalline thin film composed of $In_2O_3$—ZnO and an amorphous thin film composed of $In_2O_3$—ZnO.

FIG. 25*b* is a measurement graph of the electron mobility plotted against the electron carrier concentration of a polycrystalline thin film composed of $In_2O_3$—ZnO and an amorphous thin film composed of $In_2O_3$—ZnO.

In FIG. 25*b*, in the case of polycrystalline $In_2O_3$—ZnO, the electron carrier concentration could be controlled to less than $1\times10^{16}$ $cm^{-3}$ by appropriately setting the production conditions. However, in the case of amorphous $In_2O_3$—ZnO, the electron carrier concentration could be controlled only to about $1\times10^{18}$ $cm^{-3}$. From this result, it is understood that, when used as a thin film transistor, a polycrystalline $In_2O_3$—ZnO can form a transistor with a small off-current or a normally-off transistor.

In the case of a thin film composed of polycrystalline $In_2O_3$—ZnO (a plurality of crystalline oxides 3021), in an electron carrier concentration range of $1\times10^{16}$ to $1\times10^{20}$/$cm^3$, the electron mobility logarithmically proportionally increases with an increase in the electron carrier concentration. That is, if the electron carrier concentration (X coordinate) and the electron mobility (Y coordinate) are plotted in the graph of the both logarithms, the plotted points are almost on a straight line rising from the left to the right.

On the other hand, in the case of the thin film composed of amorphous $In_2O_3$—ZnO, within an electron carrier concentration range of $1\times10^{18}$ to $1\times10^{19}$/$cm^3$, the electron mobility increases with an increase in electron carrier concentration almost as in the case of a thin film composed of polycrystalline $In_2O_3$—ZnO. However, within an electron carrier concentration range of $1\times10^{19}$ to $1\times10^{20}$/$cm^3$, while the electron mobility slightly increases, the electron mobility shows almost no increase, reaching the uppermost limit. Furthermore, in an electron carrier concentration range of $1\times10^{20}$/$cm^3$ or more, the electron mobility decreases with an increase in electron carrier concentration.

Then, Examples 15 to 25 according to the present invention and Comparative Examples 9 to 14 will be explained with reference to the drawings.

Example 15

FIG. 26 is a table showing the film-forming method, the film-forming conditions, the atomic ratio in the film composition, the oxidization treatment conditions and the properties of the semiconductor thin film in Examples 15 to 25 and Comparative Examples 9 to 14.

[Example of Producing Crystalline Oxide]
(1) Production and Evaluation of Sputtering Target
1. Production of Target As a raw material, indium oxide with an average particle size of about 3.4 μm and zinc oxide with an average particle size of about 0.6 μm were mixed such that the atomic ratio [(In/In+Zn)] became about 0.95 and the atomic ratio [(Zn/(In+Zn)) became about 0.05. The mixture was then supplied to a wet ball mill and mixed and pulverized for about 72 hours, whereby raw material fine powder was obtained.

After granulating, the raw material fine powder was press-molded to have a diameter of about 10 cm and a thickness of about 5 mm. The molded product was put in a firing furnace, and firing was performed at about 1400° C. for about 48 hours to obtain a sintered body (target). The heating rate was about 3° C./min.

2. Evaluation of Target

For the resulting target, the density and the bulk resistance were measured. As a result, it was found that the theoretical relative density was about 99% and the bulk resistance value measured by the four probe method was about 80 mΩ.

(2) Formation of Semiconductor Thin Film

The sputtering target obtained in (1) above was installed in the film-forming apparatus of the DC magnetron sputtering method, which is one of the DC sputtering methods. As a result, a semiconductor thin film was formed on a glass substrate (Cornig 1737).

The sputtering conditions are as follows. Substrate temperature: about 25° C., ultimate pressure: about $1 \times 10^{-3}$ Pa, atmosphere gas: Ar, about 100%, sputtering pressure (total pressure): about $4 \times 10^{-1}$ Pa, input power: about 100 W, and film-forming time: about 20 minutes: S-T distance: about 95 mm.

As a result, an oxide was formed on the glass substrate with a film thickness of about 100 nm.

The film composition was analyzed by the ICP method, and it was found that the atomic ratio [In/(In+Zn)] was about 0.95 and the atomic ratio [Zn/(In+Zn)] was about 0.05.

(3) Oxidization Treatment of Semiconductor Thin Film

The oxide obtained in (2) above was heated at about 300° C. for about 1 hour in atmosphere (in the presence of oxygen) (heat treatment in atmosphere) to conduct an oxidization treatment (crystallization treatment).

(4) Evaluation of Physical Properties of Semiconductor Thin Film

The carrier concentration (electron carrier concentration) and the Hall mobility (electron mobility) of the transparent semiconductor thin film obtained in (3) above was measured by a Hall measurement apparatus. The carrier concentration was about $6 \times 10^{14}$ cm$^{-3}$ and the Hall mobility was about 5 cm$^2$/Vs. The specific resistance measured by the four probe method was about 2100 Ωcm. The composition of the thin film was analyzed and it was found that the concentration of Li and Na was 1 ppm or less.

The Hall measurement apparatus and the Hall measurement conditions are as follows.

[Hall Measurement Apparatus]

Resi Test 8310: manufactured by Toyo Corporation

[Measurement Conditions]

Room temperature (about 25° C.), about 0.5 [T], about $10^{-4}$ to $10^{-12}$ A, AC magnetic field Hall measurement In addition, as a result of measurement by means of a spectrophotometer, it was found that this semiconductor thin film had a light transmittance for light with a wavelength of about 400 nm of about 85%, which means this thin film was excellent in transparency. In addition, the energy band gap was about 3.6 eV, which was sufficiently large.

As a result of an X-ray crystallography, it was found that the thin film was polycrystalline. An XFAS measurement revealed that In and Zn had a similar local structure. That is, at least part of zinc Zn substitutes the indium site of a bixbite type crystal of indium oxide.

For these Examples and Comparative Examples, evaluation was made on PAN resistance and heat resistance, and the results of these measurement are shown in the table together with the transmittance and the refractive index (wavelength: about 500 nm) of the semiconductor thin film.

[Pan Resistance]

Films which exhibited a PAN etching rate of about 10 nm/min or more was indicated as poor (x) and other films were indicated as good (○) in the table.

Here, the evaluation of PAN resistance was conducted by Using a PAN etching solution of about 45° C. (phosphoric acid: about 91.4 wt %, nitric acid: about 3.3 wt % and acetic acid: about 10.4 wt %). Meanwhile, as a PAN etching solution, one containing about 20 to 95 wt % of phosphoric acid, about 0.5 to 5 wt % of nitric acid and about 3 to 50 wt % of acetic acid is normally used.

[Heat Resistance]

Films of which the specific resistance was decreased by about 1/10 or less by a heat treatment at about 260° C. for about one hour are indicated as poor (x) and other films are indicated as good (○) in the table.

As for the evaluation of the remaining semiconductor thin films, the PAN resistance was good, the heat resistance was good, the semiconductor film reflective index (wavelength: about 500 nm) was about 1.9.

That is, the above-mentioned polycrystalline oxide in Example 15 had excellent properties as a transparent semiconductor thin film.

Example 16

In Example 16, an oxide was prepared in substantially the same manner as in Example 15 (the film-forming method, the film-forming conditions, the atomic ratio in the film composition, the oxidization treatment), except that the oxidization treatment was conducted at about 250° C. Other than this difference, the production conditions were almost the same as those in Example 15.

As for the properties of the oxide which was prepared in the above-mentioned conditions, as shown in FIG. 26, the oxide was polycrystalline, had a carrier concentration of about $8 \times 10^{14}$ cm$^{-3}$ and a Hall mobility of about 5 cm$^2$/Vs. The specific resistance value measured by the four probe method was about 1570 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 16 had excellent properties as a transparent semiconductor thin film.

Example 17

In Example 17, an oxide was prepared in substantially the same manner as in Example 15 (the film-forming method, the film-forming conditions, the atomic ratio in the film composition, the oxidization treatment), except that the RF magnetron sputtering method was used and the oxidization treatment was conducted at about 230° C. Other than these differences, the production conditions were almost the same as those in Example 15.

As for the properties of the oxide which was prepared in the above-mentioned conditions, as shown in FIG. 26, the oxide was polycrystalline, had a carrier concentration of about $4 \times 10^{15}$ cm$^{-3}$ and a Hall mobility of about 6 cm$^2$/Vs. The specific resistance value measured by the four probe method was about 260 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 17 had excellent properties as a transparent semiconductor thin film, and hence, could be preferably used as an active layer of a transistor.

Example 18

In Example 18, an oxide was prepared in substantially the same manner as in Example 15 (the film-forming method, the film-forming conditions, the atomic ratio in the film composition, the oxidization treatment), except that the atomic ratio [In/(In+Zn)] was about 0.97 and the atomic ratio [Zn/(In+Zn)] was about 0.03. Other than these differences, the production conditions were almost the same as those in Example 15.

As for the properties of the oxide which was prepared in the above-mentioned conditions, as shown in FIG. 26, the oxide was polycrystalline, had a carrier concentration of about $6 \times 10^{14}$ cm$^{-3}$ and a Hall mobility of about 10 cm$^2$/Vs. The specific resistance value measured by the four probe method was about 40 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 18 had excellent properties as a transparent semiconductor thin film.

Example 19

In Example 19, an oxide was prepared in substantially the same manner as in Example 15 (the film-forming method, the film-forming conditions, the atomic ratio in the film composition, the oxidization treatment), except that the atomic ratio [In/(In+Zn)] was about 0.93 and the atomic ratio [Zn/(In+Zn)] was about 0.07. Other than these differences, the production conditions were almost the same as those in Example 15.

As for the properties of the oxide which was produced in the above-mentioned conditions, as shown in FIG. 26, the oxide was polycrystalline, had a carrier concentration of about $1.1 \times 10^{14}$ cm$^{-3}$ and a Hall mobility of about 3 cm$^2$/Vs. The specific resistance value measured by the four probe method was about 19000 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 19 had excellent properties as a semiconductor thin film.

Example 20

In Example 20, an oxide was prepared in substantially the same manner as in Example 15 (the film-forming method, the film-forming conditions, the atomic ratio in the film composition, the oxidization treatment), except that the RF magnetron sputtering method was used, the atomic ratio [In/(In+Mg)] was about 0.98, the atomic ratio [Mg/(In+Mg)] was about 0.02 and the oxidization treatment was conducted at about 280° C. for about 2 hours. Other than these differences, the production conditions were almost the same as those in Example 15.

As for the properties of the oxide which was produced in the above-mentioned conditions, as shown in FIG. 26, the oxide was polycrystalline, had a carrier concentration of about $5 \times 10^{16}$ cm$^{-3}$ and a Hall mobility of about 7 cm$^2$/Vs. The specific resistance value measured by the four probe method was about 15 Ωcm. In addition, the energy band gap was about 3.7 eV, the PAN resistance was good, the heat resistance was good, the light transmittance was about 89% and the refractive index of the thin film (wavelength: about 500 nm) was about 1.9.

That is, the above-mentioned polycrystalline oxide prepared in Example 20 had excellent properties as a semiconductor thin film.

Example 21

In Example 21, an oxide was prepared in substantially the same manner as in Example 20 (the film-forming method, the film-forming conditions, the atomic ratio in the film composition, the oxidization treatment), except that the atomic ratio [In/(In+Cu)] was about 0.99 and the atomic ratio [Cu/(In+Cu)] was about 0.01. Other than these differences, the production conditions were almost the same as those in Example 20.

As for the properties of the oxide which was prepared in the above-mentioned conditions, as shown in FIG. 26, the oxide was polycrystalline, had a carrier concentration of about $2 \times 10^{15}$ cm$^{-3}$ and a Hall mobility of about 7 cm$^2$/Vs. The specific resistance value measured by the four probe method was about 450 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 21 had excellent properties as a transparent semiconductor thin film.

Example 22

In Example 22, an oxide was prepared in substantially the same manner as in Example 21 (the film-forming method, the film-forming conditions, the atomic ratio in the film composition, the oxidization treatment), except that the atomic ratio [In/(In+Cu)] was about 0.98 and the atomic ratio [Cu/(In+Cu)] was about 0.02. Other than these differences, the production conditions were almost the same as those in Example 21.

As for the properties of the oxide which was prepared in the above-mentioned conditions, as shown in FIG. 26, the oxide was polycrystalline, had a carrier concentration of about $2 \times 10^{14}$ cm$^{-3}$ and a Hall mobility of about 4 cm$^2$/Vs. The specific resistance value measured by the four probe method was about 7800 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 22 had excellent properties as a semiconductor thin film.

Example 23

In Example 23, an oxide was prepared in substantially the same manner as in Example 22 (the film-forming method, the film-forming conditions, the atomic ratio in the film composition, the oxidization treatment), except that the atomic ratio [In/(In+Ni)] was about 0.98 and the atomic ratio [Ni/(In+Ni)]

was about 0.02. Other than these differences, the production conditions were almost the same as those in Example 22.

As for the properties of the oxide which was prepared in the above-mentioned conditions, as shown in FIG. 26, the oxide was polycrystalline, had a carrier concentration of about $1 \times 10^{16}$ cm$^{-3}$ and a Hall mobility of about 8 cm$^2$/Vs. The specific resistance value measured by the four probe method was about 20 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 23 had excellent properties as a transparent semiconductor thin film.

Example 24

In Example 24, an oxide was prepared in substantially the same manner as in Example 22 (the film-forming method, the film-forming conditions, the atomic ratio in the film composition, the oxidization treatment), except that the atomic ratio [In/(In+Co)] was about 0.98 and the atomic ratio [Co/(In+Co)] was about 0.02. Other than these differences, the production conditions were almost the same as those in Example 22.

As for the properties of the oxide which was prepared in the above-mentioned conditions, as shown in FIG. 26, the oxide was polycrystalline, had a carrier concentration of about $2 \times 10^{16}$ cm$^{-3}$ and a Hall mobility of about 8 cm$^2$/Vs. The specific resistance value measured by the four probe method was about 40 Ωcm. In addition, the energy band gap was about 3.5 eV, the PAN resistance was good, the heat resistance was good, the light transmittance was about 83% and the refractive index of the thin film (wavelength: about 500 nm) was about 1.9.

That is, the above-mentioned polycrystalline oxide prepared in Example 24 had excellent properties as a transparent semiconductor thin film.

Example 25

In Example 25, an oxide was prepared in substantially the same manner as in Example 22 (the film-forming method, the film-forming conditions, the atomic ratio in the film composition, the oxidization treatment), except that the atomic ratio [In/(In+Zn)] was about 0.98 and the atomic ratio [Zn/(In+Zn)] was about 0.02. Other than these differences, the production conditions were almost the same as those in Example 22.

As for the properties of the oxide which was prepared in the above-mentioned conditions, as shown in FIG. 26, the oxide was polycrystalline, had a carrier concentration of about $6 \times 10^{16}$ cm$^{-3}$ and a Hall mobility of about 12 cm$^2$/Vs. The specific resistance value measured by the four probe method was about 10 Ωcm. In addition, the energy band gap was about 3.6 eV, the PAN resistance was good, the heat resistance was good, the light transmittance was about 85% and the refractive index of the thin film (wavelength: about 500 nm) was about 1.9.

That is, the above-mentioned polycrystalline oxide prepared in Example 25 had excellent properties as a transparent semiconductor thin film.

Comparative Example 9

In Comparative Example 9, an oxide was prepared in substantially the same manner as in Example 15 (the film-forming method, the film-forming conditions, the atomic ratio in the film composition, the oxidization treatment), except that the atomic ratio [In/(In+Zn)] was about 1.00 and the atomic ratio [Zn/(In+Zn)] was about 0.00. Other than these differences, the production conditions were almost the same as those in Example 15.

As for the properties of the oxide which was prepared in the above-mentioned conditions, as shown in FIG. 26, the oxide was polycrystalline, had a carrier concentration of about $1 \times 10^{18}$ cm$^{-3}$ and a Hall mobility of about 28 cm$^2$/Vs. The specific resistance value measured by the four probe method was about 0.22 Ωcm. In addition; the energy band gap was about 4.1 eV, the PAN resistance was good, the heat resistance was good, the light transmittance was about 84% and the refractive index of the thin film (wavelength: about 500 nm) was about 1.9.

That is, the above-mentioned polycrystalline oxide prepared in Comparative Example 9 had an electron carrier concentration value larger than $2 \times 10^{17}$ cm$^{-3}$.

Comparative Example 10

In Comparative Example 10, an oxide was prepared in substantially the same manner as in Example 15 (the film-forming method, the film-forming conditions, the atomic ratio in the film composition, the oxidization treatment), except that the atomic ratio [In/(In+Zn)] was about 0.00 and the atomic ratio [Zn/(In+Zn)] was about 1.00. Other than these differences, the production conditions were almost the same as those in Example 15.

As for the properties of the oxide which was prepared in the above-mentioned conditions, as shown in FIG. 26, the oxide was polycrystalline, had a carrier concentration of about $6 \times 10^{17}$ cm$^{-3}$ and a Hall mobility of about 1 cm$^2$/Vs. The specific resistance value measured by the four probe method was about 10 Ωcm. In addition, the energy band gap was about 3.3 eV, the PAN resistance was poor, the heat resistance was good, the light transmittance was about 83% and the refractive index of the thin film (wavelength: about 500 nm) was about 2.2.

That, is, the above-mentioned polycrystalline oxide prepared in Comparative Example 10 had an electron carrier concentration value larger than $2 \times 10^{17}$ cm$^{-3}$, and PAN resistance was poor.

Comparative Example 11

In Comparative Example 11, an oxide was prepared in substantially the same manner as in Example 16 (the film-forming method, the film-forming conditions, the atomic ratio in the film composition, the oxidization treatment), except that the crystallization treatment by heating was not conducted. Other than this difference, the production conditions were almost the same as those in Example 16.

As for the properties of the oxide which was prepared in the above-mentioned conditions, as shown in FIG. 26, the oxide was amorphous, had a carrier concentration of about $3 \times 10^{20}$ cm$^{-3}$ and a Hall mobility of about 35 cm$^2$/Vs. The specific resistance value measured by the four probe method was about 0.0006 Ωcm. In addition, the energy band gap was about 4.2 eV, the PAN resistance was poor, the heat resistance was good, the light transmittance was about 82% and the refractive index of the thin film (wavelength: about 500 nm) was about 2.1.

That is, the above-mentioned amorphous oxide prepared in Comparative Example 11 had an electron carrier concentration value, larger than $2\times10^{17}$ cm$^{-3}$, and PAN resistance was poor.

Comparative Example 12

In Comparative Example 12, an oxide was prepared in substantially the same manner as in Comparative Example 11 (the film-forming method, the film-forming conditions, the atomic ratio in the film composition, the oxidization treatment), except that the composition of the atmospheric gas at the time of sputtering was changed to about 92% of Ar and about 8% of H$_2$. Other than this difference, the production conditions were almost the same as those in Comparative Example 11.

As for the properties of the oxide which was prepared in the above-mentioned conditions, as shown in FIG. 26, the oxide was amorphous, had a carrier concentration of about $7\times10^{20}$ cm$^{-3}$ and a Hall mobility of about 17 cm$^2$/Vs. The specific resistance value measured by the four probe method was about 0.00053 Ωcm. In addition, the energy band gap was about 4.2 eV, the PAN resistance was poor, the heat resistance was good, the light transmittance was about 82% and the refractive index of the thin film (wavelength: about 500 nm) was about 2.1.

That is, the above-mentioned amorphous oxide prepared in Comparative Example 12 had an electron carrier concentration value larger than $2\times10^{17}$ cm$^{-3}$, and PAN resistance was poor.

Comparative Example 13

In Comparative Example 13, an oxide was prepared in substantially the same manner as in Comparative Example 12 (the film-forming method, the film-forming conditions, the atomic ratio in the film composition, the oxidization treatment), except that the RF sputtering method was used, the composition of the atmospheric gas at the time of sputtering was changed to about 96% of Ar and about 4% of O$_2$, the partial oxygen pressure was $16\times10^{-3}$ Pa, the atomic ratio [In/(In+Zn)] was about 0.55, the atomic ratio [Zn/(In+Zn)] was about 0.45 and the atomic ratio [Ga/(In+Zn+Ga)] was 0.35. Other than these differences, the production conditions were almost the same as those in Comparative Example 12.

As for the properties of the oxide which was prepared in the above-mentioned conditions, as shown in FIG. 26, the oxide was amorphous, had a carrier concentration of about $1.1\times10^{16}$ cm$^{-3}$ and a Hall mobility of about 3 cm$^2$/Vs. The specific resistance value measured by the four probe method was about 190 Ωcm. In addition, the energy band gap was about 3.7 eV, the PAN resistance was poor, the heat resistance was poor, the light transmittance was about 83% and the refractive index of the thin film (wavelength: about 500 nm) was about 2.1.

That is, the above-mentioned polycrystalline oxide prepared in Comparative Example 13 had poor PAN resistance and poor heat resistance.

Comparative Example 14

In Comparative Example 14, an oxide was prepared in substantially the same manner as in Comparative Example 13 (the film-forming method, the film-forming conditions, the atomic ratio in the film composition, the oxidization treatment), the composition of the atmospheric gas at the time of sputtering was changed to about 95% of Ar and about 5% of O$_2$ and the partial oxygen pressure was $20\times10^{-3}$ Pa. Other than these differences, the production conditions were almost the same as those in Comparative Example 13.

As for the properties of the oxide which was prepared in the above-mentioned conditions, as shown in FIG. 26, the oxide was amorphous, had a carrier concentration of about $9\times10^{15}$ cm$^{-3}$ and a Hall mobility of about 2 cm$^2$/Vs. The specific resistance value measured by the four probe method was about 350 Ωcm. In addition, the energy band gap was about 3.8 eV, the PAN resistance was poor, the heat resistance was poor, the light transmittance was about 83% and the refractive index of the thin film (wavelength: about 500 nm) was about 2.1.

That is, the above-mentioned polycrystalline oxide prepared in Comparative Example 14 had poor PAN resistance and poor heat resistance.

Next, thin film transistors (TFT) were prepared by using the semiconductor thin film (oxide) shown in the table, and evaluated. As a result, TFTs prepared by using the oxides in Examples 15 to 25 and Comparative Examples 10, 13 and 14 were confirmed to have transistor properties. However, no transistor properties were confirmed in TFTs prepared by using the oxides in Comparative Examples 9, 11 and 12. As for a TFT prepared by using the oxide of Comparative Example 10, although transistor properties could be confirmed, unclear pinch off was observed in output properties. That is, it was revealed that TFTs prepared by using the oxides in Comparative Examples 9, 10, 11 and 12 could not exhibit sufficient transistor properties due to a large carrier concentration.

Next, of the TFTs prepared above, representative TFTs will be explained below.

[Preparation Example 8 of TFT: Top-Gate Type Transparent Thin Film Transistor/Insulating Substrate]

As shown in FIG. 24, the TFT 3001 of this preparation example 8 is a top-gate type transistor, in which a source electrode 3022, a drain electrode 3023 and a crystalline oxide 3021 were formed on a glass substrate 3010 such that the channel length and the channel width about 10 μm and about 150 μm, respectively. As this crystalline oxide 3021, a transparent semiconductor film with a thickness of about 30 nm prepared in the same manner as in Example 15 was used. As a gate-insulating film 3024, yttrium oxide with a high dielectric constant was stacked to have a thickness of 170 nm. Furthermore, as a source electrode 3022, a drain electrode 3023 and a gate electrode 3025, a Ti layer with a thickness of about 5 nm and an Au layer with a thickness of about 40 nm were used.

As a result, the TFT 3001 of this Preparation Example 8 showed a field-effect mobility of 35 cm$^2$/Vs, an on-off ratio of $10^8$ or more and a threshold voltage (Vth) of +2.0 V (normally-off). The output properties showed a clear pinch-off.

[Preparation Example 9 of TFT: Bottom-Gate Type Transparent Thin Film Transistor/Insulating Substrate]

Figure 27:
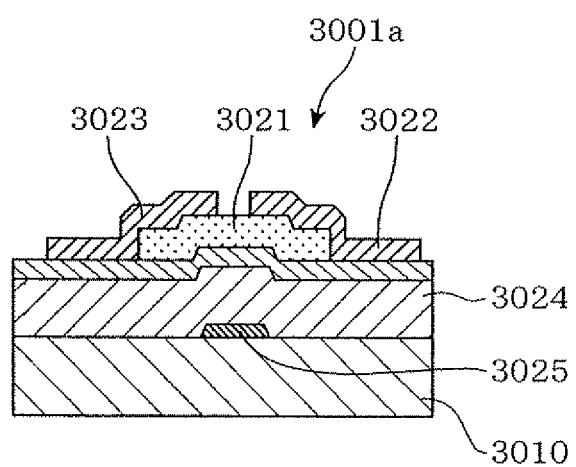
FIG. 27 is a schematic cross-sectional view of essential parts of a first application example of the field-effect type thin film transistor which is a semiconductor device according to the first embodiment of the present invention.

FIG. 27 is a schematic cross-sectional view of essential parts of a first application example of the field-effect type thin film transistor which is a semiconductor device according to the first embodiment of the present invention.

In FIG. 27, a TFT 3001a of this Preparation Example 9 is the first application example of the TFT 3001, and is a bottom-gate type transistor, in which a gate electrode 3025 and a gate-insulating film 3024 were formed on a glass substrate 3021, followed by formation of the crystalline oxide 3021. As this crystalline oxide 3021, a transparent semiconductor film with a thickness of about 100 nm prepared in the same manner as in Example 15 was used. The source electrode 3022 and the drain electrode 3023 were formed such that the channel length and the channel width about 5 µm and about 25 µm, respectively. As the gate-Insulating film 3024, an SiNx layer with a thickness of about 340 nm and a CaHfOx layer with a thickness of about 30 nm were used. Furthermore, as the source electrode 3022 and the drain electrode 3023, an Al layer with a thickness of about 70 nm was used, and as the gate electrode 3025, a Ta layer with a thickness of about 320 nm was used.

As a result, the TFT 3001a of this Preparation Example 9 showed a field-effect mobility of 70 cm$^2$/Vs, an on-off ratio of 10$^7$ or more and a threshold voltage (Vth) of +0.5 V (normally-off). The output properties showed a clear pinch-off.

[Preparation Example 10 of TFT: Bottom-Gate Type Transparent Thin Film Transistor/Conductive Substrate]

Figure 28:
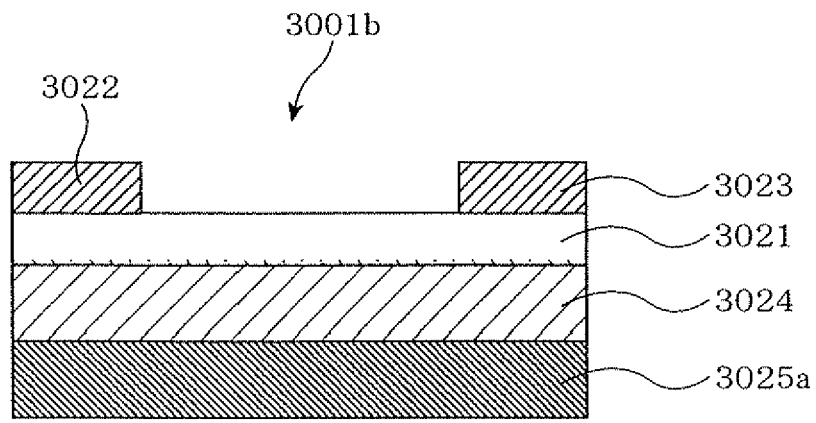
FIG. 28 is a schematic cross-sectional view of essential parts of a second application example of the field-effect type thin film transistor which is a semiconductor device according to the first embodiment of the present invention.

FIG. 28 is a schematic cross-sectional view of essential parts of a second application example of the field-effect type thin film transistor which is a semiconductor device according to the first embodiment of the present invention.

In FIG. 28, the TFT 3001b of this Preparation Example 10 is the second application example of the above-mentioned TFT 3001, and is a bottom-gate type TFT formed on a conductive substrate.

With a configuration shown in FIG. 28, on a conductive silicon substrate 3025a, a bottom-gate type TFT 3001b with a channel length of about 100 µm and a channel width of about 1500 µm was formed.

As the semiconductor thin film (crystalline oxide), a transparent semiconductor film with a thickness of about 50 nm, which had been prepared under the same conditions as in Example 18, was used. As the gate-insulating film, an SiO$_2$ thermal oxide film with a thickness of 300 nm was used, and as the source electrode and the drain electrode, an Au layer with a thickness of about 50 nm was used.

As a result, the TFT 3001b of this Preparation Example 10 showed a field-effect mobility of 19 cm$^2$/Vs, an on-off ratio of 10$^6$ or more and normally-off properties. The output properties showed a clear pinch-off.

[Preparation Example 11 of TFT: Bottom-Gate Type Transparent Thin Film Transistor/Conductive Substrate]

With a configuration shown in FIG. 28, on a conductive silicon substrate, a bottom-gate type 4 TFT 3001b with a channel length of about 100 µm and a channel width of about 1500 µm was formed.

As the semiconductor thin film (crystalline oxide), a transparent semiconductor film with a thickness of about 50 nm, which had been prepared under the same conditions as in Example 25, was used. As the gate-insulating film, an SiO$_2$ thermal oxide film with a thickness of about 300 nm was used, and as the source electrode and the drain electrode, an Au layer with a thickness of about 50 nm was used.

As a result, the TFT 3001b of this Preparation Example 11 showed a field-effect mobility of 24 cm$^2$/Vs, an on-off ratio of 10$^5$ or more and normally-off properties. The output properties showed a clear pinch-off.

[Preparation Example 12 of TFT: Bottom-Gate Type Transparent Thin Film Transistor/Conductive Substrate]

Figure 29:
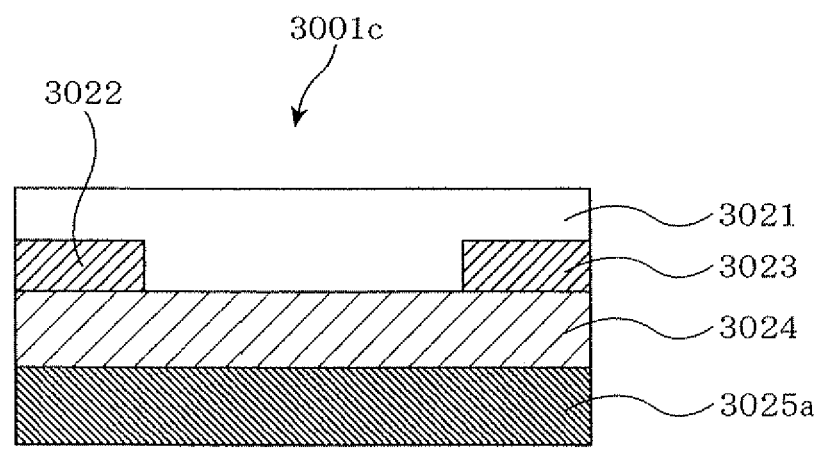
FIG. 29 is a schematic cross-sectional view of essential parts of a third application example of the field-effect type thin film transistor which is a semiconductor device according to the first embodiment of the present invention.

FIG. 29 is a schematic cross-sectional view of essential parts of a third application example of the field-effect type thin film transistor which is a semiconductor device according to the first embodiment of the present invention.

In FIG. 29, the TFT 3001c of this Preparation Example 12 is the third application example of the above-mentioned TFT 3001, and is a bottom-gate type TFT formed on a conductive substrate.

With a configuration shown in FIG. 29, on a conductive silicon substrate, a bottom-gate type TFT 3001c with a channel length of about 100 µm and a channel width of about 2000 µm was formed.

As the semiconductor thin film (crystalline oxide), a transparent semiconductor film with a thickness of about 50 nm, which had been prepared under the same conditions as in Example 18, was used. As the gate-insulating film, an SiO$_2$ thermal oxide film with a thickness of about 300 nm was used, and as the source electrode and the drain electrode, an Au layer with a thickness of about 50 nm was used.

As a result, the TFT 3001c of this Preparation Example 12 showed properties of a field-effect mobility of 10 cm$^2$/Vs, an on-off ratio of 10$^5$ or more and normally-off properties. The output properties showed a clear pinch-off.

[Preparation Example 13 of TFT: Bottom-Gate Type Transparent Thin Film Transistor/Conductive Substrate]

With a configuration shown in FIG. 29, on a conductive silicon substrate, a bottom-gate type TFT 3001c with a channel length of about 100 µm and a channel width of about 2000 µm was formed.

As the semiconductor thin film (crystalline oxide), a transparent semiconductor film with a thickness of about 20 nm, which had been prepared under the same conditions as in Example 20, was used. As the gate-insulating film, an SiO$_2$ thermal oxide film with a thickness of about 300 nm was used, and as the source electrode and the drain electrode, an Au layer with a thickness of about 50 nm was used.

As a result, the TFT 3001c of this Preparation Example 13 showed a field-effect mobility of 11 cm$^2$/Vs, an on-off ratio of 10$^4$ or more and normally-off properties. The output properties showed a clear pinch-off.

[Preparation Example 14 of TFT: Bottom-Gate Type Transparent Thin Film Transistor/Conductive Substrate]

With a configuration shown in FIG. 29, on a conductive silicon substrate, a bottom-gate type TFT 3001c with a channel length of about 100 µm and a channel width of about 2000 µm was formed.

As the semiconductor thin film (crystalline oxide), a transparent semiconductor film with a thickness of about 20 nm, which had been prepared under the same conditions as in Example 21, was used. As the gate-insulating film, an SiO$_2$ thermal oxide film with a thickness of 300 nm was used, and as the source electrode and the drain electrode, an Au layer with a thickness of about 50 nm was used.

As a result, the TFT 3001c of this Preparation Example 14 showed a field-effect mobility of 11 cm$^2$/Vs, an on-off ratio of 10$^6$ or more and normally-off properties. The output properties showed a clear pinch-off.

[Comparative Example (6) of TFT: Top-Gate Type Transparent Thin Film Transistor/Insulating Substrate]

With a configuration shown in FIG. 24, on a glass substrate, a top-gate type thin film transistor with a channel length of about 10 µm and a channel width of about 150 µm was formed by using a transparent semiconductor thin film (crystalline oxide) prepared under the same conditions as in Comparative Example 10.

As the gate-insulating film, yttrium oxide with a high dielectric constant was stacked to have a thickness of about 170 nm. Furthermore, as the source electrode, the drain electrode and the gate electrode, a Ti layer with a thickness of about 5 nm and an Au layer with a thickness of about 40 nm were used.

As a result, the transistor of this TFT Comparative Example (6) showed a field-effect mobility of 0.5 cm$^2$/Vs, an on-off ratio of $10^3$ and a threshold voltage (Vth) of −0.5 V (normally-on). The output properties showed an unclear pinch-off.

[Comparative Example (7) of TFT: Bottom-Gate Type Transparent Thin Film Transistor/Insulating Substrate]

With a configuration shown in FIG. 27, on a glass substrate, a bottom-gate type thin film transistor with a channel length of about 5 μm and a channel width of about 25 μm was formed. As the channel layer, a transparent semiconductor thin film (crystalline oxide) with a thickness of about 100 nm, which had been prepared under the same conditions as in Comparative Example 10 was used. As the gate-insulating film, a CaHfOx film with a thickness of about 30 nm and an SiNx film with a thickness of about 340 nm were used. Furthermore, as the source electrode and the drain electrode, an Al layer with a thickness of about 70 nm was used, and as the gate electrode, a Ta layer with a thickness of about 320 nm were used.

As a result, the transistor of this TFT Comparative Example (7) showed a field-effect mobility of 0.3 cm$^2$/Vs, an on-off ratio of $10^2$ or more and a threshold voltage (Vth) of −1.5 V (normally-on). The output properties showed an unclear pinch-off.

[Comparative Example (8) of TFT: Bottom-Gate Type Transparent Thin Film Transistor/Conductive Substrate]

With a configuration shown in FIG. 28, on a conductive silicon substrate, a bottom-gate type thin film transistor with a channel length of about 100 μm and a channel width of about 1500 μm was formed.

As the semiconductor thin film (crystalline oxide), a transparent semiconductor thin film with a thickness of about 50 nm, which had been prepared under the same conditions as in Comparative Example 9 was used. As the gate-insulating film, a SiO$_2$ thermal oxide film with a thickness of about 300 nm was used, and as the source electrode and the drain electrode, an Au layer with a thickness of about 50 nm were used.

As a result, the transistor of this Comparative Example (8) became normally-on, and no transistor properties could be confirmed by changing the gate voltage.

[Comparative Example (9) of TFT: Bottom-Gate Type Transparent Thin Film Transistor/Conductive Substrate]

With a configuration shown in FIG. 29, on a conductive silicon substrate, a bottom-gate type thin film transistor with a channel length of about 100 μm and a channel width of about 2000 μm was formed.

As the semiconductor thin film (crystalline oxide), a transparent semiconductor thin film with a thickness of about 50 nm, which had been prepared under the same conditions as in Comparative Example 9 was used. As the gate-insulating film, a SiO$_2$ thermal oxide film with a thickness of about 300 nm was used, and as the source electrode and the drain electrode, an Au layer with a thickness of about 50 nm was used.

As a result, the transistor of this Comparative Example (9) became normally-on, and no transistor properties could be confirmed by changing the gate voltage.

[Comparative Example (10) of TFT: Bottom-Gate Type Transparent Thin Film Transistor/Conductive Substrate]

With a configuration shown in FIG. 28, on a conductive silicon substrate, a bottom-gate type thin film transistor with a channel length of about 100 μm and a channel width of about 1500 μm was formed.

As the semiconductor thin film (amorphous oxide), a transparent semiconductor thin film with a thickness of about 50 nm, which had been prepared under the same conditions as in Comparative Example 14 was used. As the gate-insulating film, an SiO$_2$ thermal oxide film with a thickness of about 300 nm was used and as the source electrode and the drain electrode, an Au layer with a thickness of about 50 nm was used.

As a result, the transistor this Comparative Example (10) showed a field-effect mobility of 8 cm$^2$/Vs, an on-off ratio of $10^4$ or more and normally-on properties. The output properties showed a clear pinch-off.

As mentioned above, according to this embodiment, by using a crystalline oxide in the active layer of the field-effect type thin film transistor and by allowing this electron carrier concentration of this crystalline oxide of less than about $2 \times 10^{17}$/cm$^3$, it is possible to improve the stability, uniformity, reproducibility, heat resistance, durability or the like of a field-effect type thin film transistor.

In addition, by using, as the crystalline oxide, a polycrystalline oxide containing In and one or more positive divalent element selected from Zn, Mg, Cu, Ni, Co and Ca, and by allowing an atomic ratio of In [In] and the positive divalent element [X][X]/([X]+[In]) to be 0.0001 to 0.13, the electron carrier concentration can be less than about $2 \times 10^{17}$/cm$^3$. Furthermore, it is possible to provide a TFT improved in large-area-uniformity or reproducibility.

[Second Embodiment of the Semiconductor Device]

Figure 30:
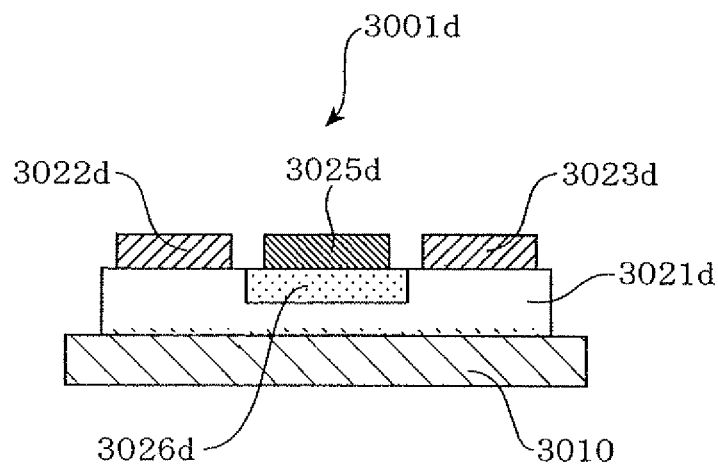
FIG. 30 is a schematic cross-sectional view of a PN junction type transistor which is a semiconductor device according to a second embodiment of the present invention.

FIG. 30 is a schematic cross-sectional view of a PN junction type transistor which is a semiconductor device according to the second embodiment of the present invention.

In FIG. 30, a PN junction type transistor 3001*d* is provided with a glass substrate 3010, a crystalline oxide 3021*d* as an N-type semiconductor formed on the glass substrate 3010, an emitter electrode 3022*d* and a collector electrode 3023*d* respectively formed on the both ends of the upper surface of the crystalline oxide 3021*d*, a P-type semiconductor 3026*d* formed on a concave part of the middle portion of the upper surface of the crystalline oxide 3021*d* and a base electrode 3025*d* formed on the P-type semiconductor 3026*d*.

The semiconductor device of this embodiment is a PN junction type transistor 3001*d*, and is provided with a P-type region (P-type semiconductor 3026*d*) and an N-type region (N-type semiconductor). The crystalline oxide 3021*d* is used as the N-type semiconductor.

The crystalline oxide 3021*d* is substantially similar to the above-mentioned crystalline oxide 3021. As the crystalline oxide 3021*d*, the crystalline oxides in Examples 15 to 25 given above are used, for example.

As the materials of the emitter electrode 3022*d* and the collector electrode 3023*d*, ITO or the like which ohmically contacts the crystalline oxide 3021*d* is used.

As the materials of the P-type semiconductor 3026*d*, a P-type semiconductor material of which the absolute value of the Fermi level is larger than the absolute value of the Fermi level of the crystalline oxide 3021*d* is used.

Furthermore, as the material of the base electrode 3025*d*, Pt or the like which ohmically contacts the P-type semiconductor 3026*d* is used.

As mentioned above, according to this embodiment, by using the crystalline oxide 3021*d* as the N-type region (N-type semiconductor) of the PN junction type transistor 3001*d* and by allowing the electron carrier concentration of this crystalline oxide 3021*d* to be about less than $2 \times 10^{17}$/cm$^3$, the stability, uniformity, reproducibility, heat resistance, durability or the like of the PN junction type transistor 3001*d* can be improved.

[Third Embodiment of the Semiconductor Device]

Figure 31:
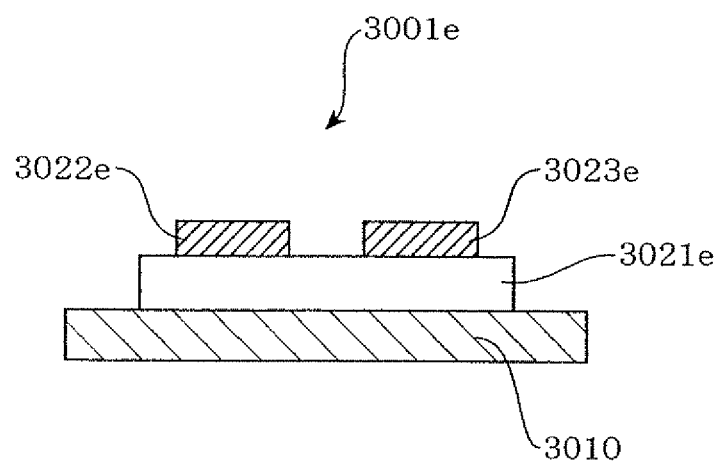
FIG. 31 is a schematic cross-sectional view of essential parts of a Schottky diode which is a semiconductor device according to a third embodiment of the present invention.

FIG. 31 is a schematic cross-sectional view of essential parts of a Schottky diode which is a semiconductor device according to the third embodiment of the present invention.

In FIG. 31, the Schottky diode 3001*e* is provided with a glass substrate 3010, a crystalline oxide 3021*e* as the N-type semiconductor formed on the glass substrate 3010, and an electrode 3022e and en electrode 3023e respectively formed on the both ends of the upper surface of the crystalline oxide 3021d.

The semiconductor device of this embodiment is a Schottky diode 3001e, in which the crystalline oxide 3021e is used as an electron conductor.

The crystalline oxide 3021e is substantially similar to the above-mentioned crystalline oxide 3021. As the crystalline oxide 3021e, the crystalline oxides in Examples 15 to 25 given above are used, for example.

As the materials of the electrode 3022e, ITO or the like which ohmically contacts the crystalline oxide 3021e is used.

As the materials of the electrode 3023e, a material having a work function which is larger than the absolute value of the Fermi level of the crystalline oxide 3021e, for example, Pt, is used. Due to such a difference in work function, a barrier layer with a less amount of carriers is formed in the crystalline oxide 3021e.

As mentioned above, according to this embodiment, by using the crystalline oxide 3021e as the N-type region (N-type semiconductor) of the Schottky diode 3001e and by allowing the electron carrier concentration of this crystalline oxide 3021e to be about less than $2 \times 10^{17}/cm^3$, the stability, uniformity, reproducibility, heat resistance, durability or the like of the Schottky diode 3001e can be improved.

Meanwhile, the semiconductor device utilizing the relationship of the absolute value of the Fermi level of the crystalline oxide 3021e and the work function of the electrode 3023e or the like is not limited to this Schottky diode 3001e. For example, a static induction transistor, a Schottky barrier type transistor, a resistive element or the like can be given. In addition, by using the crystalline oxide 3021e as the N-type region (N-type semiconductor) of the static induction transistor, the Schottky barrier type transistor, the resistive element or the like, and by allowing the electron carrier concentration of this crystalline oxide 3021e to be about less than $2 \times 10^{17}/cm^3$, the stability, uniformity, reproducibility, heat resistance, durability or the like of a semiconductor device such as the static induction transistor, the Schottky barrier type transistor and the resistive element.

[Fourth Embodiment of the Semiconductor Device]

The semiconductor device of this embodiment is an integrated circuit, and is provided with the above-mentioned TFT 3001 in which the crystalline oxide 3021 is used. That is, this integrated circuit relates to a logical circuit, a memory circuit, a differential amplification circuit or the like in which the TFT 3001 is used as the N-type thin film transistor.

Examples of the above-mentioned logical circuit include an inverter, an NOR, a NAND, a flip-flop and a shift register.

Examples of the memory circuit include a SRAM (Static Random Access Memory) and ROM (Read Only Memory).

As the differential amplification circuit, a differential amplifier or the like can be given. In addition, it may be a wireless communication circuit such as an ID tag and an IC tag.

As mentioned above, according to this embodiment, by using the crystalline oxide 3021 in the N-type thin film transistor of an integrated circuit and by allowing the electron carrier concentration of this crystalline oxide 3021 to be about less than $2 \times 10^{17}/cm^3$, the stability, uniformity, reproducibility, heat resistance, durability or the like of a semiconductor device having a hetero junction an integrated circuit can be improved.

[Fifth Embodiment of the Semiconductor Device]

The semiconductor device of this embodiment is provided with a first region composed of the crystalline oxide 3021 and the second region which forms a hetero junction with this first region. Due to such a configuration, the stability, uniformity, reproducibility, heat resistance, durability or the like can be improved.

Hereinabove, the method of producing a thin film transistor, the thin film transistor, the thin film transistor substrate, the image display apparatus, the image display apparatus and the semiconductor device according to the present invention are explained with reference to preferred embodiments. The method of producing a thin film transistor, the thin film transistor, the thin film transistor substrate, the image display apparatus, the image display apparatus and the semiconductor device according to the present invention are not limited to the above-mentioned embodiments, and it is needless to say various modifications are possible within the scope of the present invention.

For example, as the embodiment of the method for producing a thin film transistor, an explanation is made on the most basic method for producing an inverted-staggered type thin film transistor and a staggered type thin film transistor. However, there are thin film transistors with various configurations and there are various production methods suited to these various thin film transistors. Today, active studies have been made, on these methods. The method for producing a thin film transistor according to the present invention can be preferably applied to these various production methods.

In addition, the image display apparatus is not limited to a liquid crystal image display apparatus, and it may be an EL image display apparatus.

Furthermore, for example, the semiconductor device may be a large-area TFT substrate which is used in a large-sized image display apparatus.

The invention claimed is:

1. A method for producing a thin film transistor comprising the steps of: a film-forming step in which an amorphous oxide film is formed as a channel layer; a patterning step in which said amorphous oxide film is patterned by etching; and a crystallization step in which said amorphous oxide film which is patterned in the patterning step is crystallized, resulting in the amorphous oxide film being converted to a crystalline oxide semiconductor film, wherein said crystallized crystalline oxide semiconductor film is provides a channel layer;

said crystalline oxide semiconductor film contains In and a positive divalent element;

said positive divalent element is one or more elements selected from Zn, Mg, Cu, Co, Ni and Ca; and an atomic ratio of the In [In] and the positive divalent element [X] by the formula [X]/([X]+[In]) is such that $0.0001 \leq [X]/([X]+[In]) \leq 0.5$.

2. The method for producing a thin film transistor according to claim 1, wherein said atomic ratio is such that $0.01 \leq [X]/([X]+[In]) \leq 0.1$.

3. The method for producing a thin film transistor according to claim 1, wherein any one film forming method selected from a sputtering method, a vapor deposition method, an ion plating method, a CVD method, a spray method and a dipping method is used in said film-forming step.

4. The method for producing a thin film transistor according to claim 1, wherein a sputtering method is used in the film-forming step and said sputtering method is any one selected from a DC magnetron sputtering method, an AC magnetron sputtering method and an RF magnetron sputtering method.

5. The method for producing a thin film transistor according to claim 4, wherein water or hydrogen is contained in an atmospheric gas in said sputtering method.

6. The method for producing a thin film transistor according to claim 1, wherein wet etching is used in said patterning step.

7. A method for producing a thin film transistor according to claim 6, wherein said wet etching is performed by using an etching solution containing one or more acids selected from oxalic acid, hydrochloric acid and phosphoric acid.

8. The method for producing a thin film transistor according to claim 1, wherein, in said crystallization step, said amorphous oxide film is crystallized according to one or more methods selected from a heat treatment, a plasma treatment and a laser irradiation treatment.

9. The method for producing a thin film transistor according to claim 1, wherein said crystalline oxide film is subjected to an oxidization step in said crystallization step or after said crystallization treatment.

10. The method for producing a thin film transistor according to claim 9, wherein said oxidization treatment is performed by one or more treatment methods selected from a heat treatment in the presence of oxygen, an ozone treatment and a plasma treatment.

11. The method for producing a thin film transistor according to claim 1, wherein a sputtering method is used in the film-forming step to form said amorphous oxide at a temperature lower than 150° C., patterning is performed in said patterning step with an etching solution containing oxalic acid, and a heat treatment is performed in the presence of oxygen at a temperature of 150 to 500° C. in said crystallization step.

12. The method for producing a thin film transistor according to claim 11, wherein water or hydrogen is contained in an atmospheric gas in said sputtering method.

13. A method for producing a thin film transistor according to claim 1, wherein a thin film is formed on said crystalline oxide film after said crystallization step, and said thin film is patterned by wet etching.

14. A method for producing a thin film transistor according to claim 13, wherein said wet etching is performed by using an etching solution containing one or more acids selected from oxalic acid, hydrochloric acid and phosphoric acid.

15. A thin film transistor which is produced by the method for producing a thin film transistor according to claim 1.

16. A thin film transistor substrate comprising a plurality of thin film transistors according to claim 15 arranged on a substrate or a sheet-like base.

17. An image display apparatus which comprises a thin film transistor according to claim 15.

18. An active matrix type image display apparatus provided with a light control element and a field-effect type transistor for driving said light control element,
wherein an active layer of said field-effect type transistor is a crystalline oxide semiconductor and the electron carrier concentration of said active layer is less than $2 \times 10^{17}/\text{cm}^3$,
said crystalline semiconductor oxide is a polycrystalline oxide containing In and one or more positive divalent elements selected from Zn, Mg, Cu, Ni, Co and Ca; and
an atomic ratio of said In [In] and said positive divalent element [X] by the formula [X]/([X]+[In]) is 0.0001 to 0.13.

19. The image display apparatus according to claim 18, wherein said crystalline oxide has resistance to PAN.

20. The image display apparatus according to claim 18, wherein the electron mobility relative to the electron carrier concentration of said crystalline oxide logarithmically proportionally increases in a predetermined range with an increase in said electron carrier concentration.

21. The image display apparatus according to claim 18, wherein the concentration of Li and Na in said crystalline oxide are 1000 ppm or less.

22. The image display apparatus according to claim 18, wherein said light control element is a liquid crystal element or an electroluminescence element.

23. A semiconductor device comprising a crystalline oxide as an N-type semiconductor, wherein the electron carrier concentration of said crystalline oxide is less than $2 \times 10^{17}/\text{cm}^3$,
wherein said crystalline oxide N-type semiconductor is a polycrystalline oxide containing In and one or more positive divalent element selected from Zn, Mg, Cu, Ni, Co and Ca; and
an atomic ratio of said In [In] and said positive divalent element [X] by the formula [X]/([X]+[In]) is 0.0001 to 0.13.

24. The semiconductor device according to claim 23, wherein the electron mobility relative to the electron carrier concentration of said crystalline oxide logarithmically proportionally increases by at least changing the atomic ratio of said In [In] and said positive divalent element [X].

25. The semiconductor device according to claim 23, wherein said crystalline oxide has resistance to PAN.

26. The semiconductor device according to claim 23, wherein the concentration of Li and Na is 1000 ppm or less.

27. The semiconductor device according to claim 23, wherein said semiconductor device is a thin film transistor and said crystalline oxide is used as a channel layer.

28. The semiconductor device according to claim 23, wherein said semiconductor device is provided with a P-type region and an N-type region and said crystalline oxide is used in said N-type region.

29. The semiconductor device according to claim 28, wherein said semiconductor device is a PN junction type transistor.

30. The semiconductor device according to claim 23, wherein said semiconductor device is a static induction transistor, a Schottky barrier transistor, a Schottky diode or a resistive element, and said crystalline oxide is used as an electron conductor.

31. The semiconductor device according to claim 23, wherein said semiconductor device is an integrated circuit and contains an N-type thin film transistor using said crystalline oxide.

32. The semiconductor device according to claim 23, wherein said semiconductor device is provided with a first region composed of said crystalline oxide and a second region forming a hetero junction for said first region.

* * * * *